United States Patent
Kobrin et al.

(10) Patent No.: US 9,981,410 B2
(45) Date of Patent: May 29, 2018

(54) METHOD OF FABRICATING CYLINDRICAL POLYMER MASK

(71) Applicant: METAMATERIAL TECHNOLOGIES USA, INC., Pleasanton, CA (US)

(72) Inventors: Boris Kobrin, Dublin, CA (US); Oliver Seitz, Berkeley, CA (US); Bruce Richardson, Los Gatos, CA (US); Ian McMackin, Pleasanton, CA (US); Mukti Aryal, Pleasanton, CA (US); Bryant Grigsby, Los Gatos, CA (US)

(73) Assignee: METAMATERIAL TECHNOLOGIES USA, INC., Pleasanton, CA (US)

( * ) Notice: Subject to any disclaimer, the term of this patent is extended or adjusted under 35 U.S.C. 154(b) by 0 days. days.

(21) Appl. No.: 15/236,240

(22) Filed: Aug. 12, 2016

(65) Prior Publication Data
US 2017/0028594 A1 Feb. 2, 2017

Related U.S. Application Data

(60) Division of application No. 14/521,375, filed on Oct. 22, 2014, and a continuation of application No.
(Continued)

(51) Int. Cl.
*B29C 39/10* (2006.01)
*B29C 33/38* (2006.01)
(Continued)

(52) U.S. Cl.
CPC .......... *B29C 39/10* (2013.01); *B29C 33/3857* (2013.01); *B29C 33/424* (2013.01);
(Continued)

(58) Field of Classification Search
CPC ....... B29C 33/424; B29C 53/34; B29C 35/02; B29C 33/3857; B29C 39/10; B29C 39/026; B29C 39/148; G03F 1/72; G03F 7/0002
See application file for complete search history.

(56) References Cited

U.S. PATENT DOCUMENTS

| 3,320,344 A | 5/1967 | Slipp |
| 3,515,798 A | 6/1970 | Sievert |

(Continued)

FOREIGN PATENT DOCUMENTS

| CN | 100398304 | 7/2008 |
| CN | 101911249 A | 12/2010 |

(Continued)

OTHER PUBLICATIONS

Chinese Office Action for CN Application No. 201380035462.0, dated Feb. 1, 2016.
(Continued)

*Primary Examiner* — Alison L Hindenlang
*Assistant Examiner* — Mohamed K Ahmed Ali
(74) *Attorney, Agent, or Firm* — JDI Patent; Joshua Isenberg; Robert Pullman

(57) ABSTRACT

A cylindrical mask may be fabricated using a hollow casting cylinder and a mask cylinder. The casting cylinder has an inner diameter that is larger than the outer diameter of the mask cylinder. The casting and mask cylinders are coaxially assembled and a liquid polymer inserted in a space surrounding the mask cylinder between the inner surface of the casting cylinder and the outer surface of the mask cylinder. After curing the liquid polymer, the casting cylinder is removed. A surface of the cured polymer can be patterned. It is emphasized that this abstract is provided to comply with the rules requiring an abstract that will allow a searcher or
(Continued)

other reader to quickly ascertain the subject matter of the technical disclosure. It is submitted with the understanding that it will not be used to interpret or limit the scope or meaning of the claims.

12 Claims, 26 Drawing Sheets

Related U.S. Application Data

PCT/US2013/038675, filed on Apr. 20, 2013, and a continuation-in-part of application No. 13/756,348, filed on Jan. 31, 2013, now Pat. No. 9,782,917, and a continuation-in-part of application No. 13/756,370, filed on Jan. 31, 2013, now Pat. No. 9,481,112, and a continuation-in-part of application No. 13/756,348, and a continuation-in-part of application No. 13/756,370.

(60) Provisional application No. 61/798,629, filed on Mar. 15, 2013, provisional application No. 61/641,711, filed on May 2, 2012, provisional application No. 61/641,650, filed on May 2, 2012.

(51) Int. Cl.

| | |
|---|---|
| B29C 33/42 | (2006.01) |
| B29C 35/02 | (2006.01) |
| B29C 39/02 | (2006.01) |
| B29C 53/34 | (2006.01) |
| G03F 1/72 | (2012.01) |
| B29C 39/14 | (2006.01) |
| G03F 7/00 | (2006.01) |
| B29K 83/00 | (2006.01) |
| B29L 31/00 | (2006.01) |

(52) U.S. Cl.
CPC .......... B29C 35/02 (2013.01); B29C 39/026 (2013.01); B29C 39/148 (2013.01); B29C 53/34 (2013.01); G03F 1/72 (2013.01); G03F 7/0002 (2013.01); B29K 2083/00 (2013.01); B29L 2031/757 (2013.01); Y10T 428/24802 (2015.01)

(56) References Cited

U.S. PATENT DOCUMENTS

| | | | |
|---|---|---|---|
| 3,520,509 | A | 7/1970 | Carey |
| 3,619,446 | A | 11/1971 | Nauta |
| 3,622,117 | A | 11/1971 | Biagioni et al. |
| 4,035,534 | A | 7/1977 | Nyberg |
| 4,070,749 | A | 1/1978 | Misono et al. |
| 4,179,320 | A | 12/1979 | Midgley et al. |
| 4,294,782 | A | 10/1981 | Froehlig |
| 4,338,970 | A | 7/1982 | Krackeler et al. |
| 4,919,608 | A | 4/1990 | Catalanotti et al. |
| 5,252,279 | A | 10/1993 | Gore et al. |
| 5,406,871 | A | 4/1995 | Lambert |
| 5,746,253 | A | 5/1998 | Dust et al. |
| 5,888,701 | A | 3/1999 | Fan |
| 6,675,863 | B1 | 1/2004 | Wang et al. |
| 7,700,199 | B2 | 4/2010 | Wang et al. |
| 8,182,982 | B2 | 5/2012 | Kobrin |
| 8,192,920 | B2 | 6/2012 | Kobrin |
| 8,318,386 | B2 | 11/2012 | Kobrin |
| 8,334,217 | B2 | 12/2012 | Kobrin |
| 8,425,789 | B2 | 4/2013 | Kobrin |
| 8,518,633 | B2 | 8/2013 | Kobrin et al. |
| 9,782,917 | B2 | 10/2017 | Kobrin et al. |
| 2005/0015046 | A1 | 1/2005 | Weber et al. |
| 2005/0067286 | A1 | 3/2005 | Ahn et al. |
| 2005/0150406 | A1 | 7/2005 | Kanga et al. |
| 2007/0264481 | A1 | 11/2007 | DeSimone et al. |
| 2008/0054517 | A1 | 3/2008 | Yamamoto |
| 2009/0087599 | A1 | 4/2009 | Cheng et al. |
| 2009/0166932 | A1 | 7/2009 | Lee et al. |
| 2009/0220789 | A1 | 9/2009 | DeSimone et al. |
| 2009/0269705 | A1 | 10/2009 | Kobrin |
| 2010/0035163 | A1 | 2/2010 | Kobrin |
| 2010/0123885 | A1 | 5/2010 | Kobrin |
| 2010/0294421 | A1 | 11/2010 | Fujiki et al. |
| 2011/0182805 | A1 | 7/2011 | DeSimone et al. |
| 2011/0210480 | A1 | 9/2011 | Kobrin |
| 2012/0274004 | A1 | 11/2012 | Kobrin |
| 2012/0282554 | A1 | 11/2012 | Kobrin et al. |
| 2013/0224636 | A1 | 8/2013 | Kobrin |
| 2013/0280894 | A1 | 10/2013 | Lee et al. |
| 2014/0212533 | A1 | 7/2014 | Kobrin et al. |
| 2014/0212536 | A1 | 7/2014 | Kobrin et al. |

FOREIGN PATENT DOCUMENTS

| | | |
|---|---|---|
| JP | 2003276034 A | 9/2003 |
| JP | 2009536115 A | 10/2009 |
| RU | 2157763 C2 | 10/2000 |
| WO | 2008051031 A1 | 5/2008 |
| WO | 2009094009 A1 | 7/2009 |
| WO | 2012027050 A | 3/2012 |
| WO | 2012027050 A2 | 3/2012 |

OTHER PUBLICATIONS

Final Office Action for U.S. Appl. No. 13/756,348, dated May 19, 2016.
Final Office Action for U.S. Appl. No. 13/756,370, dated Jul. 6, 2015.
International Search Report and Written Opinion of the International Searching Authority for Application No. PCT/US2013/038675 dated Aug. 29, 2013.
Non-Final Office Action for U.S. Appl. No. 13/756,348, dated Nov. 6, 2015
Non-Final Office Action for U.S. Appl. No. 13/756,370, dated Jan. 2, 2015.
Non-Final Office Action for U.S. Appl. No. 13/756,370, dated Mar. 10, 2016.
Non-Final Office Action for U.S. Appl. No. 14/521,375, dated May 3, 2016.
Notice of Allowance from U.S. Appl. No. 13/756,370, dated Jul. 1, 2016.
Taiwanese Office Action for TW Application No. 20138003546.0, dated Feb. 2, 2016.
U.S. Appl. No. 61/641,650, to Boris Kobrin et al., filed May 2, 2012.
U.S. Appl. No. 61/641,711, to Boris Kobrin et al., filed May 2, 2012.
U.S. Appl. No. 61/798,629, to Boris Kobrin, filed Mar. 15, 2013.
U.S. Appl. No. 13/756,348 entitled "Cylindrical Master Mold and Method of Fabrication", to Boris Kobrin, filed Jan. 31, 2013.
U.S. Appl. No. 13/756,370 entitled "Cylindrical Master Mold Assembly for Casting Cylindrical Masks", to Boris Kobrin. filed Jan. 31, 2013.
U.S. Appl. No. 61/798,629 entitled "Cylindrical Polymer Mask and Method of Fabrication", to Boris Kobrin. filed Mar. 15, 2013.
Notice of Allowance for U.S. Appl. No. 13/756,348, dated Jun. 5, 2017.
Office Action dated Jul. 27, 2017 for Chinese Patent Application 201380035462.0.
Final Office Action for U.S. Appl. No. 14/521,375, dated Nov. 28, 2016.
Non-Final Office Action for U.S. Appl. No. 13/756,348, dated Nov. 28, 2016.
Non-Final Office Action for U.S. Appl. No. 14/521,375, dated Nov. 22, 2017.
Office Action dated Jun. 30, 2017 for Taiwan Invention Patent Application No. 102115733.

top view side view

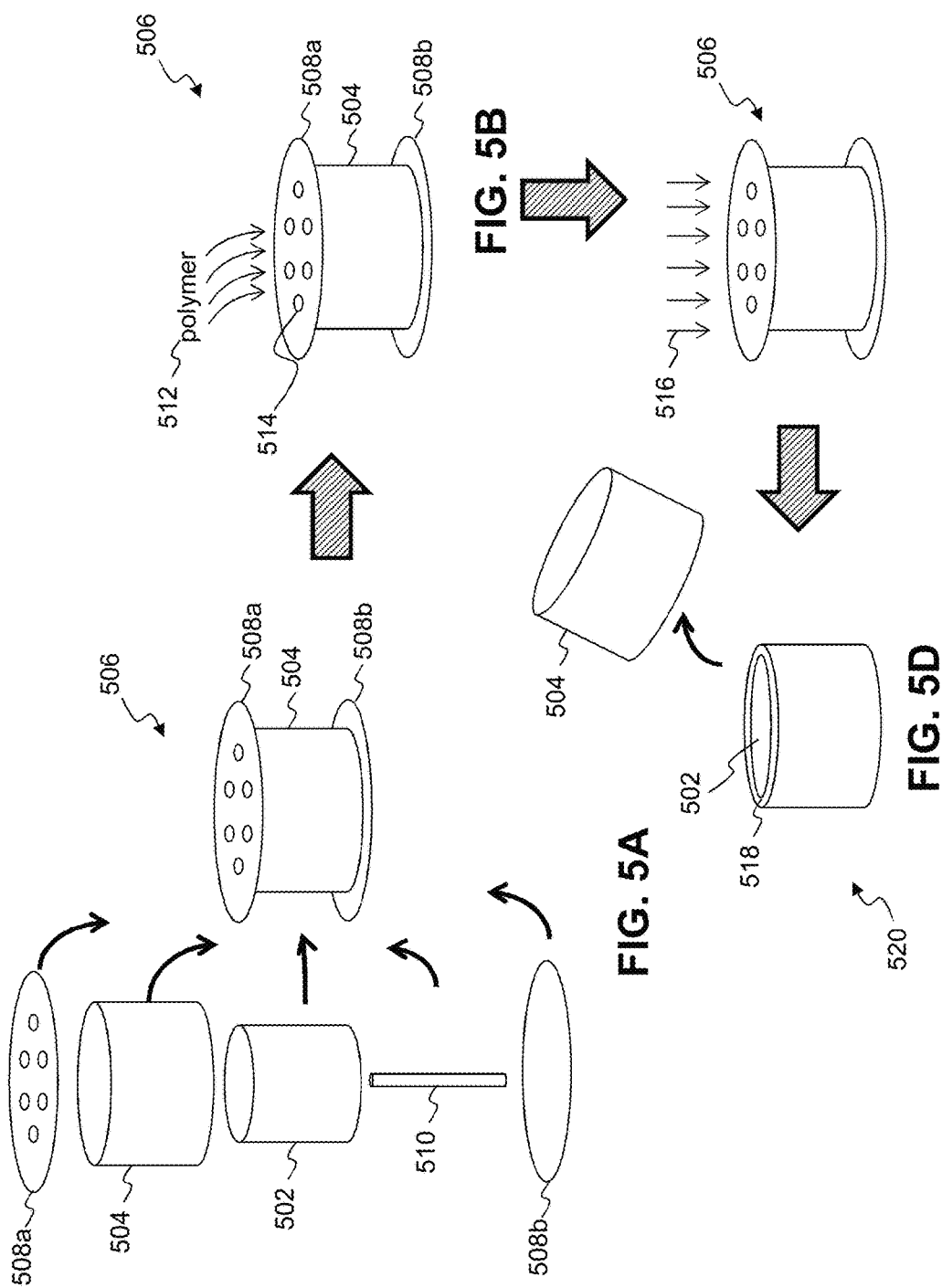

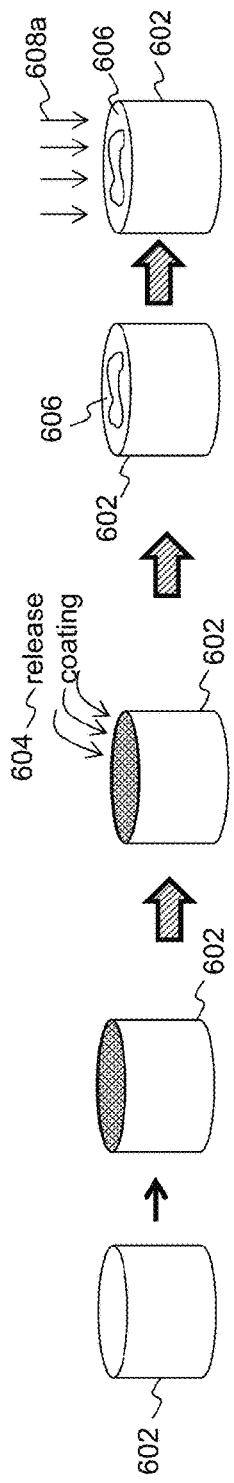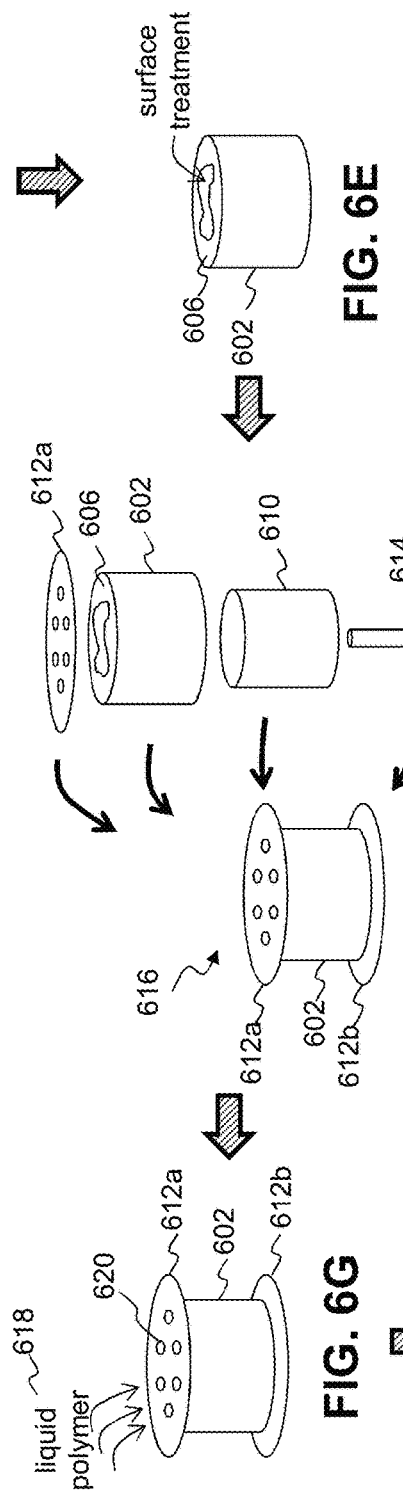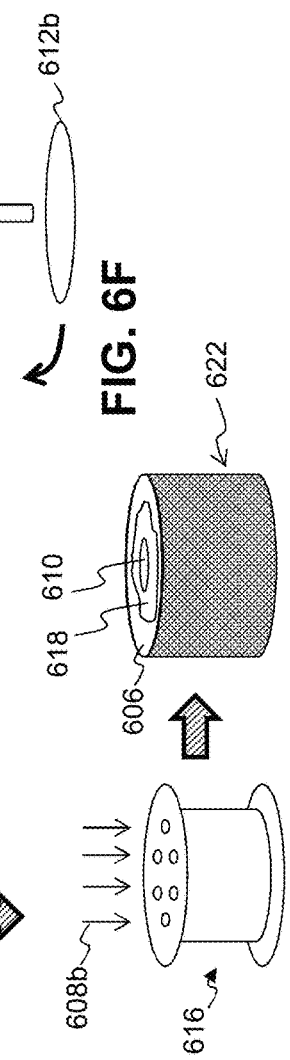

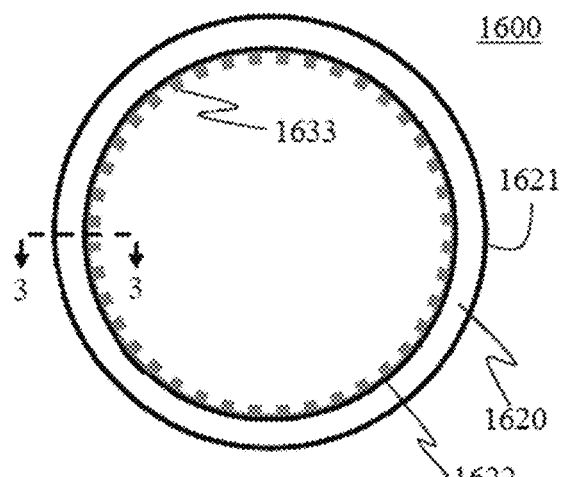
FIG. 16
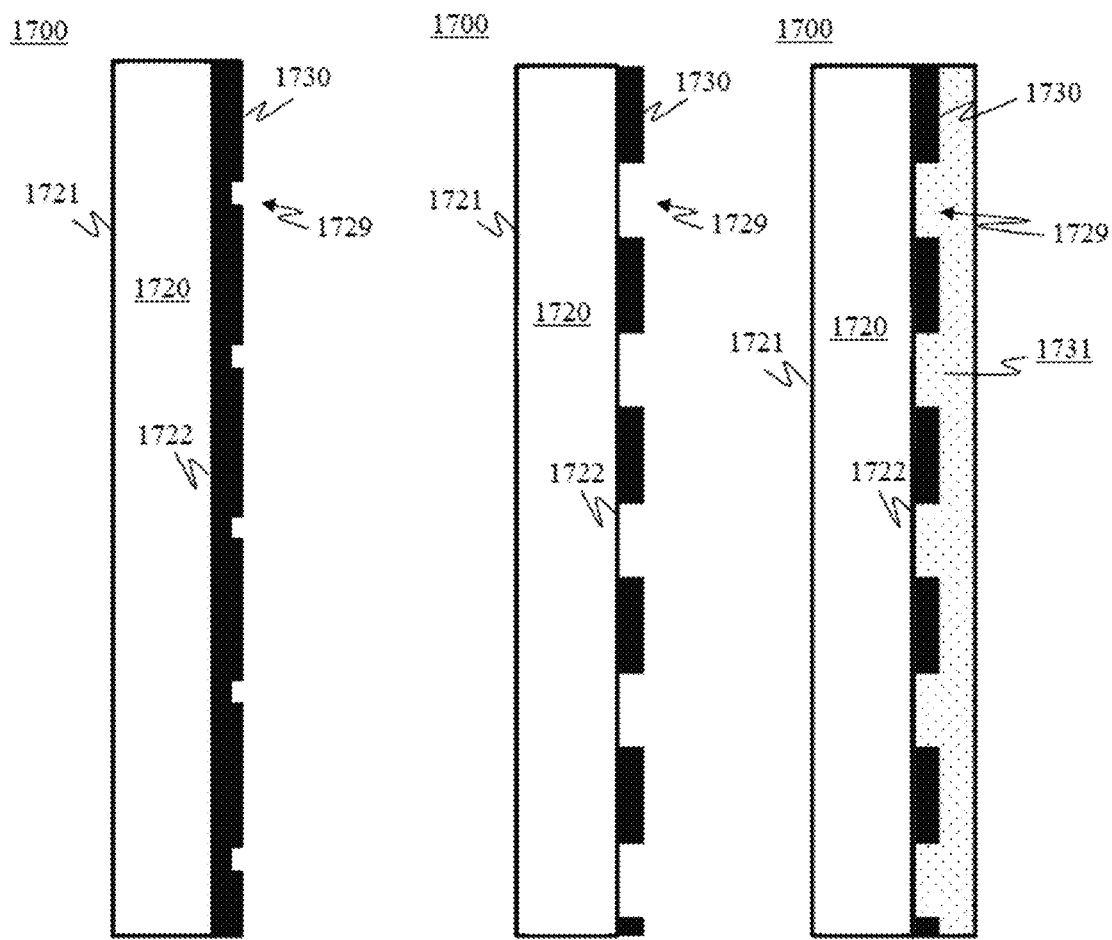
FIG. 17A  FIG. 17B  FIG. 17C

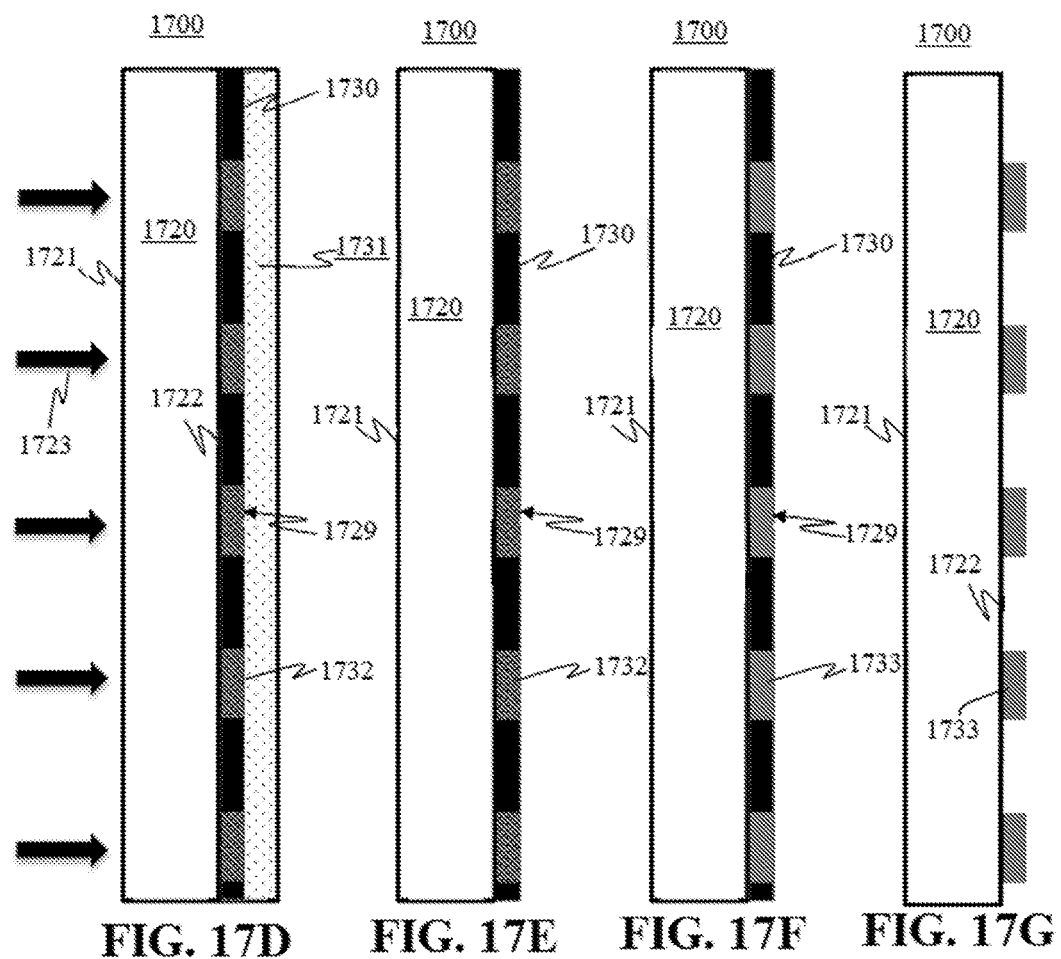
FIG. 17D  FIG. 17E  FIG. 17F  FIG. 17G

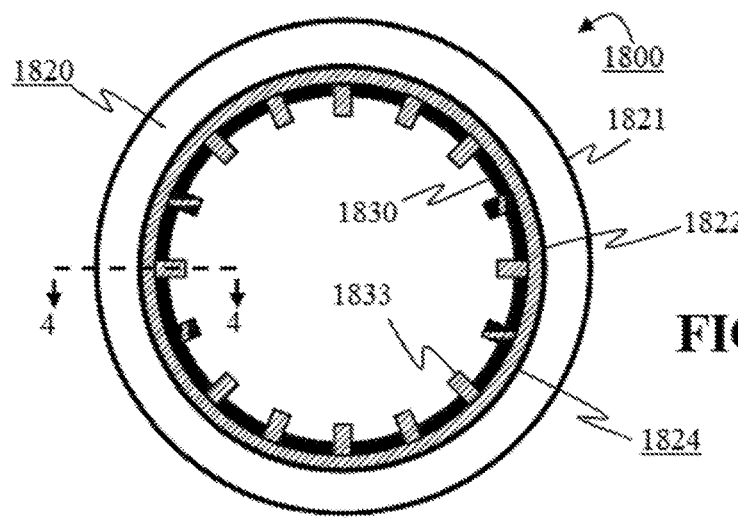
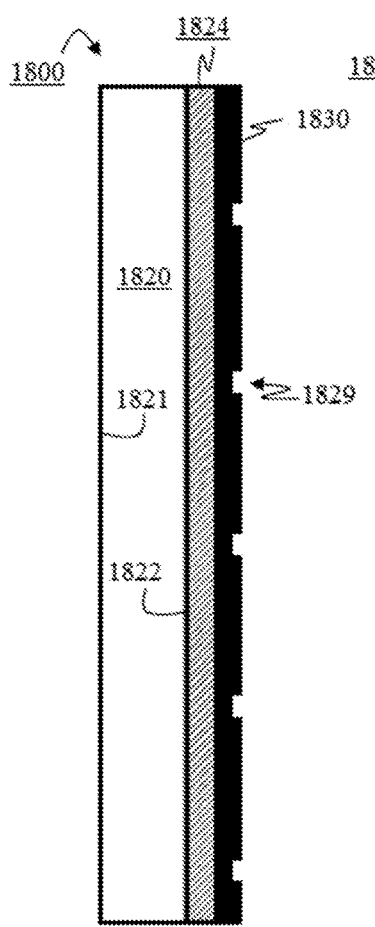 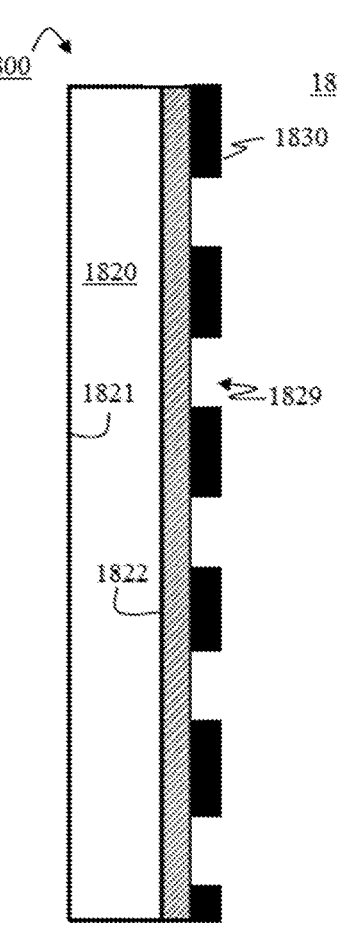 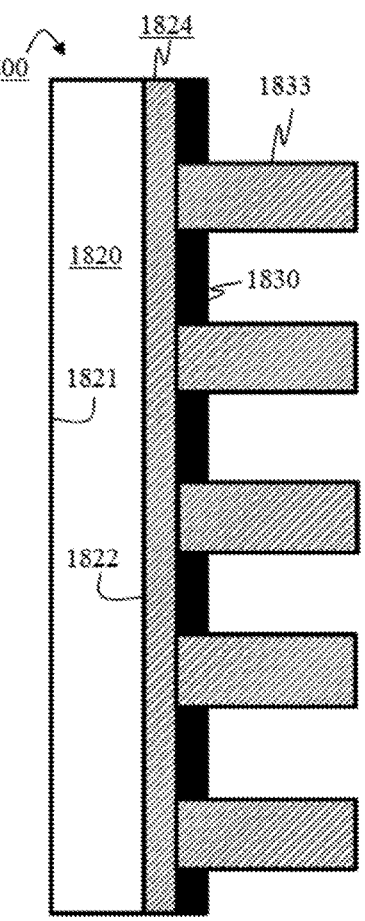
FIG. 18A
FIG. 18B  FIG. 18C  FIG. 18D

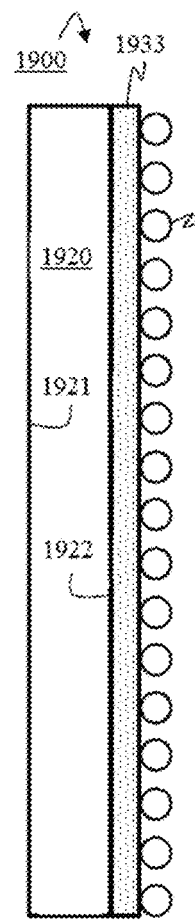 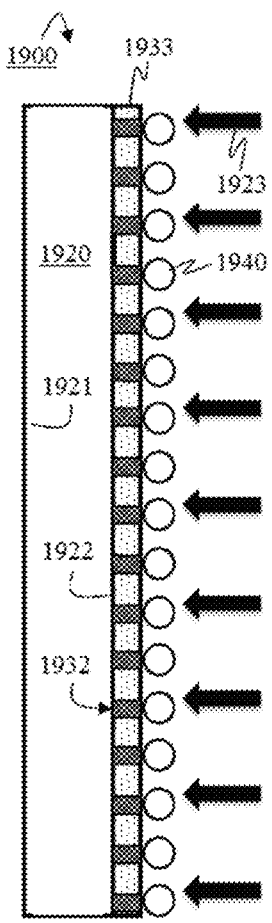 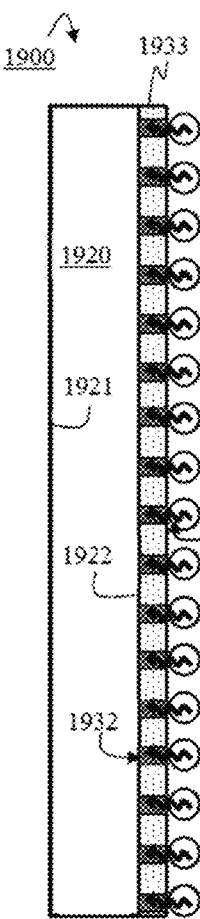 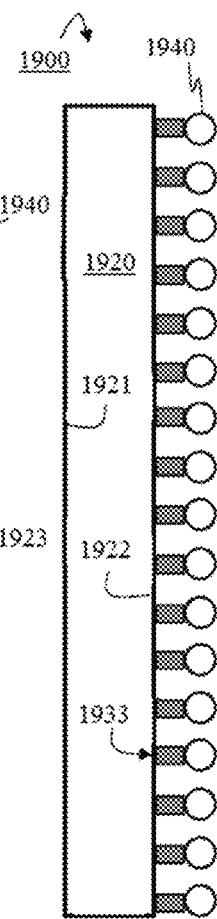
FIG. 19A  FIG. 19B  FIG. 19B'  FIG. 19C

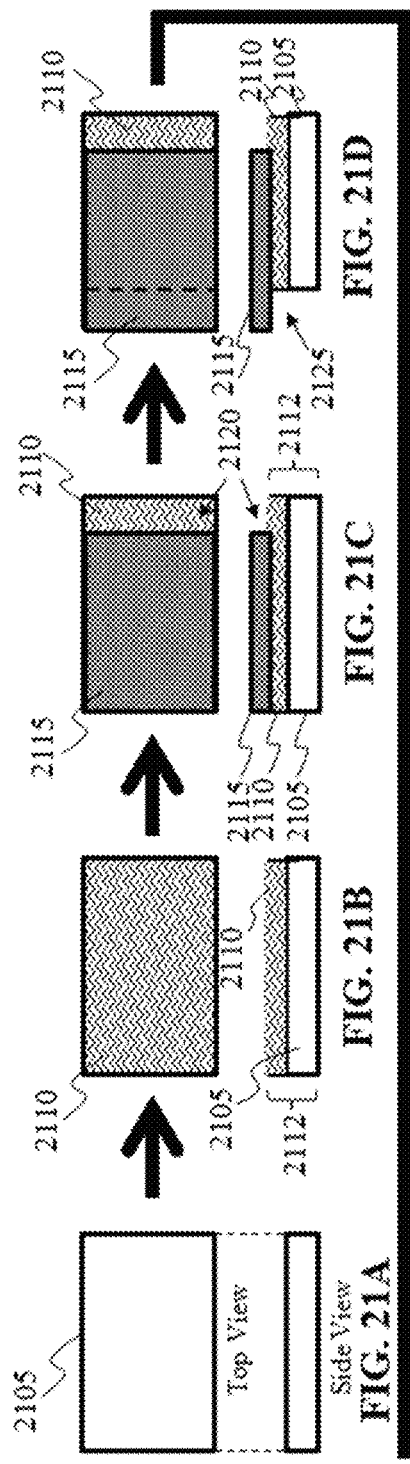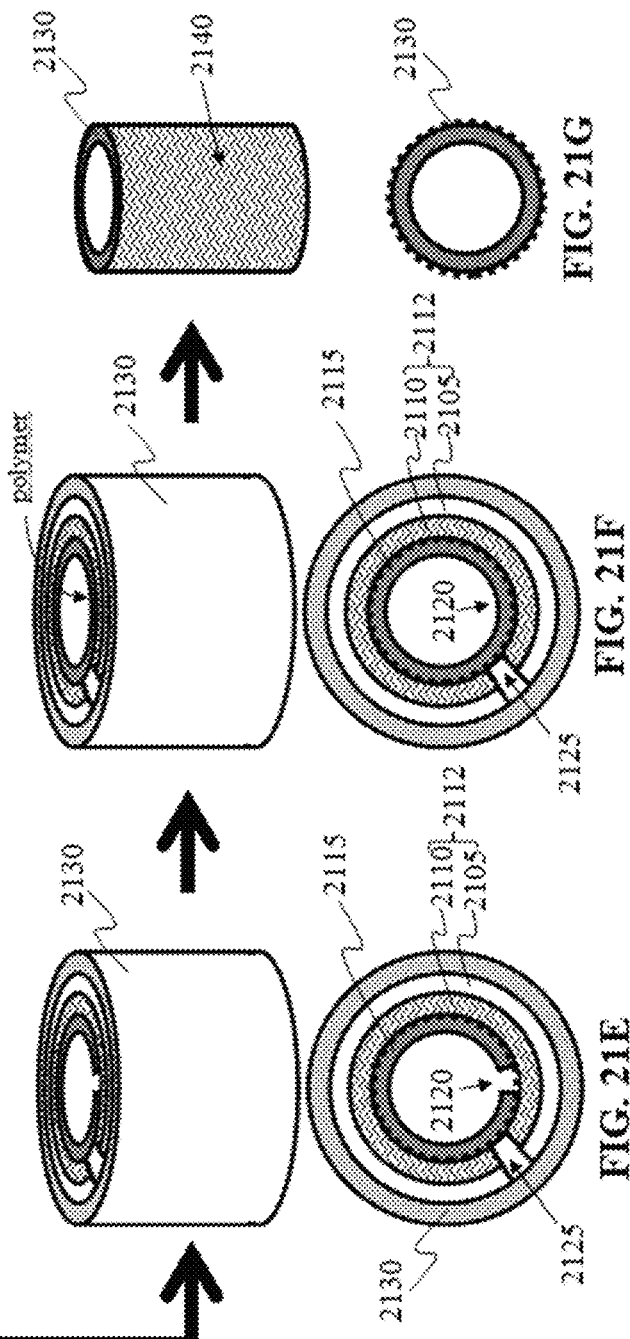

METHOD OF FABRICATING CYLINDRICAL POLYMER MASK

PRIORITY CLAIMS

This application is a continuation of and claims the priority benefit of commonly-assigned U.S. patent application Ser. No. 14/521,375, filed Oct. 22, 2014 and published as U.S. Patent Application Publication Number 2015/0336301, the entire contents of which are incorporated herein by reference.

U.S. patent application Ser. No. 14/521,375 is a continuation-in-part of and claims the benefit of priority of commonly-assigned, co-pending U.S. Non-Provisional application Ser. No. 13/756,348, filed Jan. 31, 2013, the entire disclosure of which is herein incorporated by reference.

U.S. patent application Ser. No. 14/521,375 is a continuation-in-part of and claims the benefit of priority of commonly-assigned, co-pending U.S. Non-Provisional application Ser. No. 13/756,370, filed Jan. 31, 2013, the entire disclosure of which is herein incorporated by reference.

U.S. patent application Ser. No. 14/521,375 is a continuation of and claims the priority benefit of commonly-assigned co-pending International Application Number PCT/US2013/038675, filed Apr. 29, 2013, the entire contents of which are incorporated herein by reference. International Application Number PCT/US2013/038675 claims the benefit of priority of commonly-assigned, U.S. Provisional application Ser. No. 61/798,629, to Boris Kobrin et al., entitled "CYLINDRICAL POLYMER MASK AND METHOD OF FABRICATION", filed Mar. 15, 2013, the entire disclosure of which is herein incorporated by reference.

International Application Number PCT/US2013/038675 claims the benefit of priority of commonly-assigned, U.S. Provisional application Ser. No. 61/641,711, to Boris Kobrin et al., entitled "SEAMLESS MASK AND METHOD OF MANUFACTURING", filed May 2, 2012, the entire disclosure of which is herein incorporated by reference.

International Application Number PCT/US2013/038675 claims the benefit of priority of commonly-assigned, U.S. Provisional application Ser. No. 61/641,650, to Boris Kobrin et al., entitled "LARGE AREA MASKS AND METHODS OF MANUFACTURING", filed May 2, 2012, the entire disclosure of which is herein incorporated by reference.

International Application Number PCT/US2013/038675 is a continuation-in-part of and claims the benefit of priority of commonly-assigned, co-pending U.S. Non-Provisional application Ser. No. 13/756,348, to Boris Kobrin et al., entitled "CYLINDRICAL MASTER MOLD AND METHOD OF FABRICATION", filed Jan. 31, 2013, the entire disclosure of which is herein incorporated by reference.

International Application Number PCT/US2013/038675 is a continuation-in-part of and claims the benefit of priority of commonly-assigned, co-pending U.S. Non-Provisional application Ser. No. 13/756,370, to Boris Kobrin et al., entitled "CYLINDRICAL PATTERNED COMPONENT FOR CASTING CYLINDRICAL MASKS", filed Jan. 31, 2013, the entire disclosure of which is herein incorporated by reference.

CROSS-REFERENCE TO RELATED APPLICATIONS

This application is also related to commonly-assigned International Patent Application Publication Number WO2009094009, the entire disclosure of which is herein incorporated by reference, and U.S. Pat. No. 8,182,982, the entire disclosure of which are incorporated herein by reference.

FIELD OF THE DISCLOSURE

The present disclosure is related to lithography methods. More specifically, aspects of the present disclosure are related to rotatable masks, including cylindrical polymer masks and methods of fabrication thereof.

BACKGROUND

Photolithography fabrication methods have use in a wide variety of technological applications, including micro-scale and nano-scale fabrication of solar cells, LEDs, integrated circuits, MEMs devices, architectural glass, information displays, and more.

Roll-to-roll and roll-to-plate lithography methods typically use cylindrically shaped masks (e.g. molds, stamps, photomasks, etc.) to transfer desired patterns onto rigid or flexible substrates. A desired pattern can be transferred onto a substrate using, for example, imprinting methods (e.g. nanoimprint lithography), the selective transfer of materials (e.g. micro- or nano-contact printing, decal transfer lithography, etc.), or exposure methods (e.g. optical contact lithography, near field lithography, etc.). Some advanced types of such cylindrical masks use soft polymers as patterned layers laminated on a cylinder's outer surface. Unfortunately, lamination of a layer on a cylindrical surface creates a seam line where the edges of the lamination layer meet. This can create an undesirable image feature at the seam when the pattern is repeatably transferred to a substrate by using the cylindrical mask.

In addition to fabricating a mask having a seamless polymer layer, it would be desirable to fabricate polymer layers with smooth surfaces that are thick and uniform for use in subsequent rolling lithography fabrication methods.

Patterned substrates and structured coatings have attractive properties for a variety of applications, including architectural glass, information displays, solar panels, and more. For example, nanostructured coatings can provide desirable antireflection characteristics for architectural glass. Current methods of patterning substrates, including methods such as electron beam lithography, photolithography, interference lithography, and other methods, are often too costly for practical use in the manufacture of patterned substrates or structured coatings in applications requiring larger areas, especially those having areas of 200 cm$^2$ or more.

As such, there is a need in the art for large area patterned layers and low cost methods of manufacturing the same. It is within this context that a need for the present invention arises.

Nanostructuring is necessary for many present applications and industries and for new technologies and future advanced products. Improvements in efficiency can be achieved for current applications in areas such as solar cells and LEDs, and in next generation data storage devices, for example and not by way of limitation.

Nanostructured substrates may be fabricated using techniques such as e-beam direct writing, Deep UV lithography, nanosphere lithography, nanoimprint lithography, near-field phase shift lithography, and plasmonic lithography, for example.

Earlier authors have suggested a method of nanopatterning large areas of rigid and flexible substrate materials based on near-field optical lithography described in International Patent Application Publication No. WO2009094009 and U.S. Pat. No. 8,182,982, which are both incorporated herein in their entirety. According to such methods, a rotatable mask is used to image a radiation-sensitive material. Typically the rotatable mask comprises a cylinder or cone with a mask pattern formed on its surface. The mask rolls with respect to the radiation sensitive material (e.g., photoresist) as radiation passes through the mask pattern to the radiation sensitive material. For this reason, the technique is sometimes referred to as "rolling mask" lithography. This nano-patterning technique may make use of Near-Field photolithography, where the mask used to pattern the substrate is in contact with the substrate. Near-Field photolithography implementations of this method may make use of an elastomeric phase-shifting mask, or may employ surface plasmon technology, where the rotating mask surface includes metal nano holes or nanoparticles. In one implementation such a mask may be a near-field phase-shift mask. Near-field phase shift lithography involves exposure of a radiation-sensitive material layer to ultraviolet (UV) light that passes through an elastomeric phase mask while the mask is in conformal contact with a radiation-sensitive material. Bringing an elastomeric phase mask into contact with a thin layer of radiation-sensitive material causes the radiation-sensitive material to "wet" the surface of the contact surface of the mask. Passing UV light through the mask while it is in contact with the radiation-sensitive material exposes the radiation-sensitive material to the distribution of light intensity that develops at the surface of the mask.

In some implementations, a phase mask may be formed with a depth of relief that is designed to modulate the phase of the transmitted light by $\pi$ radians. As a result of the phase modulation, a local null in the intensity appears at step edges in the relief pattern formed on the mask. When a positive radiation-sensitive material is used, exposure through such a mask, followed by development, yields a line of radiation-sensitive material with a width equal to the characteristic width of the null in intensity. For 365 nm (Near UV) light in combination with a conventional radiation-sensitive material, the width of the null in intensity is approximately 100 nm. A polydimethylsiloxane (PDMS) mask can be used to form a conformal, atomic scale contact with a layer of radiation-sensitive material. This contact is established spontaneously upon contact, without applied pressure. Generalized adhesion forces guide this process and provide a simple and convenient method of aligning the mask in angle and position in the direction normal to the radiation-sensitive material surface, to establish perfect contact. There is no physical gap with respect to the radiation-sensitive material. PDMS is transparent to UV light with wavelengths greater than 300 nm. Passing light from a mercury lamp (where the main spectral lines are at 355-365 nm) through the PDMS while it is in conformal contact with a layer of radiation-sensitive material exposes the radiation-sensitive material to the intensity distribution that forms at the mask.

Another implementation of the rotating mask may include surface plasmon technology in which a metal layer or film is laminated or deposited onto the outer surface of the rotatable mask. The metal layer or film has a specific series of through nanoholes. In another embodiment of surface plasmon technology, a layer of metal nanoparticles is deposited on the transparent rotatable mask's outer surface, to achieve the surface plasmons by enhanced nanopatterning.

The abovementioned applications may each utilize a rotatable mask. The rotatable masks may be manufactured with the aid of a master mold (fabricated using one of known nanolithography techniques, like e-beam, Deep UV, Interference and Nanoimprint lithographies). The rotatable masks may be made by molding a polymer material, curing the polymer to form a replica film, and finally laminating the replica film onto the surface of a cylinder. Unfortunately, this method unavoidably would create some "macro" stitching lines between pieces of polymer film (even if the master is very big and only one piece of polymer film is required to cover entire cylinder's surface one stitching line is still unavoidable). It is within this context that the present invention arises.

SUMMARY

According to aspects of the present disclosure, a cylindrical mask may be fabricated by patterning a master mold, forming a patterned polymer mask by casting liquid polymer on the master mold, and curing the liquid polymer. A portion of one end of the patterned polymer mask may be cutoff or the liquid polymer is not cast on a strip at an end of the master mold. The master mold and the patterned polymer mask may be rolled to form a laminate cylinder to form a gap on the patterned polymer mask. The laminate cylinder may be inserted into a casting cylinder with the substrate to the master mold in contact with the casting cylinder and the gap filled with additional liquid polymer, which can be cured to form a free standing polymer by removing the casting cylinder and separating the master mold from the laminate.

According to other aspects of the present disclosure a cylindrical mask may be fabricated using a hollow casting cylinder and a mask cylinder. The casting cylinder may have an inner diameter that is larger than the outer diameter of the mask cylinder. The casting and mask cylinders may be coaxially assembled and a liquid polymer inserted in a space surrounding the mask cylinder between the inner surface of the casting cylinder and the outer surface of the mask cylinder. After curing the liquid polymer, the casting cylinder may be removed.

According to other aspects, a substrate may be patterned by successively repeating imprinting the substrate with a master mask having a pattern, the pattern having a smaller area than the substrate until a desired area of the substrate is patterned. Each successive imprinting may overlap part of a previously imprinted portion of the substrate. Imprinting the substrate with the master mask may include (i) depositing a polymer precursor liquid; (ii) pressing the polymer precursor liquid between the master mask and the substrate; and (iii) curing the polymer precursor liquid. The resulting substrate may have a patterned layer with a plurality of imprints, and each boundary between the imprints includes an imprint overlapping a portion of another imprint.

Additional aspects of the present disclosure describe cylindrical molds that may be used to produce cylindrical masks for use in lithography. A structured porous layer may be deposited on an interior surface of a cylinder. A radiation-sensitive material may be deposited over the porous layer in order to fill pores formed in the layer. The radiation-sensitive material in the pores may be cured by exposing the cylinder with a light source. The uncured resist and porous layer may be removed, leaving behind posts on the cylinder's interior surface.

Further aspects of the present disclosure include a cylindrical master mold assembly having a cylindrical patterned component with a first diameter and a sacrificial casting component with a second diameter. The component with the smaller radius may be co-axially inserted into the interior of the component with the larger radius. Patterned features may be formed on the interior surface of the cylindrical patterned component that faces the sacrificial casting component. The sacrificial casting component may be removed once a cast polymer has been cured to allow the polymer to be released.

BRIEF DESCRIPTION OF THE DRAWINGS

FIGS. 5A-5D are a process flow diagram depicting a method of fabricating a cylindrical mask according to embodiments of the present invention.

FIGS. 6A-6I are a process flow diagram depicting a method of fabricating a cylindrical mask having multiple layers of polymer as a compliant outer layer according to embodiments of the present invention.

FIG. 16 is an overhead view of a cylinder master mold with protrusions extending out from the interior surface according to an aspect of the present disclosure.

FIGS. 17A-17G are schematic diagrams that show the process of forming the master mold according to aspects of the present disclosure.

FIGS. 18A-18D are schematic diagrams that show the process of forming the master mold according to additional aspects of the present disclosure that utilize an epitaxial seed layer.

FIGS. 19A, 19B, 19B', and 19C are schematic diagrams that show the process of forming the master mold according to additional aspects of the present disclosure that utilize self-assembled monomers formed on the interior of the master mold.

FIGS. 21A-21G are schematic diagrams that depict a process flow of producing a free-standing mask using a rolled laminate according to various aspects of the present disclosure.

DETAILED DESCRIPTION

The following definitions of terms help to clarify and aid in the understanding of the descriptive terminology used in the description and claims of the present disclosure.

Figure 1A:
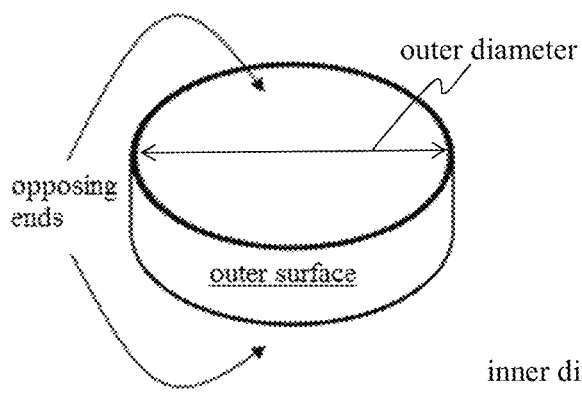
FIGS. 1A-1C depict generic cylinders that are labeled to help clarify descriptive language used in the description and claims of the present invention.

As used herein,

"opposing ends" of a component refers the opposite faces of a cylinder or other axially symmetric shape as shown in FIG. 1A.

Figure 1B:
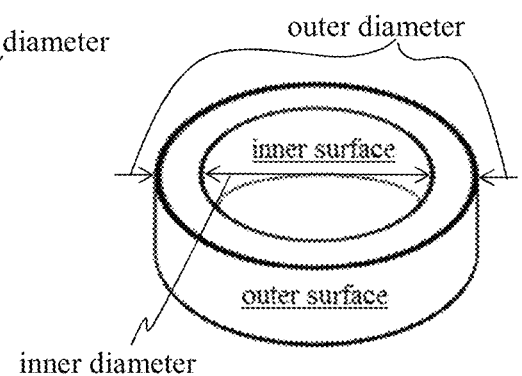

"outer surface" of a component refers to the exterior surface on the sides of a cylinder or other axially symmetric shape as depicted in FIGS. 1A and 1B.

"inner surface" of a component refers to the interior surface on the inner sides of a hollow cylinder or other axially symmetric shape as depicted in FIG. 1B.

"outer radius/diameter" of a component refers to a radius/diameter of an outer surface of a cylinder or other axially symmetric shape as depicted in FIGS. 1A and 1B. Where a component's outer surface is of a shape that has radius/ diameter that is not constant, such as with a cone or other axially symmetric shape, the outer radius/diameter may refer to any such radii/diameters, so long as they correspond to the outer surface.

"inner radius/diameter" of a component refers to a radius/diameter of an inner surface of a cylinder or other axially symmetric shape as depicted in FIG. 1B. Where a component's inner surface is of a shape that has radius/diameter that is not constant, such as with a cone or other axially symmetric shape, the inner radius/diameter may refer to any such radii/diameters, so long as they correspond to the inner surface.

Figure 1C:
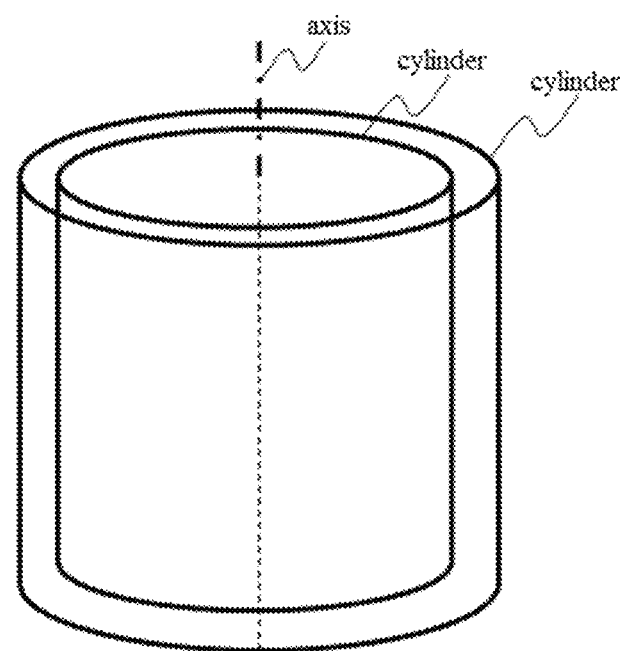

"coaxially assembling" components means assembling the components so that they have the same axis of symmetry as depicted in FIG. 1C.

"mask cylinder" or "masking cylinder" refers to a cylindrical substrate for a cylindrical mask, onto the outer surface of which a compliant layer is formed.

"cast cylinder" or "casting cylinder" refers to a cylindrically shaped cast.

I. Casting Using Coaxial Components

Aspects of the disclosure of this SECTION I include methods and apparatus for making rotatable masks. Various other methods and apparatus are also included in this section. Casting/molding processes and coaxial casting components may be used to cast a compliant layer of a rotatable mask, which can provide benefits that may include minimizing or eliminating the presence of a seam in the rotatable mask. There may be various other advantages to implementations of this section.

It is further noted that this SECTION I has applicability to and can readily be implemented in various aspects of the remaining SECTIONS II-VI of this description, including but not limited to any such sections that may involve the use of coaxial casting components and assemblies for making rotatable masks. By way of example and not by way of limitation, various aspects of the disclosure of this SECTION I can readily be applied to implementations of SECTION II of this description, which involves the use of sacrificial casting components and coaxially assembling components for fabrication of rotatable masks.

In order to fabricate a cylindrical mask, polymer material can be used as a compliant outer layer of a cylindrical mask. In embodiments of the present invention, a casting process can be used to form a compliant outer layer by casting polymer on the outer surface of a mask cylinder to create a seamless outer layer. A casting process in embodiments of the present invention can involve coaxially assembling a casting cylinder and a mask cylinder and inserting a liquid polymer in the space in the cast surrounding the mask cylinder. The polymer is then cured and the casting cylinder is removed to create a seamless cylindrical mask that can be used to fabricate a variety of devices. The polymer layer of the cylindrical mask can be patterned to create a mask pattern that can be repeatably transferred to a substrate, e.g. by roll-to-roll lithography, roll-to-plate lithography, etc.

In embodiments of the present invention, a method of fabricating a cylindrical mask can include coaxially assembling a casting cylinder and a mask cylinder, inserting liquid polymer in the space between the casting and mask cylinders, curing the polymer, and removing the casting cylinder. The method can further include patterning the polymer, which can be an additional step after removing the casting cylinder, or which can be incorporated into the fabrication process by using a cylinder having a pattern on its surface so that the pattern is transferred to the polymer when it comes into contact with the cylinder's surface.

In embodiments of the present invention, assembling a casting cylinder around the mask cylinder can involve the use of an assembly apparatus that holds the mask and casting cylinders in place during the fabrication of the cylindrical mask. The assembly apparatus can be designed to preserve the coaxial alignment of the cylinders during the casting process, creating cylindrical space of uniform thickness around the mask cylinder that corresponds to the outer compliant layer of the cylindrical mask. The fixture can be designed to permit a liquid polymer material to be inserted into this space while the cylinders are assembled with the fixture.

In embodiments of the present invention, an assembly apparatus used to preserve the coaxial alignment of cylinders in the fabrication process can include a set of plates, with the plates held together at opposing ends of the cylinders by a pin. The plates can include grooves aligned with the sides of the cylinders, or other means, to hold the alignment of the cylinders in place. One of the plates can have holes, or other means, that permit a liquid polymer to be poured through it and into the space corresponding to the outer compliant layer of the cylindrical mask.

The casting fixtures may be removed by disassembly. For example, after the polymer between the cylinders has cured, the casting cylinder may be separated into two or more sections by cutting it lengthwise from its exterior surface down to the tube cured polymer without significant damage to the polymer or leaving a small amount of the casting cylinder material. The cut can be made by saw, chemical etching, or laser. The sections of casting cylinder may then be the separated from the cured polymer and from each other.

Embodiments of the present invention are capable of creating patterned cylindrical masks having uniform and seamless outer layers with ideal thickness and smoothness for the repeatable transfer of the mask's pattern onto substrates for the fabrication of various devices.

Figure 2:
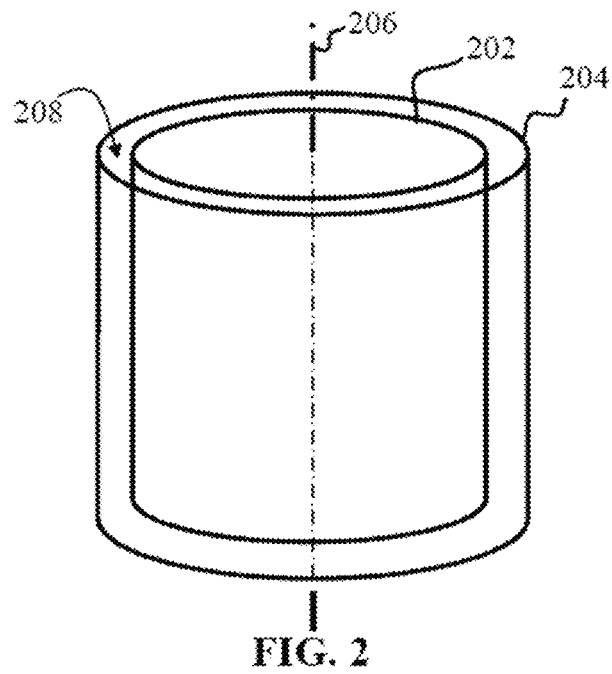
FIG. 2 depicts a mask cylinder assembled inside of a cylindrical cast according to embodiments of the present invention.

Turning now to FIG. 2, an assembly 200 of a mask cylinder 202 surrounded by a casting cylinder 204 is depicted according to an embodiment of the present invention. The cylinders 202 and 204 are coaxially assembled to so that their axes 206 are aligned, thereby creating a cylindrical region 208 of uniform thickness around the mask cylinder which can define the shape of the outer polymer layer of the cylindrical mask. Cylinders 202 and 204 can be held in place using an assembly apparatus (not pictured) that aligns their axes and permits a liquid polymer to be inserted into cylindrical region 208 of the assembly, such as by pouring it through openings or holes in the apparatus. Polymer precursor can be inserted in the space 208 between the cylinders 202 and 204. The polymer precursor may be in the form of a monomer, a polymer, a partially cross-linked polymer, or any mixture of thereof in a liquid or semi-liquid form. The polymer precursor can be cured to form the outer polymer layer of the cylindrical mask. The polymer may be patterned with a mask pattern in a variety of ways. For example, the inner surface of casting cylinder 204 may contain a mask pattern so that the outer surface of the polymer material matches the pattern on the inner surface of the casting cylinder 204. As another example, the outer surface of the mask cylinder 202 may contain a mask pattern so that this pattern is transferred to the inner surface of the polymer after it is formed on the mask cylinder. As another example, the polymer material may be patterned after subsequent fabrication steps and removal of the casting cylinder 204 by patterning the outer surface of the polymer using various lithography methods. As another example, the pattern may also be patterned by some combination of the above.

Figure 3:
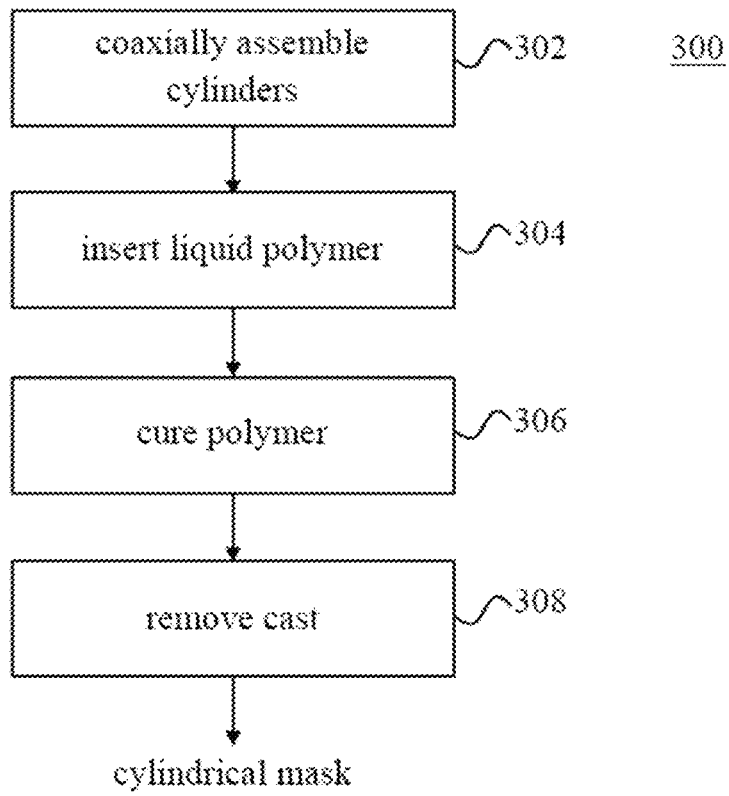
FIG. 3 is a flowchart of a method of fabricating a cylindrical mask according to embodiments of the present invention.

Turning to FIG. 3, a flowchart of fabricating a seamless cylindrical mask is depicted according to embodiments of the present invention. Fabricating a cylindrical mask 300 can include coaxially assembling the cylinders as indicated at 302, which can involve assembling a casting cylinder and a mask cylinder so that the axis of both the casting cylinder and the mask cylinder are the same. The casting cylinder may be a hollow cylinder with an inner diameter that is larger than the outer diameter of the mask cylinder, such that a space is left between the cylinders. This difference in diameters can define the thickness of the outer compliant layer of the mask so that, where $D_{cast}$ is the inner diameter of the casting cylinder and $D_{mask}$ is the outer diameter of the mask cylinder, the thickness T of the compliant layer of the cylindrical mask will be $$T = \frac{D_{cast} - D_{mask}}{2},$$

or half the difference in diameters. The thickness T can be selected as desired for various application specific requirements by using cylinders having the required diameters corresponding to the equation above. Fabrication 300 can also include inserting polymer precursor as indicated at 304 into the space in the casting cylinder that surrounds the outer surface of the mask cylinder. Inserting the polymer precursor can be done, for example, by pouring a liquid or semi-liquid polymer precursor material in through the top of the assembled cylinders into the space between them. Inserting the polymer precursor may be done in other ways, so long as the polymer precursor material is introduced into the space between the cylinders. Preferably, the polymer should substantially fill this space. The method for fabricating a cylindrical mask 300 can also include curing the polymer precursor as indicated at 306 to form a polymer layer. Curing the polymer precursor may involve applying UV radiation, heat, or other curing treatment to the assembly to harden the polymer. Once the polymer is cured, the method 300 may further include removing the casting cylinder, as indicated at 308, leaving behind a cylindrical mask having a compliant outer layer corresponding to the cured polymer. The method 300 may also include patterning the polymer, and this can be accomplished, for example, by patterning the outer surface of the compliant layer after the removing the cast or by using patterned cylinders in the fabrication process so that patterning the polymer is integrated into the other fabrication steps.

It is noted that although the casting cylinder is shown as being assembled outside and around the mask cylinder, the reverse configuration is also possible. In such an implementation, the outer surface of the casting cylinder could be patterned and a negative of the pattern on the outer surface of the casting cylinder would be transferred to a polymer material on the inside surface of the mask cylinder when the casting cylinder is removed.

It is noted that removing the casting cylinder can be performed in a variety of ways. By way of example and not by way of limitation, the casting cylinder can be cut using a saw, a laser, wet or dry etching, or other means. When cutting the casting cylinder, care should be taken not to damage the polymer layer underneath. If a laser is used to cut the casting cylinder, a special layer could be deposited on the inside surface of the casting cylinder to act as an etch stop layer, and this layer should be reflective to the light that is used to cut the casting cylinder material. Cutting can be performed using one or more cut lines to make it easier to subsequently peel off the casting cylinder from the polymer surface. Once the casting cylinder is cut, it can be peeled off of the polymer surface mechanically. By way of example and not by way of limitation, the casting cylinder may be etched away chemically using etching chemicals that do not also etch away the polymer or mask cylinder within. By way of example and not by way of limitation, the casting cylinder may be treated with a low friction coating or other release coating prior to assembly so that, after the curing the casting cylinder can be slid off the polymer surface. By way of example and not by way of limitation, if the casting cylinder's coefficient of thermal expansion is larger than the polymer's, the casting cylinder could be heated to expand the casting cylinder and slide it off (if the polymer can withstand such temperatures). By way of example and not by way of limitation, the casting cylinder may be treated with a uniform coating, which can be dissolved after curing the polymer, and the casting cylinder can be slid off the polymer surface. The casting cylinder may also be removed by other means, and such other means of removal are within the scope of the present invention. Accordingly, the scope of the present invention is not to be limited to any specific method of removal unless explicitly recited in the claims.

Turning to FIG. 4, details of an example of an assembly apparatus according to embodiments of the present invention is depicted. In FIG. 4A, an entire assembly apparatus 400 is depicted that can be used to fabricate a seamless cylindrical mask according to embodiments of the present invention. Apparatus 400 can include plates 402 held together by a pin 406. The plates 402 can be held together at opposing ends of the cylinders (not pictured), and pin 406 preferably lines up with the axes of the cylinders. By way of example, the first plate 402a can be oriented as a top plate during assembly and the second plate 402b can be oriented as a bottom plate. The first plate 402a can further include holes to permit a polymer to be poured through it and into a space between the cylinders. The plates can also include grooves 410 that align with the placement of the sidewalls of the mask cylinder and casting cylinder to facilitate holding them in place.

Figure 4A:
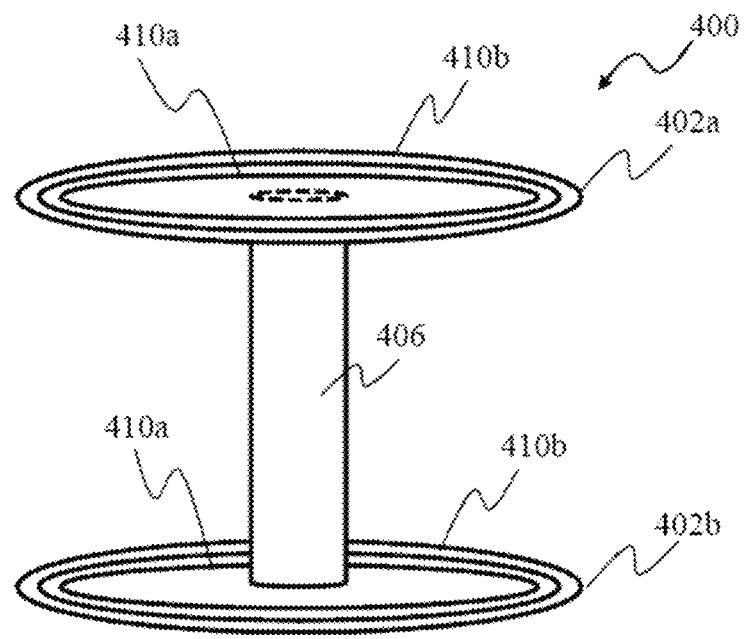
FIGS. 4A-4D illustrate an assembly apparatus according to embodiments of the present invention.
Figure 4B:
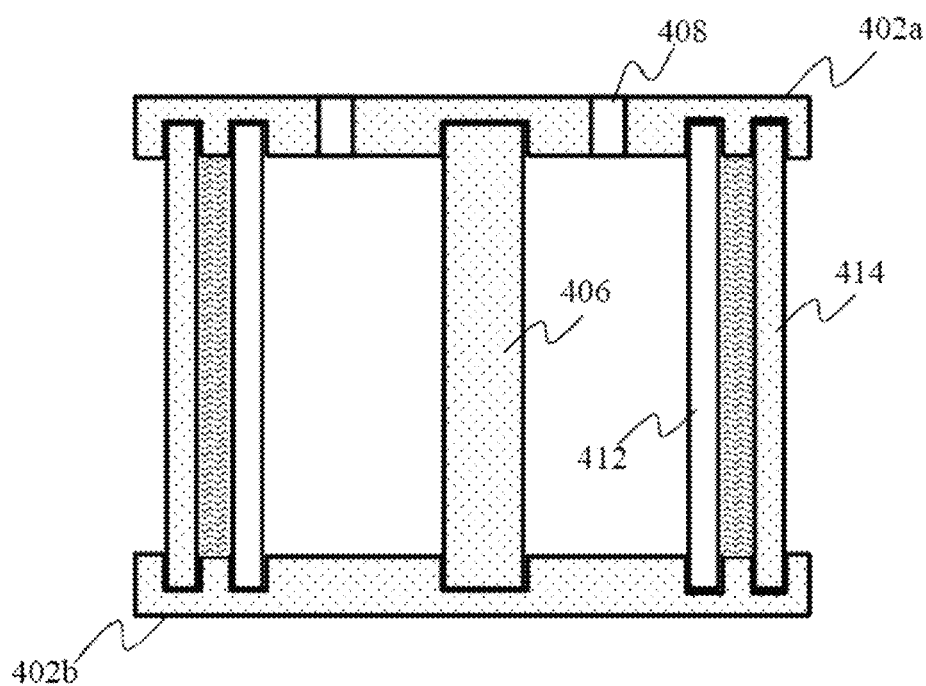
Figure 4C:
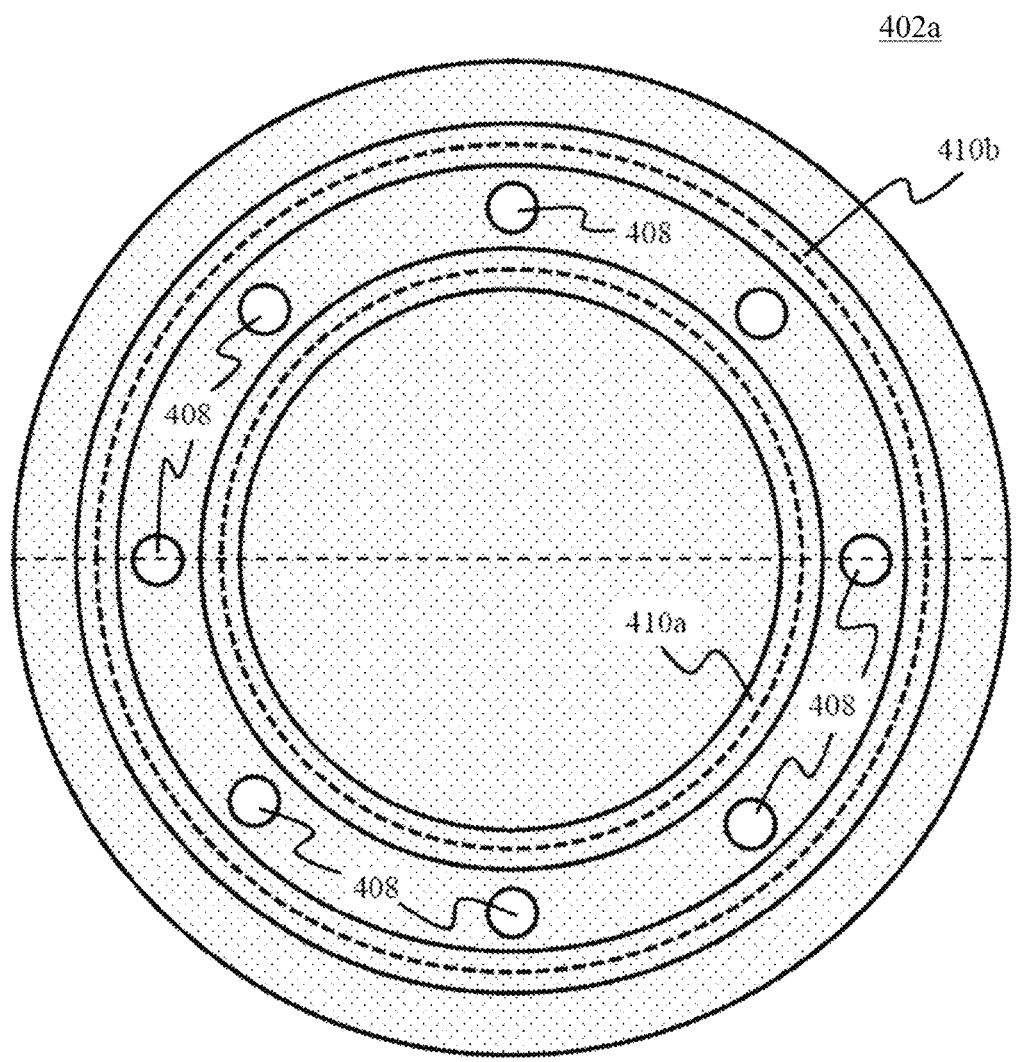

FIG. 4C depicts a top view of a first plate 402a according to an embodiment of the present invention. The placement of holes 408 can correspond to the space inside of the casting cylinder surrounding the mask cylinder. First grooves 410a can be aligned with a mask cylinder 412 and second grooves 410b can be aligned with a casting cylinder 414 during fabrication of a cylindrical mask in embodiments of the present invention, as shown in FIG. 4C. In the embodiment shown in FIGS. 4B-4C it can be seen that holes 408 are positioned between the grooves 410a and 410b where the surfaces of the mask cylinder 412 and casting cylinder 414 would line up, in order to better facilitate pouring the polymer precursor 416 into the space between the two cylinders. It is noted that holes 408 can be designed in any of a variety of shapes, patterns, numbers of holes, etc., that permit the polymer precursor 416 to be inserted through the assembly apparatus, and the holes shown in FIG. 4C are provided for illustration purposes only. It is further noted that although circular plates are generally depicted, other shapes may be used, and the plates shown in the figures are for illustration purposes only.

Figure 4D:
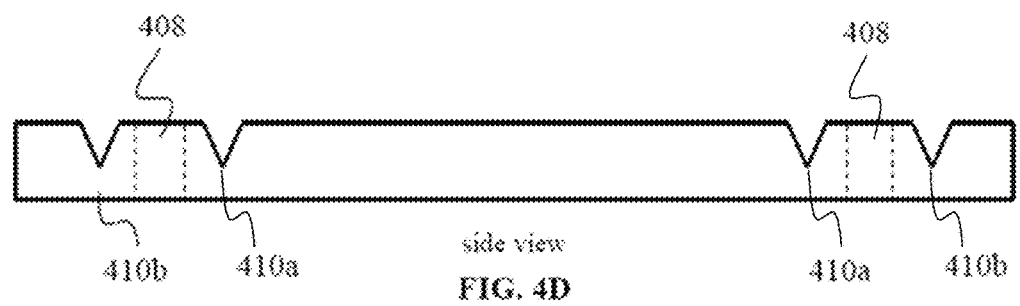

FIG. 4D depicts a plan view of plate 402 according to an embodiment of the present invention. Plate 402 can include grooves 410 to enable the apparatus 400 to hold the cylinders in place during fabrication of a cylindrical mask. Plate 402 can include first grooves 410a aligned with a mask cylinder and second grooves 410b aligned with a casting cylinder during fabrication of a cylindrical mask in embodiments of the present invention. It is noted that grooves 410 can be designed in any of a variety of shapes and patterns depending on the cylinders used to fabricate the cylindrical mask, and the grooves shown in the figures are provided for descriptive purposes only. It is also noted that both a first plate 402a and a second plate 402b can have grooves for holding the alignment of the cylinders in place such as are shown in FIGS. 4A-4D.

Turning to FIGS. 5A-5D, a process flow of fabricating a cylindrical mask is depicted according to embodiments of the present invention. In FIG. 5A, a casting cylinder 504 is coaxially assembled around a mask cylinder 502 to create assembly 506 using an assembly apparatus that holds the cylinders in place and aligns their center axes. In FIG. 5A, the fixture includes a first plate 508a, a second plate 508b, and a pin 510 that can attach to the plates 508 to hold them together at opposing ends of cylinders 502 and 504. The cylinders 502 and 504 can be made from a variety of materials, including, for example, glass, metal, polymer, or other materials.

The mask cylinder, 502, is preferably made of a material that is transparent to UV or other radiation used in the photolithography process employing the Cylinder Mask. Examples of materials for the mask cylinder 502 include fused silica. The casting cylinder 504 is preferably made from a material that is dimensionally stable for successful casting and is also amenable to the removal process, e.g., as described above. The casting cylinder may be transparent to UV or other radiation, but does not have to be so configured in all embodiments.

The inner surface of the casting cylinder 504 may include a mask pattern that corresponds to a desired pattern for the outer surface of the cylindrical mask's compliant layer so that the polymer is patterned during the casting process depicted in FIG. 5. Likewise, the outer surface of the mask cylinder 502 may include a mask pattern for the inner surface of the cylindrical mask's compliant layer. Alternatively, the surfaces of the cylinders 502 and 504 may have no patterns, and the outer surface of the polymer may be patterned by various lithography methods after the compliant layer is formed. In FIG. 5B, a liquid polymer 512 is inserted into the space between the cylinders, between the inner surface of the casting cylinder 504 and the outer surface of the mask cylinder 502. By way of example, inserting polymer precursor 512 can be accomplished by pouring it on the top of the assembly 506 through the fixture, through openings 514 left in top plate 508a and into a space inside of the casting cylinder that surrounds the mask cylinder. In FIG. 5C, the polymer is cured, e.g., by applying UV radiation, temperature treatment, or other curing means 516 to the assembly 506. In FIG. 5D, the casting cylinder 504 is removed from the cured polymer 518, leaving behind cylindrical mask 520 with the cured polymer 518 as a compliant outer layer. If patterned cylinders were not used in the fabrication process, the process of FIG. 5 can further include patterning the outer surface of the compliant outer layer 518 with a desired mask pattern after removing the casting cylinder 504.

It is noted that a pattern should be formed on a surface of the polymer, preferably the outer surface for contact lithography, so that the cylindrical mask may be used to transfer a pattern onto a substrate. In embodiments of the present invention, the outer surface of the polymer may be patterned by a variety of means. In embodiments of the present invention, a mask pattern may applied to the inner surface of the casting cylinder prior to filling the cast with a liquid polymer, such that the mask pattern is transferred to the outer surface of the polymer during casting on the mask cylinder. In other embodiments, the outer surface of the polymer may be patterned after removal of the casting cylinder. Regardless of the method of patterning chosen, care should be taken to avoid stitching errors when forming the mask pattern so that this pattern is also seamless. Accordingly, it is preferable that cylindrical masks of embodiments of the present invention include not only a seamless compliant layer, but also a seamless pattern on a surface of the compliant layer.

It is noted that patterning the inner surface of the casting cylinder or the outer surface of the mask cylinder can be done using a variety of techniques according to embodiments of the present invention. For example, the inner or outer surface of a cylinder may be patterned by successively imprinting it with a smaller master mask, as described in SECTION III of this description and in commonly-assigned, co-pending application No. 61/641,650, filed May 2, 2012, the entire disclosure of which is herein incorporated by reference. As another example, a cylinder surface may be patterned using any of a variety of known techniques, including nanoimprint lithography, nanocontact printing, photolithography, etc. As another example, the cylinder surface can be patterned using an anodization process. This can be accomplished, for example, by using a casting cylinder made of aluminum. An aluminum surface for anodization may alternatively be provided, for example, by depositing an aluminum layer on a surface of a cylinder. A nanoporous surface can then be created on the aluminum surface using an anodization process. As another example, patterning the inner surface can be performed by self-assembly of nanoparticles or nanospheres. Nanoparticles or nanospheres can be deposited from suspension using dipping methods, spraying methods, or other methods. Upon drying, cylinder material can be etched using these nanoparticles or nanospheres as an etch mask, then removing or etching away such etch mask.

Patterning the polymer on the outer surface of the cylindrical mask, after removal of the casting cylinder, can be done using a variety of techniques according to embodiments of the present invention. For example, the outer surface of the polymer may be patterned by successively imprinting it with a smaller master mask, as described in SECTION III of this description and in commonly-assigned, co-pending application No. 61/641,650, mentioned above. As another example, the outer surface of the polymer may be patterned using any of a variety of known techniques, including nanoimprint lithography, nanocontact printing, photolithography, nanosphere lithography, self-assembly, interference lithography, anodic aluminum oxidation, and the like.

It is also noted that the compliant layer of the cylindrical mask is not limited to a single polymer layer, but can include multiple layers of polymer having different properties. Embodiments of the present invention can include forming a two layer polymer for the compliant outer layer of a cylindrical mask. The outermost layer of the two layer polymer can be a harder layer having a higher durability than a softer, innermost polymer layer, thereby allowing patterning of higher resolution or higher aspect ratio nanostructures than can be done with just a soft polymer layer. The inner surface of the casting cylinder can be pretreated with a release coating to facilitate its removal from the outermost polymer layer at the end of fabrication. Forming a two layer polymer can involve depositing liquid polymer of the outermost layer on an inner patterned surface of a casting cylinder. For a two-layer polymer, the outer surface may be patterned after removal of the casting cylinder (instead of patterning the inside of the casting cylinder), in the same manner as a single layer cushioning material. The hard polymer layer can then be cured, for example, by temperature treatment, UV radiation, or other means. After curing, the inner surface of this hard polymer layer can be surface treated to promote adhesion to the other, softer, innermost polymer layer. Surface treatment can be done, for example, by plasma treatment, corona discharge, deposition of adhesion coating, or other means. A softer, innermost polymer layer can then be formed in the same manner as described above for a single layer polymer. It is also noted that a multilayered cylindrical mask can be formed by successively repeating the casting process described herein by casting a new polymer layer on the outer surface of a previously manufactured polymer layer. In this case, a larger casting cylinder should be used each time, after the previous casting cylinder is removed, in order to leave space for the new polymer layer between the outer surface of the previously manufactured polymer layer and the inner surface of the new casting cylinder.

In embodiments that use two or more polymer layers it is desirable that the optical index of both the material covering the prior pattern and the prior pattern are index matched. Also, it is desirable that the photolithography tool that uses the resulting mask be configured to accommodate masks with increasing diameters.

Turning to FIG. 6, a more detailed process flow for forming a cylindrical mask having a two-layer polymer as its outer compliant layer is depicted according to an embodiment of the present invention. By way of example, fabricating a cylindrical mask having a compliant outer layer that is a two layer polymer can include patterning the inner surface of a casting cylinder 602, as depicted in FIG. 6A. The patterned inner surface can then be treated with a release coating 604 to facilitate subsequent release of the casting cylinder from the outer surface of the outermost polymer layer, as shown in FIG. 6B. In FIG. 6C, a liquid polymer material 606 is deposited on the inner surface of the casting cylinder to form the outermost layer of the multilayered compliant outer laminate.

The polymer may be deposited in accordance with any of a number of known methods. By way of example, and not by way of limitation, the polymer may be deposited by dipping, ultrasonic spraying, microjet or inkjet type dispensing, and possibly dipping combined with spinning.

Polymer material 606 can preferably be a harder polymer, such as h-PDMS as described in Truong, T. T., et al, Soft Lithography Using Acryloxy Perfluoropolyether Composite Stamps. *Langmuir* 2007, 23, (5), 2898-2905, the disclosure of which is herein incorporated by reference. Using a more durable outer layer can permit the patterning of higher resolution or higher aspect ratio nanostructures than can be done with a single layer of polymer as the outer laminate of a cylindrical mask. In FIG. 6D, the outermost polymer layer 606 is cured by UV radiation, temperature treatment, or other curing means 608a. In FIG. 6E, curing can be followed by surface treatment of the inner surface of the outer polymer layer 606 to promote adhesion between the polymer layers, for example by plasma treatment, corona discharge, deposition of adhesion coating, or other means. In FIG. 6F, the casting cylinder 602 having the outer polymer layer 606 on its inner surface is assembled around a mask cylinder 610 using an assembly apparatus having plates 612 held together on opposing ends of the cylinders 602 and 610 by pin 614. In FIG. 6G, liquid polymer 618 is inserted into the casting cylinder by pouring it through holes or openings 620 in the top plate 612a of the apparatus. Liquid polymer 618 can correspond to an inner polymer layer, which can be softer than the outer polymer layer, and liquid polymer 618 is inserted in the space between the inner surface of the casting cylinder 602 and the outer surface of the mask cylinder, and more specifically between the inner surface of the outer polymer layer and the outer surface of the mask cylinder. In FIG. 6H, inner polymer layer 618 is cured by applying curing means 608b, which can be UV radiation, heat, or other means, to the assembly 616. In FIG. 6I, casting cylinder 602 is removed leaving behind cylindrical mask 622 having a compliant outer layer that includes inner polymer layer 618 and outer polymer layer 606 on the outer surface of a mask cylinder 610. Cylindrical mask 622 has a patterned outer surface that corresponds to the mask pattern applied to the inner surface of the casting cylinder 602 in the step of FIG. 6A.

It is further noted that the thickness of the polymer layer(s) may vary according to various application specific requirements. The thickness of the polymer layer(s) may preferably be, but is not required to be, in the range of about 0.5 mm-5 mm. Where a two-layer polymer is used, a softer innermost layer may be relatively thick, for example in the range of about 0.5-5 mm, and the harder, outermost, patterned layer may be relatively thin, for example in the range of about 0.5-10 µm.

It is further noted that the polymer used to fabricate the cylindrical mask can be, for example, Polydimethylsiloxane (PDMS) materials, such as Sylgard® 184 of Dow Corning®, h-PDMS ("hard" PDMS), soft-PDMS gel, etc. Where two layers of polymer are used, the soft inner polymer may be a soft-PDMS gel and the outer layer can be Sylgard® 184, for example. As another example, the inner layer may be Sylgard® 184 and the outer layer may be h-PDMS. It is noted that a variety of other elastomeric and polymer materials can be used to fabricate a cylindrical mask and are within the scope of the present invention. Other possible polymers that may be used include optical adhesives, e.g., mercapto-ester based adhesives, a number of which are available from Norland products of Cranbury, N.J., perfluoropolyethers, or other UV curable or heat curable polymers.

It is also noted that the means used for curing polymer in embodiments of the present invention can depend on the type of polymer being cured, the cylinder material used, and other factors. For example, curing can be done thermally, with UV radiation, or other means.

It is further noted that those having ordinary skill in the art can conceive of various modifications to the design of an assembly apparatus or the method of preserving the alignment of cylinders in place without departing from the teachings of the present invention.

It is also noted that the present invention can be used to form various different patterns for various substrates and devices. Patterns can include features of having dimensions of different sizes and can preferably include micro or nanoscaled features, and more preferably have nanoscaled features.

Figure 7:
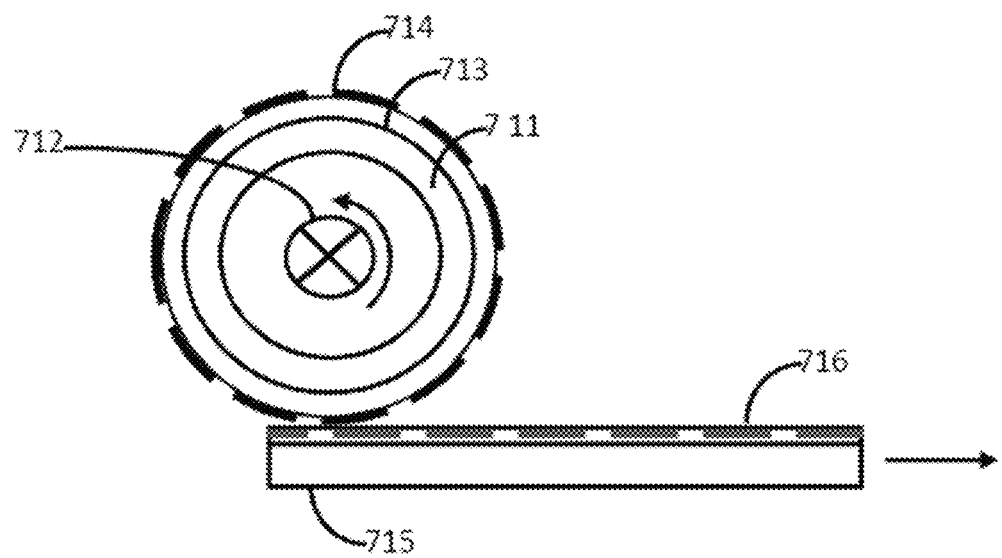
FIG. 7 is a schematic diagram illustrating an example of printing a pattern using rolling mask nanolithography with a cylindrical mask fabricated in accordance with an embodiment of the present invention.

Embodiments of the present invention may be used in conjunction with a type of lithography known as "rolling mask" nanolithography. An example of a "rolling mask" near-field nanolithography system is described, e.g., in commonly-assigned International Patent Application Publication Number WO2009094009, which is incorporated by reference herein. An example of such a system is shown in FIG. 7. The "rolling mask" may be in the form of a glass (e.g. quartz) frame in the shape of hollow cylinder 711, which contains a light source 712. An elastomeric film 713 formed on the outer surface of the cylinder 711 as described above may have a nanopattern 714 fabricated in accordance with the desired pattern to be formed on a substrate 715. The nanopattern 714 can be designed to implement phase-shift exposure, and in such case is fabricated as an array of nanogrooves, posts or columns, or may contain features of arbitrary shape.

By way of example, and not by way of limitation, the nanopattern 714 on the cylinder 711 may have features in the form of parallel lines having a linewidth of about 50 nanometers and a pitch of about 200 nanometers or greater. In general, the linewidth may be in a rage from about 1 nanometer to about 500 nanometers and pitch may range from about 10 nanometers to about 10 microns. Although examples are described herein in which the nanopattern 714 is in the form of regularly parallel lines, the nanopattern may alternatively be a regularly repeating two-dimensional pattern, having regularly-spaced and arbitrarily-shaped spots. Furthermore, the pattern features (lines or arbitrary shapes) may be irregularly spaced.

The nanopattern 714 on the cylinder 711 is brought into a contact with a photosensitive material 716, such as a photoresist that is coated on a substrate 715. The photosensitive material 716 is exposed to radiation from the light source 712 and the pattern 714 on the cylinder 711 is transferred to the photosensitive material 716 at the place where the nanopattern contacts the photosensitive material. The substrate 715 is translated as the cylinder rotates such that the nanopattern 714 remains in contact with the photosensitive material. Depending on the nature of the photosensitive material, portions of the pattern that are exposed to radiation may react with the radiation so that they become removable or non-removable.

By way of example, if the photosensitive material is a type of photoresist known as a positive resist, the portion of the material that is exposed to light becomes soluble to a developer and the portion of the material that is unexposed remains insoluble to the developer. By way of counterexample, if the photosensitive material is a type of photoresist known as a negative resist, the portion of the material that is exposed to light becomes insoluble to a developer and the unexposed portion of the material is dissolved by the photoresist.

In certain embodiments of the present invention, the photosensitive material 716 may be exposed by passing the substrate past the cylinder 711 two or more times. For sufficiently small values of the pitch and linewidth, the linear pattern of exposure resulting from one pass is unlikely to line up with each other. As a result, lines from one pass are likely to end up between lines of a previous pass. By careful choice of the pitch, linewidth, and number of passes it is possible to end up with a pattern of lines in the photosensitive material 716 that has a pitch smaller than the pitch of the lines in the pattern 714 on the cylinder 711.

When patterning the polymer, care should be taken to avoid stitching errors in the pattern. Preferably, fabrication of a cylindrical mask in embodiments of the present invention also involves patterning a seamless pattern on a seamless polymer layer. This prevents a seam from being transmitted to a substrate when the cylindrical mask is used to repeatably pattern a substrate, both because the compliant outer layer itself is seamless, and because the pattern contained on a surface of the compliant layer is also seamless.

It is further noted that embodiments of the invention may be applied to fabrication of rolling masks that are axi-symmetric but not cylindrical, e.g., masks that are frusto-conical in shape. In such cases, a mask element and cast element may be co-axially aligned with plates held together by one or more pins. When co-axially assembled, the facing surfaces of the mask element and the cast element may have similar shapes and the same aspect ratio so that a space of substantially uniform thickness is defined between them.

II. Casting Using Sacrificial Components

Aspects of the disclosure of this SECTION II include methods and apparatus for making rotatable masks using sacrificial casting components. Various other methods and apparatus are also included in this section. Sacrificial casting components in accordance with aspects of this section may be used in conjunction with patterned casting components in order to cast a compliant layer for a rotatable mask, which can provide benefits that may include preserving a patterned casting component for future use without damage to a pattern on its surface. There may be various other advantages to implementations of this section.

It is further noted that this SECTION II has applicability to and can readily be implemented in various aspects of the remaining SECTIONS I and III-VI of this description, including but not limited to any such sections that may involve the use of coaxial casting components and assemblies for making rotatable masks. By way of example and not by way of limitation, various aspects of the disclosure of this SECTION II can readily be implemented in SECTION VI of this description, which involves the use of coaxially assembling components for fabrication of multilayered rotatable masks.

Aspects of the present disclosure describe various patterned component assemblies and methods for fabricating near-field optical lithography masks for "Rolling mask" lithography with the patterned component assemblies. In rolling mask lithography, a cylindrical mask is coated with a polymer, which is patterned with desired features in order to obtain a mask for phase-shift lithography or plasmonic printing. The features that are patterned into the polymer may be patterned through the use of the patterned component assemblies described in the present application. The pattern component may include patterned features that range in size from about 1 nanometer to about 100 microns, preferably from about 10 nanometers to about 1 micron, more preferably from about 50 nanometers to about 500 nanometers. The cylindrical mask may be used to print features ranging in size from about 1 nanometer to about 1000 nanometers, preferably about 10 nanometers to about 500 nanometers, more preferably about 50 nanometers to about 200 nanometer A first aspect of the present disclosure describes a cylindrical master mold assembly comprised of a cylindrical patterned component that has a first diameter and a sacrificial casting component that has a second diameter. The second diameter may be smaller than the first diameter. Patterned features may be formed on the interior surface of the cylindrical patterned component and the sacrificial casting component may be inserted co-axially into the interior of the cylindrical patterned component. A polymer material may then fill the gap between the patterned component and the sacrificial casting component in order to form the cylindrical mask. The sacrificial casting component may be removed once the polymer has been cured. According to certain aspects of the present disclosure, the sacrificial casting component may be fractured in order to allow the cylindrical mask to be removed. Additionally, certain aspects of the present disclosure also provide for the sacrificial casting component to be deformed in order to allow the cylindrical mask to be removed.

According to an additional aspect of the present disclosure a cylindrical master mold assembly may have a cylindrical patterned component that has a first diameter, and a sacrificial casting component that has a second diameter. The second diameter may be larger than the first diameter. The patterned component may have patterned features formed on its exterior surface. The patterned component may be inserted co-axially into the sacrificial casting component. A polymer may then fill the gap between the patterned component and the sacrificial casting component. Once the polymer has cured, the sacrificial casting component may be broken away, leaving the cylindrical mask on the patterned component. The cylindrical mask may then be peeled off of the patterned component.

According to a further aspect, a cylindrical mask may comprise a cylindrical elastomer component with an inner radius and a rigid transparent cylindrical component having an outer radius. A gas retainer is configured to retain a volume of gas between an inner surface of the elastomer component and an outer surface of the rigid transparent cylindrical component. The elastomer component has a major surface with a nanopattern formed in the major surface. The outer radius of the rigid transparent component is sized to fit within the cylindrical elastomer component.

In some implementations, the gas retainer may include two seals. Each seal seals a corresponding end of the volume of gas. Such seals may be in the form of O-rings or gaskets.

In some implementations, the volume of gas may be retained by a bladder disposed between the major surface of the elastomer component and the major surface of the rigid transparent cylindrical component.

In some implementations, the major surface of the cylindrical elastomeric component on which the nanopattern is formed is an outer cylindrical surface.

The authors have described a "Rolling mask" near-field nanolithography system earlier in International Patent Application Publication Number WO2009094009, which is incorporated herein by reference. One of the embodiments is show in FIG. 7. The "rolling mask" consists of a glass (e.g., fused silica) frame in the shape of hollow cylinder 711, which contains a light source 712. An elastomeric cylindrical rolling mask 713 laminated on the outer surface of the cylinder 711 has a nanopattern 714 fabricated in accordance with the desired pattern. The rolling mask 713 is brought into a contact with a substrate 715 coated with radiation-sensitive material 716.

A nanopattern 714 can be designed to implement phase-shift exposure, and in such case is fabricated as an array of nanogrooves, posts or columns, or may contain features of arbitrary shape. Alternatively, nanopattern can be fabricated as an array or pattern of nanometallic islands for plasmonic printing. The nanopattern on the rolling mask can have features ranging in size from about 1 nanometer to about 100 microns, preferably from about 10 nanometers to about 1 micron, more preferably from about 50 nanometers to about 500 nanometers. The rolling mask can be used to print features ranging in size from about 1 nanometer to about 1000 nanometers, preferably about 10 nanometers to about 500 nanometers, more preferably about 50 nanometers to about 200 nanometers.

The nanopattern 714 on the rolling mask 713 may be manufactured with the use of a cylindrical master mold assembly. Aspects of the present disclosure describe the cylindrical master mold assembly and methods for forming the nanopattern on the rolling mask 713.

Figure 8A:
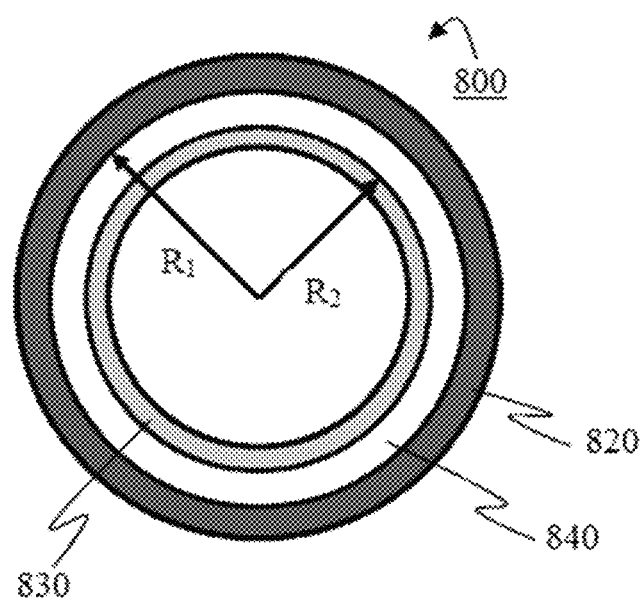
FIG. 8A is an overhead view of a cylindrical master mold assembly comprising a cylindrical patterned component with a sacrificial casting component co-axially inserted inside according to an aspect of the present disclosure.

FIG. 8A is an overhead view of a master mold assembly 800. The master mold assembly 800 comprises a cylindrical patterned component 820 and sacrificial casting component 830. The cylindrical patterned component 820 may have a first radius $R_1$ and the sacrificial casting component 830 may have a second radius $R_2$. According to a first aspect of the present disclosure, $R_1$ may be greater than $R_2$ in order to allow for the sacrificial casting component 830 to be co-axially inserted into the interior of the cylindrical patterned component 820 with a space 840 between them.

Figure 8B:
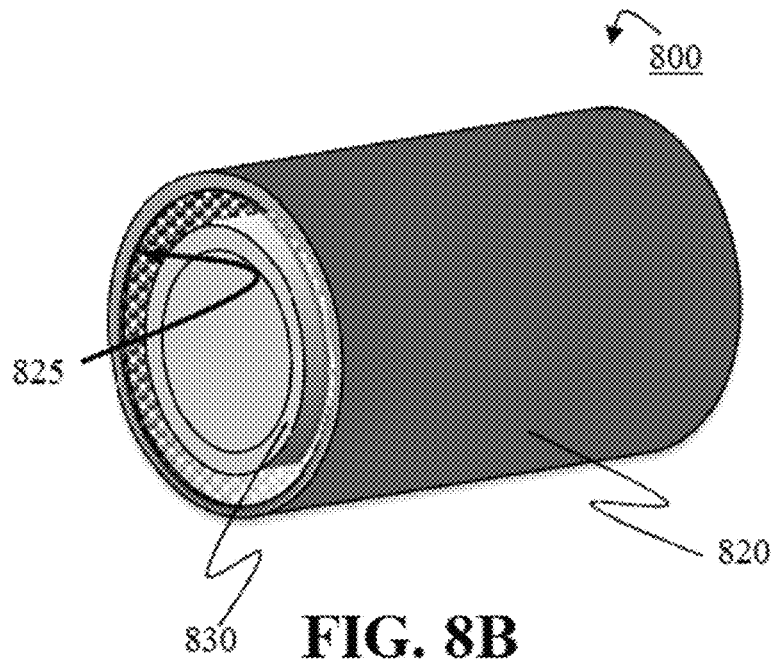
FIG. 8B is a perspective view of a cylindrical master mold assembly shown in FIG. 2A.

The patterned component 820 may be made from a material that is transparent to optical radiation, such as infrared, visible, and/or ultraviolet wavelengths. By way of example, and not by way of limitation, the cylinder may be a glass such as fused silica. It is noted that fused silica is commonly referred to as "quartz" by those in the semiconductor fabrication industry. Although quartz is common parlance, "fused silica" is a better term. Technically, quartz is crystalline and fused silica is amorphous. As may be seen in FIG. 8B, the interior surface of the patterned component 820 may be patterned with the desired pattern 825 that will be used to form the nanopattern 714 on the cylindrical mask 713. By way of example, and not by way of limitation, the pattern 825 may be formed with the use of structured porous mask or a self-assembled monolayer (SAM) mask in conjunction with photolithography techniques described in SECTION IV of this description and in commonly owned U.S. patent application Ser. No. 13/756,348, entitled "CYLINDRICAL MASTER MOLD AND METHOD OF FABRICATION" filed Jan. 31, 2013, and incorporated by reference herein in its entirety.

The sacrificial casting component 830 should be able to be removed after the cylindrical rolling mask 713 has been cured without damaging the nanopattern 714. According to aspects of the present disclosure, the sacrificial casting component 830 may be a thin walled cylinder that is formed from a material that is easily fractured. By way of example, and not by way of limitation, the material may be glass, sugar, or an aromatic hydrocarbon resin, such as Piccotex™ or an aromatic styrene hydrocarbon resin, such as Piccolastic™. Piccotex™ and Piccolastic™ are trademarks of Eastman Chemical Company of Kingsport, Tenn. By way of example, and not by way of limitation, the sacrificial casting component 830 may be approximately 1 to 10 mm thick, or in any thickness range encompassed therein, e.g., 2 to 4 mm thick. The nanopattern 714 of the cylindrical mask 713 is not located on the surface of the sacrificial casting component 830, and therefore the nanopattern 714 is not susceptible to damage during the removal. According to additional aspects of the present disclosure, the sacrificial casting component 830 may be made from a material that is dissolved by a solvent that does not harm the patterend component 820 or the cylindrical mask 713. By way of example, a suitable dissolvable material may be a sugar based material and the solvent may be water. Dissolving the sacrificial casting component 830 instead of fracturing may provide additional protection to the nanopattern 714.

According to yet additional aspects of the present disclosure, the casting component 830 may be a thin walled sealed cylinder made from malleable material such as plastic or aluminum. Instead of fracturing the sacrificial casting component 830, the sealed component may be removed by collapsing the component by evacuating the air from inside the cylinder. According to yet another aspect of the present disclosure, the sacrificial casting component 830 may be a pneumatic cylinder made of an elastic material. Examples of elastic materials that may be suitable for a pneumatic cylinder include, but are not limited to plastic, polyethylene, polytetrafluoroethylene (PTFE), which is sold under the name Teflon®, which is a registered trademark of E. I. du Pont de Nemours and Company of Wilmington, Del. During the molding process, the sacrificial casting component 830 may be inflated to form a cylinder and once the cylindrical mask 713 has cured, the casting component 830 may be deflated in order to be removed without damaging the cylindrical mask. In some implementations, such a pneumatic cylinder may be reusable or disposable depending, e.g., on whether it is relatively inexpensive to make and easy to clean.

Figure 9:
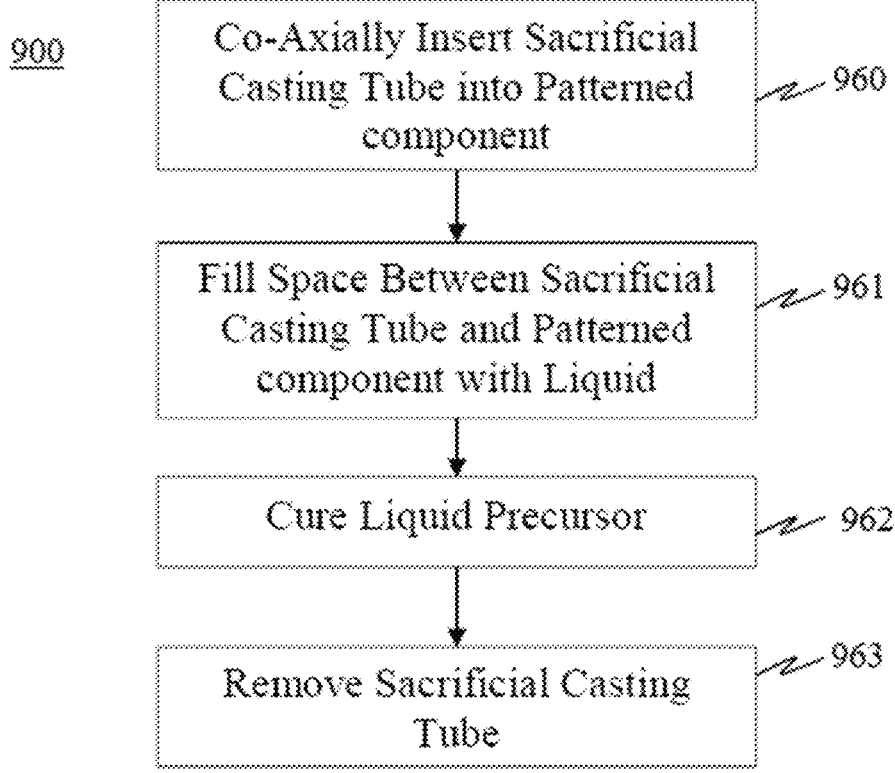
FIG. 9 is a block diagram of instructions that describe a method for forming a cylindrical mask with cylindrical master mold assembly according to aspects of the present disclosure.

As in FIG. 9, aspects of the present disclosure describe a process 900 that may use cylindrical master mold assemblies 800 to form cylindrical masks 713. First, at 960 a sacrificial casting component 830 may be co-axially inserted into a cylindrical patterned component 820. Then, the space 840 between the sacrificial casting component 830 and the cylindrical patterned component 820 is filled with a liquid precursor that, when cured, forms an elastomeric material at 961. By way of example, and not by way of limitation, the material may be polydimethylsiloxane (PDMS).

Next, at 962 the liquid precursor is cured to form the elastomeric material that will serve as the cylindrical mask 713. By way of example, the curing process may require exposure to optical radiation. The radiation source may be located co-axially within the master mold assembly 800 when the sacrificial casting component 830 is transparent to the wavelengths of radiation required to cure the liquid precursor. Alternatively, the radiation source may be located outside of the master mold assembly 800 and the exposure may be made through the cylindrical patterned component 820. Once the cylindrical mask 713 has cured, the sacrificial casting component 830 may be removed at 962. By way of example, and not by way of limitation, the casting component 830 may be removed by fracturing, dissolving, deflating, or collapsing.

Figure 10A:
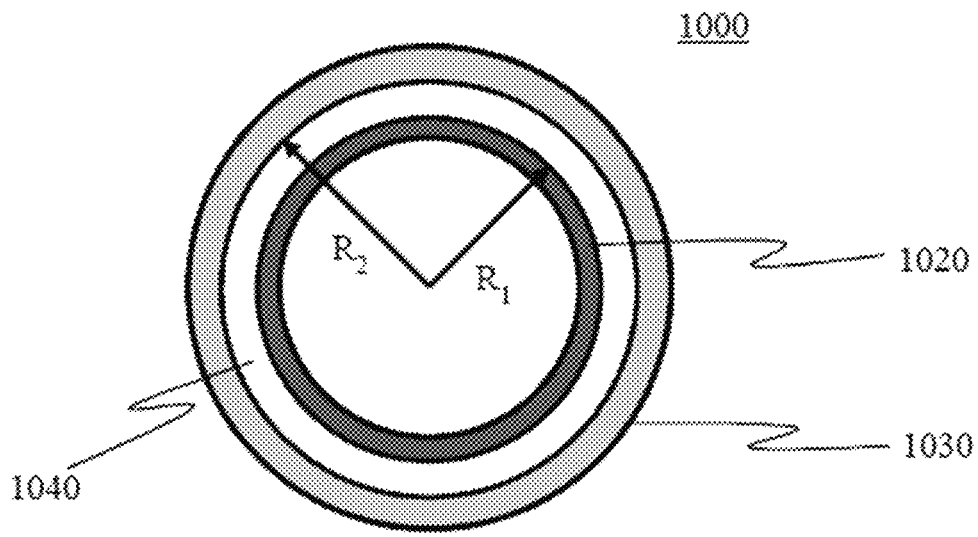
FIG. 10A is an overhead view of a cylindrical master mold assembly comprising a sacrificial casting component with a cylindrical patterned component co-axially inserted inside according to an aspect of the present disclosure.

FIG. 10A is an overhead view of a cylindrical master mold assembly 1000 according to an additional aspect of the present disclosure. As shown, the cylindrical patterned component 1020 may have a first radius $R_1$ and the sacrificial casting component 1030 may have a second radius $R_2$ that is larger than $R_1$. The cylindrical master mold assembly 1000 is formed by co-axially inserting the cylindrical patterned component 1020 inside of the sacrificial casting component 1030 leaving an empty space 1040 between the two components.

Figure 10B:
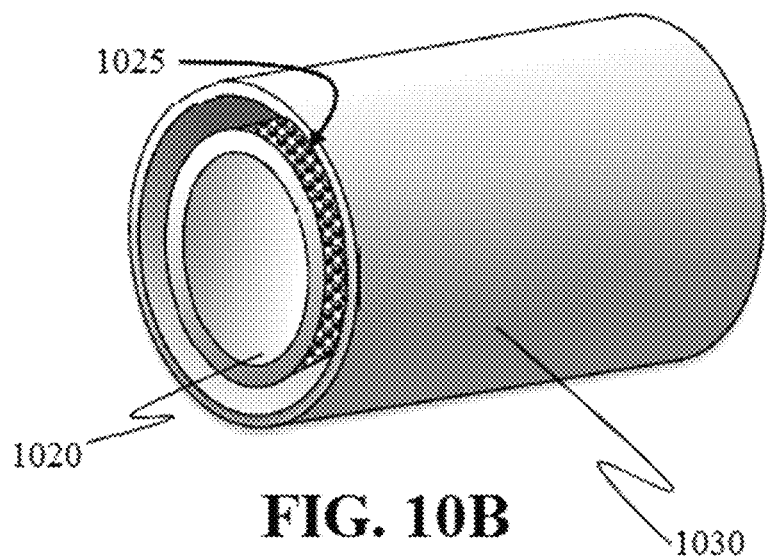
FIG. 10B is a perspective view of the cylindrical master mold assembly shown in FIG. 4A.

The patterned component 1020 may be made from a material that is transparent to optical radiation, such as infrared, visible and/or ultraviolet wavelengths. By way of example, and not by way of limitation, the cylinder may be a glass, such as quartz. As shown in the perspective view in FIG. 10B, a pattern 1025 is formed on the exterior surface of the cylindrical patterned component 1020. By way of example, and not by way of limitation, the pattern 1025 may be formed through the use of nanolithography techniques such as, but not limited to e-beam direct writing, Deep UV lithography, nanosphere lithography, nanoimprint lithography, near-field phase shift lithography, and plasmonic lithography.

The sacrificial casting component 1030 may be removed after the cylindrical rolling mask 713 has been cured without damaging the nanopattern 714. According to aspects of the present disclosure, the sacrificial casting component 1030 may be a thin walled cylinder that is formed from a material that is easily fractured. By way of example, and not by way of limitation, the material may be glass. The nanopattern 714 of the cylindrical mask 713 is not located on the surface of the sacrificial casting component 1030, and therefore the nanopattern 714 is not susceptible to damage during the removal. According to additional aspects of the present disclosure, the sacrificial casting component 1030 may be made from a material that is dissolved by a solvent that does not harm the patterend component 1020 or the cylindrical mask 713. By way of example, a suitable dissolvable material may be a sugar based material and the solvent may be water. Dissolving the sacrificial casting component 1030 instead of fracturing may provide additional protection to the nanopattern 714.

Figure 10C:
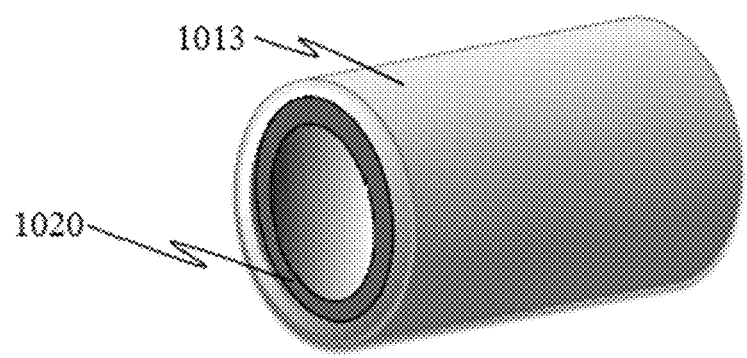
FIGS. 10C-10E depict how the cylindrical mask may be removed from the cylindrical patterned component according to aspects of the present disclosure.
Figure 10D:
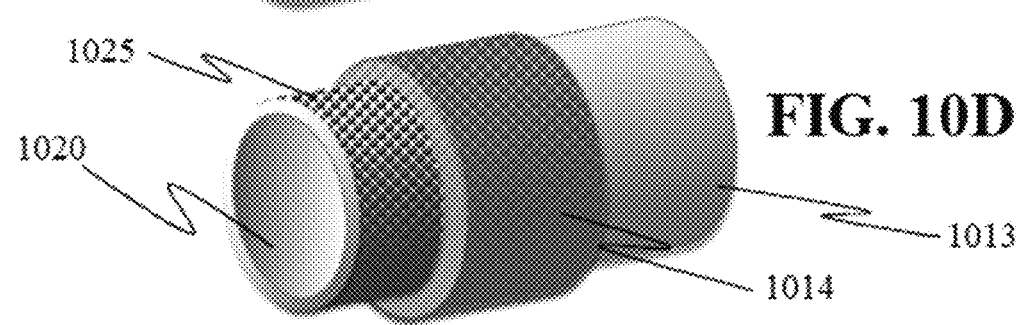
Figure 10E:
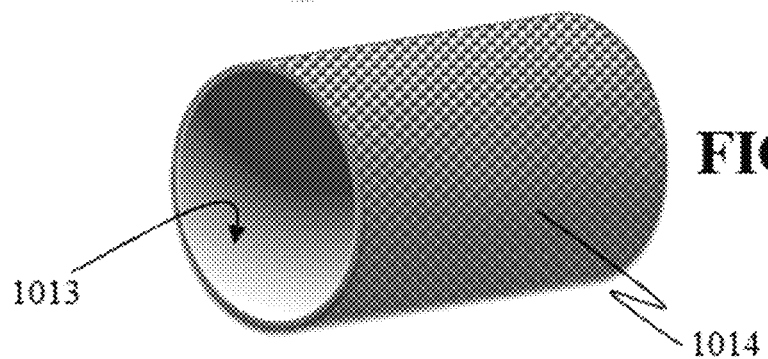

After the sacrificial casting component 1030 has been removed, the cylindrical mask 713 remains on the patterned component 1020 as shown in FIG. 10C. In order to remove the cylindrical mask 713 from the patterned component 1020 the cylindrical mask 713 may be peeled back against itself. Starting from one end of the patterned component 1020, the cylindrical mask is pulled back over itself in a direction parallel to the axis of the patterned component 1020, such that the interior surface where the nanopattern 714 was formed is revealed. FIG. 10D depicts the removal process at a point where the cylindrical mask 713 has been partially removed. In order to fold back on itself during the removal process, the cylindrical mask 713 should be relatively thin, e.g., 4 millimeters thick or thinner. As such, the difference between the first and second radii should preferably be 4 millimeters or less. Once the entire cylindrical mask 713 has been removed from the patterned component 1020, it will have been turned completely inside out, revealing the nanopattern 714 on the exterior surface as shown in FIG. 10E.

Figure 11:
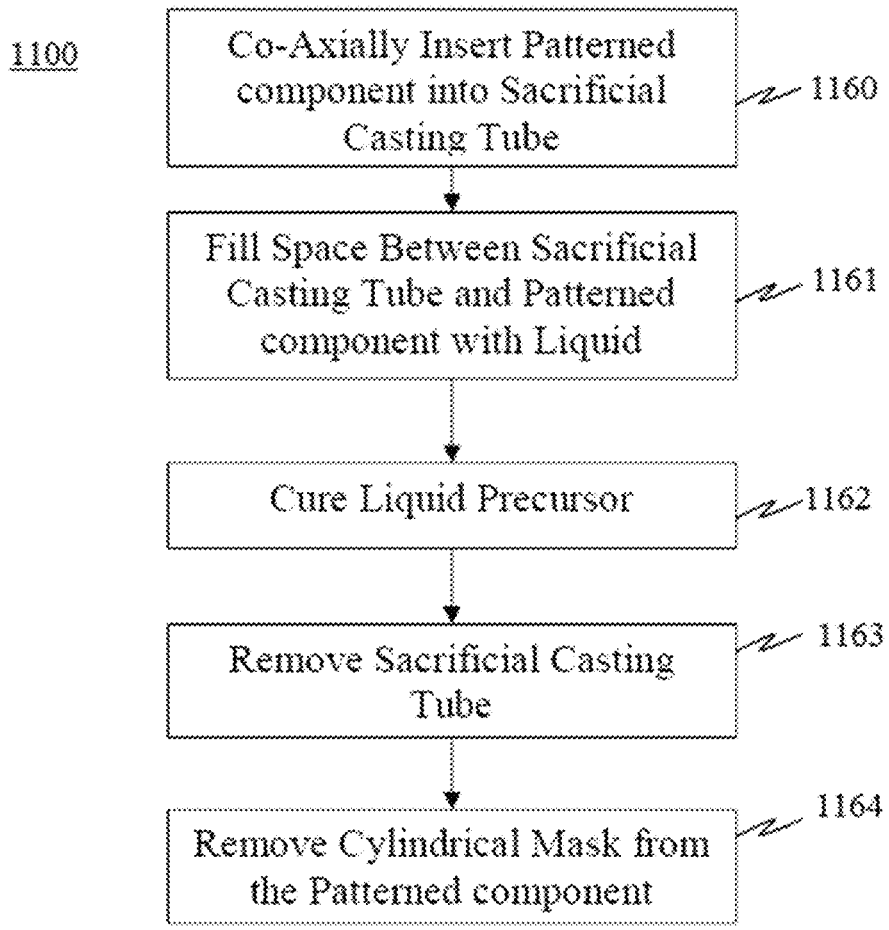
FIG. 11 a block diagram of instructions that describe a method for forming a cylindrical mask with cylindrical master mold assembly according to aspects of the present disclosure.

As in FIG. 11, aspects of the present disclosure describe a process 1100 that may use cylindrical master mold assemblies 1000 to form cylindrical masks 713. First, at 1160 a cylindrical patterned component 1020 is co-axially inserted into a sacrificial casting component 1030. Then, the space 1040 between the sacrificial casting component 1030 and the cylindrical patterned component 1020 is filled with a liquid precursor that, when cured, forms an elastomeric material at 1161. By way of example, and not by way of limitation, the material may be polydimethylsiloxane (PDMS).

Next, at 1162 the liquid precursor is cured to form the elastomeric material that will serve as the cylindrical mask 713. By way of example, the curing process may require exposure to optical radiation. The radiation source may be located co-axially within the master mold assembly 1000. Alternatively, the radiation source may be located outside of the master mold assembly 1000 and the exposure may be made through the sacrificial casting component 1030 if the casting component 1030 is transparent to the wavelengths of radiation required to cure the liquid precursor. Once the cylindrical mask 713 has cured, the sacrificial casting component 1030 may be removed at 1163. By way of example, and not by way of limitation, the sacrificial casting component 1030 may be removed by fracturing and/or dissolving. Finally, at 1164 the cylindrical mask is pulled back over itself in a direction parallel to the axis of the patterned component 1020, such that the interior surface where the nanopattern 714 was formed is revealed.

Figure 12A:
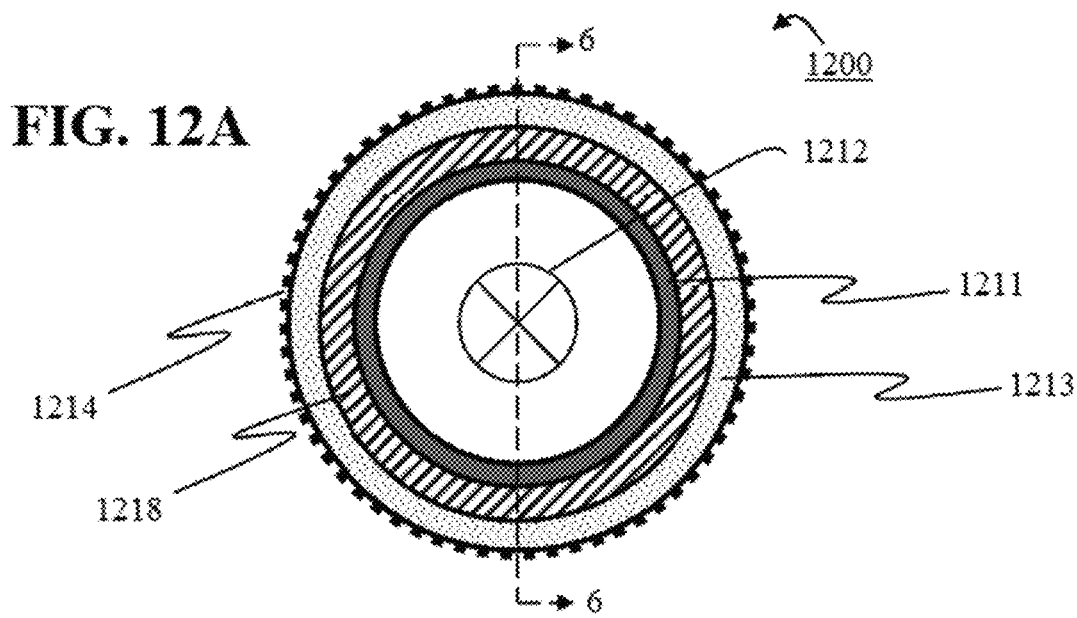
FIGS. 12A-12C depict cylindrical masks where a gas retainer is formed between the elastomeric cylinder and the rigid transparent cylinder according to aspects of the present disclosure.

FIG. 12A depicts a cylindrical mask 1200 according to an additional aspect of the present disclosure. Cylindrical mask 1200 is substantially similar to the cylindrical mask depicted in FIG. 7, with the addition of a gas retainer 1218 located between the elastomeric rolling mask 1213 and the rigid hollow cylinder 1211. By way of example, and not by way of limitation, the elastomeric rolling mask 1213 may have a patterned surface 1214 and may be a made in substantially the same manner as described in processes 900 or 1100. The rigid hollow cylinder may also be transparent to optical radiation. By way of example, and not by way of limitation, the hollow cylinder may be a glass such as fused silica. A light source 1212 may be placed inside hollow cylinder 1211. The gas retainer 1218 retains a volume of gas 1217 between the outer surface of the cylinder 1211 and the inner surface of the elastomeric mask 1213. The gas retainer 1218 may be pressurized in order to provide an additional tunable source of compliance for the elastomeric rolling mask 1213. By way of example, and not by way of limitation, the gas retainer 1218 may be formed by a pair of seals or by an inflatable bladder.

Figures 12B, 12C:
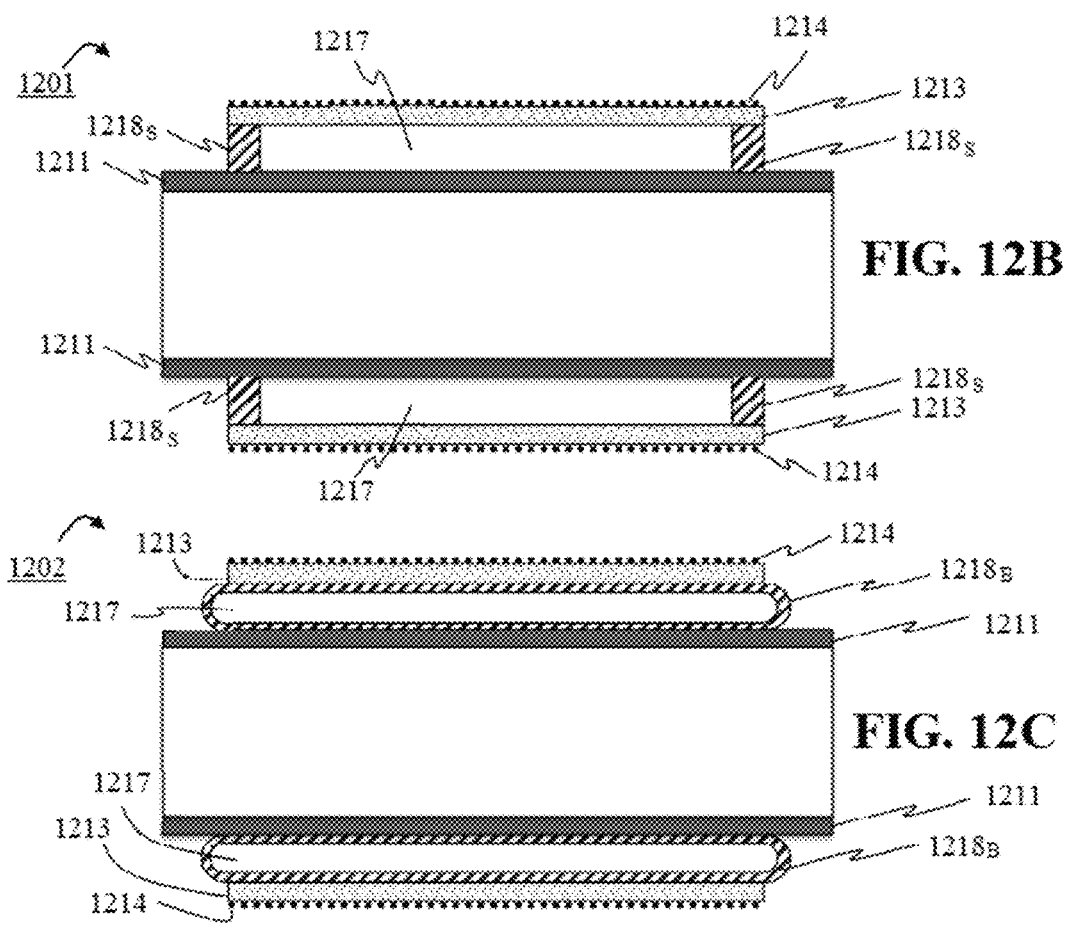

FIG. 12B is a cross sectional view along the line 6-6 shown in FIG. 12A of a cylindrical rolling mask 1201 that depicts an aspect of the present disclosure where the gas retainer 1218 is formed by pair of seals 1218$_S$. Each seal 1218$_S$ may be a hollow cylinder, ring, or torus-like shape, such as, but not limited to an O-ring or gasket. The seals 1218$_S$ may be made of a suitable elastomer material. The elastomeric mask 1213 may then be spaced apart from the rigid hollow cylinder 1211 at each end by a seal 1218$_S$. The inner radius of the elastomeric mask 1213 can be chosen such that the volume of gas 1217 bounded by the interior surface of the elastomeric mask 1213, the seals 1218$_S$ and the rigid outer surface of the rigid hollow cylinder 1211 may be pressurized. When the volume of gas 1217 is pressurized, the elastomeric mask 1213 may be spaced away from the outer surface of the rigid hollow cylinder 1211 by the pressure of the volume of gas 1217 retained between the inner surface of the elastomeric mask 1213 and the outer surface of the cylinder 1211. The cylinder 1211 may optionally include grooves sized and shaped to receive the seals 1218$_S$ and facilitate retaining the seals when the gas in the volume is pressurized.

FIG. 12C is a cross sectional view along the line 6-6 shown in FIG. 12A of a cylindrical rolling mask 1202 that depicts an aspect of the present disclosure where the gas retainer 1218 is formed by a bladder 1218$_B$. The bladder 1218$_B$ may be cylindrical in shape and positioned between the rigid hollow cylinder 1211 and the elastomeric mask 1213. When volume of gas 1217 within the bladder 1218$_B$ is pressurized, the bladder 1218$_B$ supports the elastomeric mask 1213 above the outer surface of the rigid hollow cylinder 1211.

III. Patterning a Larger Area Substrate Using Successive Imprints

Aspects of the disclosure of this SECTION III include methods and apparatus for patterning a larger area master mask using a successive imprinting scheme with a smaller area master mask. Various other methods and apparatus are also included in this section. Successive imprints can be used to pattern a relatively large area substrate for a variety purposes, which can provide benefits that may include minimizing or eliminating the visibility or effect of seams between imprints. Various other advantages of this section will be apparent upon reading this section.

It is further noted that this SECTION III has applicability to and can readily be implemented in various aspects of the remaining SECTIONS I, II, and IV-VI of this description, including but not limited to any such sections that may involve the use of patterned components. By way of example and not by way of limitation, various aspects of the disclosure of this SECTION III can readily be applied to implementations of SECTION V of this description, which involves the use of a rolled laminate having a pattern for making a rotatable mask.

In embodiments of the present invention, a small master mask having a desired pattern can be used to inexpensively pattern a large area substrate. A small master can be successively imprinted onto a large area substrate using a polymer precursor liquid that is polymerized or cured. An array of imprints is formed by the successive imprinting scheme, where each successive imprint overlaps part of a previous imprint so that there is no un-patterned interstitial space. In this manner, the desired pattern of the master is replicated generating a macroscopically continuous pattern whose dimension is limited only by the size of the substrate. The successive imprinting scheme results in a large area substrate having a patterned layer or structured coating with a nearly invisible boundary between the individual imprints, or replicas, of the master.

In embodiments of the present invention, a method of patterning a large area substrate can include imprinting the substrate with a master mask having a pattern, wherein the pattern has a smaller area than the substrate area to be patterned. The method can further include successively repeating the imprinting process until a desired area of the substrate is patterned. Each successive imprint can include depositing a polymer precursor liquid, pressing the polymer precursor liquid between the master mask and the substrate, and polymerizing or curing the polymer precursor liquid such that it becomes a solid material.

It is noted that in embodiments of the present invention, substrates to be patterned can be a variety of shapes, sizes, materials, etc., but should generally be larger than the master mask used to successively imprint the substrate. Master masks can also be a variety of shapes, sizes, materials, etc., and can have patterns of a variety of shapes and sizes, but should generally be smaller than the substrate area to be patterned. In embodiments of the present invention, substrates to be patterned can have a variety of characteristics and, for example, can be flexible, rigid, flat or curved. Likewise, master masks can have a variety of characteristics and, for example, can be flexible or rigid.

In embodiments of the present invention, desired patterns can include features of a variety of different sizes, shapes, and arrangements. A variety of physical or other properties can be imparted to a substrate by using patterns having various features depending on application specific requirements.

Figure 13A:
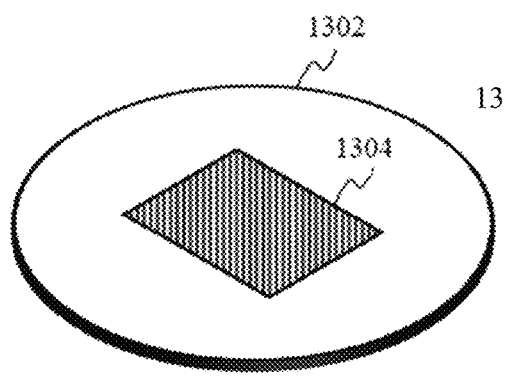
FIG. 13A depicts a master mask according to an embodiment of the present invention.
Figure 13B:
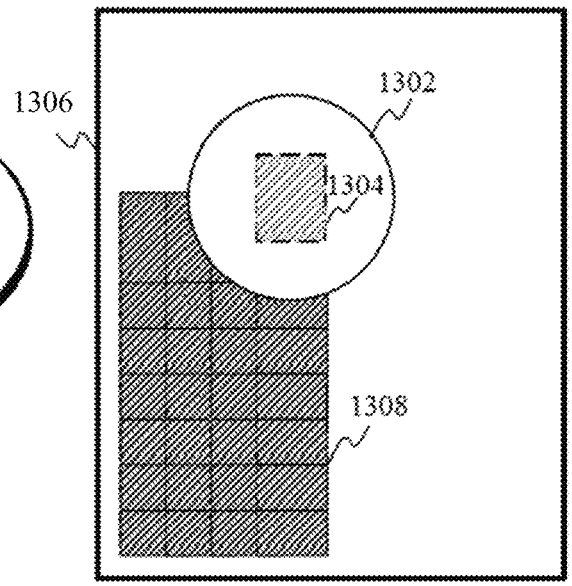
FIG. 13B depicts a master mask being used to pattern a larger area substrate according to an embodiment of the present invention.
Figure 13C:
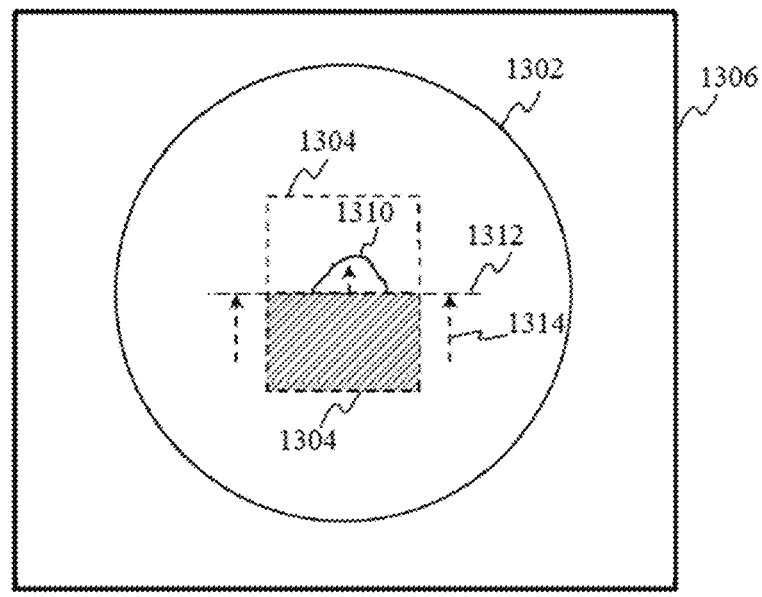
FIG. 13C depicts an individual imprint of larger area substrate using a master mask according to an embodiment of the present invention.

Turning to FIGS. 13A-13C, a master mask and a method of fabricating a larger area substrate with a master mask are depicted according to embodiments of the present invention.

Figure 13D:
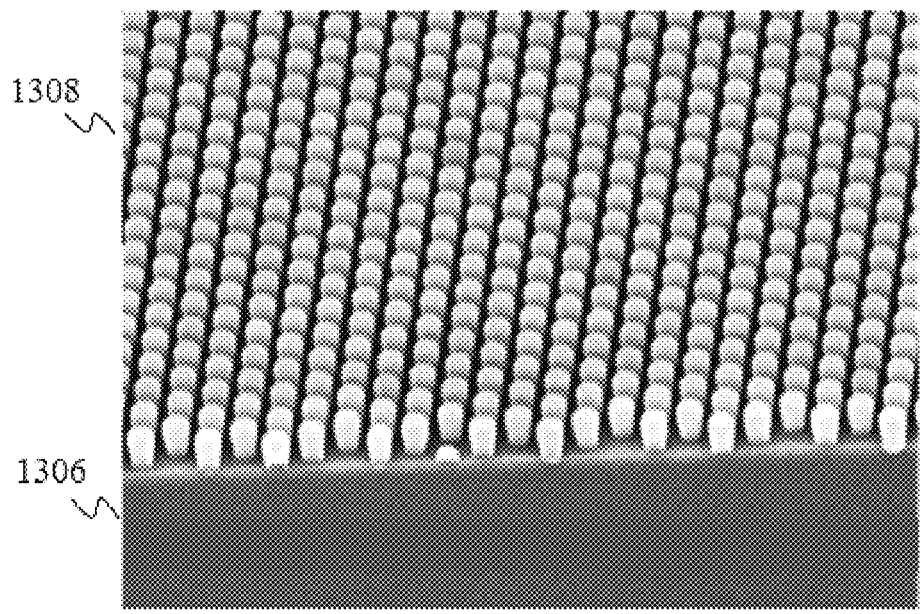
FIGS. 13D-13E depict micrographs of the resulting patterned substrate according to an embodiment of the present invention.
Figure 13E:
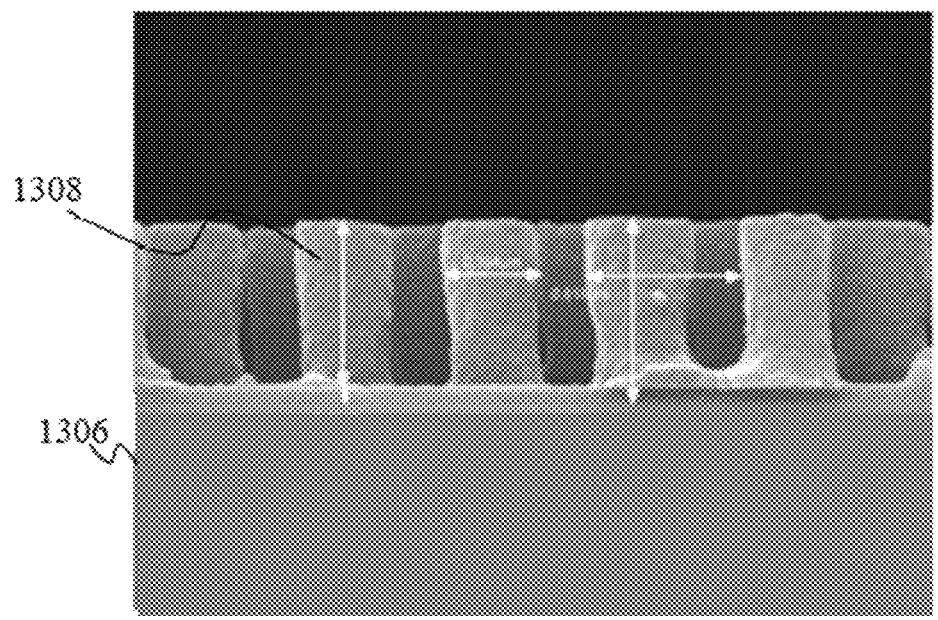

In FIG. 13A, master mask 1302 having pattern 1304 is depicted, which can be used to imprint a larger area substrate by repeatedly imprinting the larger area substrate with the master mask 1302. While the master mask 1302 depicted in FIG. 13A is has a circular shape, and its pattern 1304 covers a rectangular area of the mask, it is noted that both the master mask 1302 and the master pattern 1304 can be a variety of different shapes and sizes in embodiments of the present invention, and the master pattern 1304 can cover all or part of the area of the master mask 1302. Master pattern 1304 should correspond to the desired pattern for a large area substrate, and can vary depending on various application specific requirements. For example, the master pattern 1304 can include a uniform array of posts or uniform array of holes as used in many structured coating applications. It is noted that in structured coating embodiments of the present invention, an array of posts is preferred over an array of holes as experiments have shown that a post array master pattern leads to a lower visibility of seams at the boundaries of successive imprints. By way of example FIGS. 13D and 13E provide a micrograph of an array of posts formed in a photoresist by exposure to UV light through a pattern in a cylindrical mask and developing the exposed resist.

FIG. 13B depicts a master mask 1302 used to imprint a larger area substrate 1306. Master mask 1302 can be used to repeatedly imprint a portion of the substrate 1306 until a desired area of the substrate is patterned. Each successive imprint with the master mask 1302 can overlap part of the previously imprinted portion 1308 of the substrate 1306, and the pattern of the imprint 1308 that is left on the substrate 1306 corresponds to the mask pattern 1304.

FIG. 13C depicts an individual imprint during a successively repeating imprint scheme according to embodiments of the present invention. In FIG. 13C, it can be seen that a polymer precursor liquid 1310 spreads as the liquid is pressed between a master mask 1302 and a substrate 1306. By way of example and not by way of limitation, the polymer precursor liquid 1310 may be a monomer, a polymer, a partially cross-linked polymer, or any mixture of thereof. An imprinting scheme as depicted in FIGS. 13A-13C according to embodiments of the present invention should preferably include a method of controlling the spread of the polymer precursor liquid in order to minimize the presence of air bubbles, fill the features of the master pattern, and prevent the liquid from flowing outside of the border of the mask pattern contained on the master mask and onto an open area of a previously cured imprint. There are a variety of methods that can be used to control the spread of the polymer precursor liquid during each imprint. In the example shown in FIG. 13C, controlling the spread of polymer precursor liquid 1310 includes maintaining a continuous line of pressure along a line of contact 1312 between the master mask 1302 and the substrate 1306. Mechanical pressure can be applied along the contact line 1312 to force the spread of polymer precursor liquid 1310 towards an open area of the substrate 1306 in the direction of pressure 1314 and maintain the liquid 1310 within the boundary of the master pattern 1304. In some embodiments, maintaining a continuous line of pressure can be better facilitated by using a flexible substrate for substrate 1306, thereby creating a more clearly defined line of contact 1312 between the master mask 1302 and the substrate 1306. In other embodiments, maintaining a continuous line of pressure of can be facilitated by using a flexible mask for master mask 1302. In still other embodiments, maintaining a continuous line of pressure can be facilitated by using a curved mask or curved substrate for mask 1302 or substrate 1306, respectively. In still other embodiments, the spread of polymer precursor liquid 1310 can be controlled by other means.

Turning to FIGS. 14A-14G, a process flow of a method of patterning a substrate is depicted according to an embodiment of the present invention. In FIGS. 14A-14G, master mask 1402 is used to pattern the substrate 1404, and master mask 1402 should be smaller than substrate 1404. More specifically, the area of the master pattern 1406 of the mask 1402 should be smaller than the area to be patterned on the substrate 1404, and the master pattern 1406 should correspond to the desired pattern of the larger area substrate 1404. Master mask 1402 is used to pattern the substrate 1404 by successively imprinting the substrate 1404 until it is fully patterned, or at least until a desired area of the substrate 1404 is patterned.

Figure 14A:
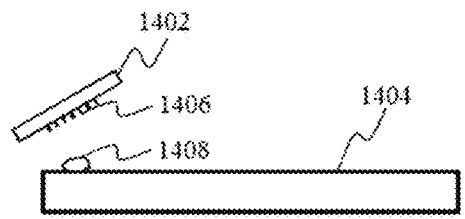
FIGS. 14A-14G depict a process flow of imprinting a large area substrate according to an embodiment of the present invention.

In FIG. 14A, a polymer precursor liquid 1408 is deposited onto a substrate 1404, and the polymer precursor liquid 1408 corresponds to the patterned layer or structured coating of the large area substrate 1404. It is noted that polymer precursor liquid 1408 can be deposited in a variety of ways. For example, in the embodiment shown in FIGS. 14A-14G, polymer precursor liquid 1408 is deposited onto the substrate 1404 as discrete drops for each successive imprint. In other embodiments, polymer precursor liquid 1408 can be deposited onto the master mask 1402. In still other embodiments, polymer precursor liquid 1408 can be deposited continuously through the patterning process as opposed to discrete drops before each imprint. It is noted that the material used for polymer precursor liquid 1408 can vary depending on various application specific requirements. The amount of polymer precursor liquid 1408 that is deposited can vary depending of various application specific requirements, including, for example, the desired thickness of the layer, the size of the desired imprint area, and the feature depth and pitch of the desired pattern to be formed.

Figure 14B:
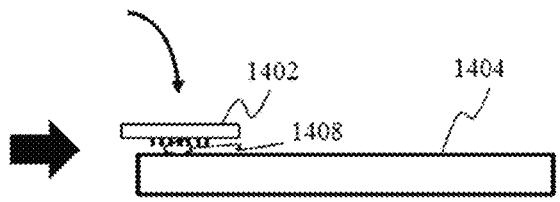

In FIG. 14B, polymer precursor liquid 1408 is pressed between the master mask 1402 and the substrate 1404 in order to transfer the master pattern 1406 to polymer precursor liquid 1408. Pressing the polymer precursor liquid as shown in FIG. 14B preferably should be done with care and using a method of controlling the spread of the polymer precursor liquid in order to minimize air bubbles, fill the features of the master pattern 1406, and maintain the polymer precursor liquid 1408 within the area of the master pattern 1406 during the imprint process. Controlling the spread of the polymer precursor liquid can include, for example, maintaining a continuous line of pressure as depicted in FIG. 13C and described above. In FIG. 14A-14G, pressing the polymer precursor liquid 1408 between the master mask 1402 and the substrate 1404 is depicted as pressing the master mask 1402 against the substrate 1404, but it is noted that the present invention is not limited to such embodiments. In embodiments of the present invention, pressing the polymer precursor liquid between the master mask 1402 and the substrate 1404 can involve pressing the substrate 1404 against the master mask 1402. In other embodiments, pressing the polymer precursor liquid 1408 between the master mask 1402 and the substrate 1404 can be done by still other means, such as by pressing both the master mask 1402 and the substrate 1404 against each other simultaneously.

Figure 14C:
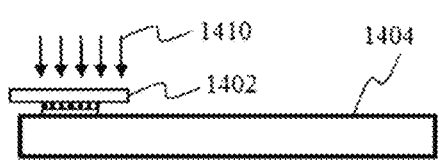

In FIG. 14C, the patterned polymer precursor liquid is cured or polymerized using curing means 1410, which can be a source of UV radiation, heat, or other equivalent means depending on the nature of the polymer precursor liquid, specifically, the mechanism by which the polymer precursor liquid can be cured or polymerized. After the polymer precursor liquid is cured or polymerized, master mask 1402 can be removed and a successive imprint can be formed.

Figure 14D:
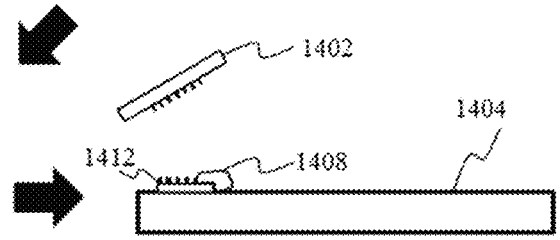

In FIG. 14D, a successive imprint is formed that overlaps part of the previously imprinted and cured portion 1412 by again depositing liquid polymer precursor liquid 1408. To minimize the visibility of the border between successive imprints, part of the polymer precursor liquid should be deposited onto part of the previously imprinted portion 1412 of the substrate 1404, within the area of where the master pattern 1406 will overlap the previously imprinted portion, as depicted in FIG. 14D.

Figure 14E:
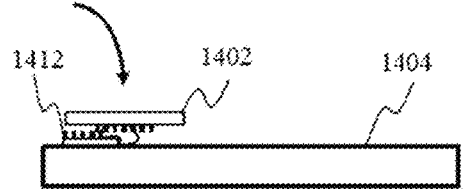

In FIG. 14E, the polymer precursor liquid 1408 is again pressed between the master mask 1402 and the substrate 1404 to transfer the master pattern 1406 onto the polymer precursor liquid and imprint another portion of the substrate 1404. Care should be taken to control the flow of the polymer precursor liquid 1408 and prevent it from flowing onto a portion of the previously cured portion 1412 of the substrate that is beyond the boundary of the master pattern 1406.

Figure 14F:
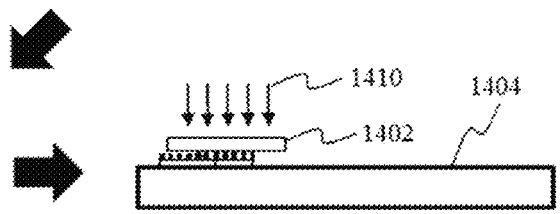
Figure 14G:
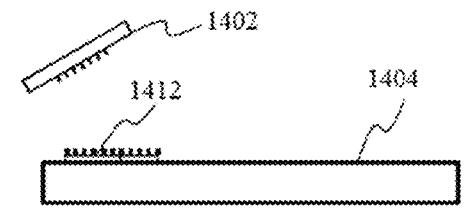

In FIG. 14F, the polymer precursor liquid is again cured using curing means 1410, after curing the master mask 1402 can be removed, leaving behind a larger patterned portion 1412 on the substrate 1404, as shown in FIG. 14G. This process can be successively repeated until the substrate 1404 is fully patterned, or until a desired area of the substrate 1404 is patterned.

After each portion of the substrate is imprinted, the un-patterned area of the substrate 1404 may be cleaned as desired by wet cleaning or dry cleaning processes. By way of example, wet cleaning processes may include use of chemicals e.g., common organic solvents such as acetone, physical removal of the particles and/or plasma cleaning. The selective cleaning process of the un-patterned area may require the use of shadow mask (not shown) to prevent any damage of patterned area. To prevent any contaminations or damages of the patterned area, the patterned area may optionally be selectively treated with hydrophobic silane. In other words, the patterned area may be made hydrophobic and the un-patterend area may be made hydrophilic. By way of example, the cleaning process may include hydrophobic surface treatment (of both the patterned and un-patterned area) followed by plasma treatment of the un-patterned area and the region of the patterned area that will be overlapped during the next imprint.

In an additional embodiment a checkered board type pattern of patterned and unpatented areas are generated on a substrate and treated with hydrophobic silane. Then the substrate is plasma treated using shadow mask so that only the unpattern surface of the substrate and the surface where the new imprint is to be overlapped are exposed to plasma. In the second step all the un-patterned area of the substrate is then imprinted.

Figure 15A:
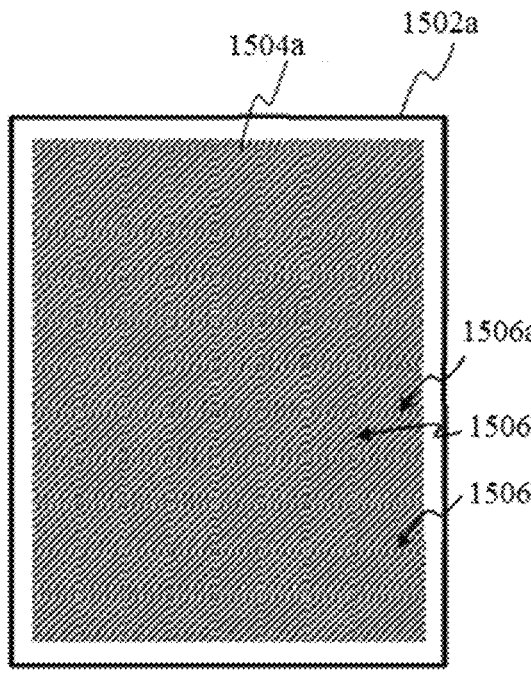
FIGS. 15A-15C depict examples of patterned large area substrates according to embodiments of the present invention.
Figure 15B:
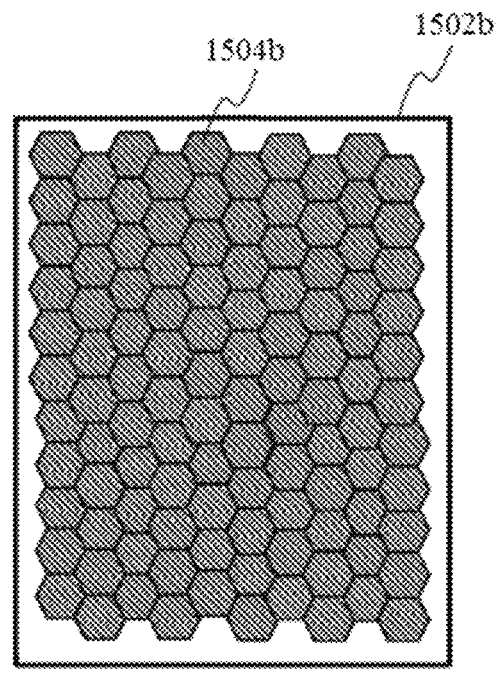
Figure 15C:
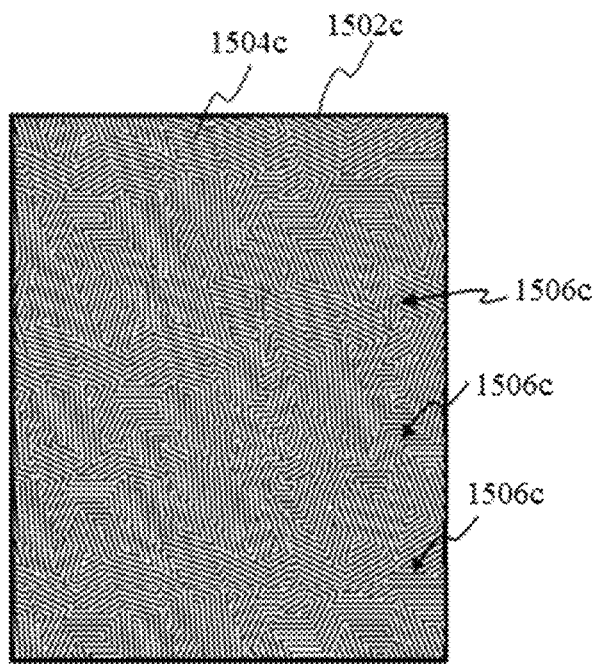

In FIGS. 15A-15C, a variety of patterned substrates imprinted according to the methods described herein are depicted. It is noted that embodiments of the present invention include master mask and master patterns having a variety of different shapes and sizes, and successive imprints can be arranged in a variety of different arrays and arrangements. Likewise the larger substrate that is patterned with the master mask can be a variety of shapes, sizes, etc.

The embodiments shown in FIG. 15A-15C depict two dimensional arrays and arrangements, although it is noted that the present invention is not limited to such embodiments. Embodiments of the present invention can include imprint schemes that involve two dimensional arrays of successive imprints, one-dimensional arrays of successive imprints, or other arrangements of successive imprints in the imprinting scheme. However, it is noted that two dimensional arrays and arrangements are preferred in some embodiments of the present invention as it can minimize the visibility of seams between successive imprints.

In FIG. 15A, a substrate 1502a patterned with a two-dimensional rectangular array of successive imprints 1504a is depicted. The pattern on the substrate 1502a can be virtually continuous and uniform at the macro-level as the visibility of seam lines 1506a at the borders between successive imprints is minimal. In various applications of the present invention, the presence of seam lines can have little to no effect on the desired functional properties of the patterned or structured substrate.

In FIG. 15B, substrate 1502b is depicted having a two-dimensional hexagonal array of successive imprints 1504b according to embodiments of the present invention.

In FIG. 15C, substrate 1502c is depicted having a randomized two-dimensional arrangement of successive imprints 1504c creating randomized seam lines 1506c between successive imprints. Randomizing the imprints can provide certain benefits in some applications of the present invention, and the visibility of the seams 1506b can be minimized on the macro level by providing a randomized pattern instead of a regular array. In FIG. 15C, substrate 1502c depicted is fully patterned edge to edge, according to some embodiments of the present invention, and amount of surface area that can be pattern is limited only by the size of the substrate chosen.

It is noted that increasing the amount of seam lines, up to a certain limit, can minimize the visibility of such seam lines while providing minimal or no detraction from desired properties created by the pattern or structure imprinted onto the substrate. For example, in an architectural glass implementation of an embodiment of the present invention, a nanostructured coating can be applied to provide antireflection properties on the glass using an imprinting scheme as described herein. Increasing the number of seam lines can minimize their visibility at the macro level while still providing the required anti-reflection properties provided by the nanostructure. This can be contrasted with known methods that attempt to minimize seam lines by patterning the entire large area with a single uniform layer at a very high cost.

In embodiments of the present invention, substrates to be patterned can be a variety of shapes and sizes, but should generally be larger than the master mask used to successively imprint the substrate. In some embodiments, substrates to be patterned can have square shapes, rectangular shapes, or other shapes. In some embodiments, substrates can be flat, curved, or have other three-dimensional surfaces. In some embodiments, substrates can have dimensions of 150 mm×150 mm or greater. In some embodiments, substrates to be patterned can have dimensions of 400 mm×1000 mm and larger. Embodiments of the present invention can also include substrates having smaller areas than those mentioned, although it is believed that embodiments of the present invention have particular applicability to embodiments involving larger area substrates, such as those having areas of 200 $cm^2$ or more.

In embodiments of the present invention, master masks can be a variety of shapes and sizes, and can have patterns of a variety of shapes and sizes, but should generally be smaller than the substrate area to be patterned. In some embodiments, master masks can have dimensions of 10 mm to 50 mm and areas of 100 $mm^2$ to 2500 $mm^2$. In other embodiments, the master masks can have dimensions and areas outside of those mentioned above, although it is noted that preferred embodiments include square masks having dimensions of 10 mm×10 mm to 50 mm×50 mm. In some embodiments, master masks can have circular shapes, rectangular shapes, or other shapes. In some embodiments, a master pattern can cover an entire surface of a master mask or part of a surface of a master mask.

In embodiments of the present invention, desired patterns can include features of a variety of different sizes, shapes, and arrangements. In some embodiments, desired patterns can include micro-scale features, nano-scale features, or other scale features. In some embodiments, features can include features having dimensions in the range of 100 nm to 400 nm. In some embodiments, features can be shaped as holes, posts, or other shapes. In some embodiments, features can be arranged in a regular array or a randomized pattern.

It is noted that the figures are primarily depicted with respect to flat substrates and patterning flat surfaces, but the present invention is not so limited. Embodiments of the present invention can be used to pattern curved surfaces or substrates having a variety of other shapes but successively imprinting such surfaces with a smaller area master mask as described herein.

It is noted that embodiments of the present invention can be used to pattern very large area substrates with patterns having small feature dimensions on the micro-scale or nano-scale. More specifically, embodiments of the present invention can be used to provide nanostructured coatings on large surface areas having nano-scaled feature dimensions. More specifically, embodiments of the present invention can be used to provide nanostructured coatings have arrays of features, e.g., posts or holes, having a characteristic dimension (CD) of 1 nanometers (nm) to 1000 nm, a pitch of 1.1 times the CD to 10 times the CD, and a depth of 10 nm to 10000 nm. A preferred embodiment of the present invention includes a CD between 50 nm and 400 nm, a pitch of 2 times the CD, and a depth ranging from 100 nm to 1000 nm. The CD is generally a dimension of the features along a direction perpendicular to the depth. Examples of CD include a width or diameter for circular or nearly circular shaped features.

In embodiments of the present invention, the master mask pattern can be created by a variety of methods. For example, the master mask can be patterned by electron beam lithography, photolithography, interference lithography, nanosphere lithography, nanoimprint lithography, self-assembly, anodic alumina oxidation, or other means.

It is noted that substrates in embodiments of the present invention can be a variety of types of materials and types of substrates. For example, substrates can be made of plastic films, glass, semiconductors, metals, other smooth substrates, or other materials.

It is noted that substrates patterned according to embodiments of the present invention can include a surfaces for a variety of different applications. For example, embodiments of the present invention can be used for solar panels, information displays, architectural glass, and a variety of other applications. For example, embodiments of the present invention can be used for nanostructured solar cells, light absorption enhancement layers, anti-reflective coatings, self-cleaning coatings, TCO for solar cells and displays, nanostructured thermoelectric cells, low-E glass, anti-icing coatings, anti-glare coatings, efficient display color filters, FPD wire grid polarizers, LED light extraction layers, nanopatterned magnetic media, nanopatterned water filtration media, nanoparticles for drug deliver, ultrasensitive sensors, nanoelectrodes for batteries, and other applications. It is also noted that patterned substrates according to embodiments of the present invention can be used as large masks that are themselves used to pattern other large surfaces such as those mentioned above.

It is noted that uniform patterns are typically used in various structured coating applications. While using successive imprints as described herein may create non-uniformities at the borders between imprints, the entire area patterned can appear macroscopically continuous and desired properties imparted by the pattern will be unaffected or very minimally affected by the borders.

It is also noted that while embodiments of the present invention have primarily been described with respect to two-dimensional arrays of imprints, the present invention is not limited to such embodiments. For example, embodiments of the present invention can include one dimensional arrays of imprints and other imprinting schemes that involve imprints that repeats in only one dimension. However, it is noted that two dimensional arrays and imprinting schemes that repeat in two dimensions are preferred as this minimizes this visibility of the borders between imprints.

IV. Patterning a Surface of a Casting Component

Aspects of the disclosure of this SECTION IV include methods and apparatus for patterning a surface of a casting component, including various exposure and epitaxial techniques. Various other methods and apparatus are also included in this section. Patterning a casting surface in accordance with aspects of this section can be used conjunction with a casting process of a compliant layer for a rotatable mask, which can provide benefits that may include minimizing or eliminating any seams in the pattern of the rotatable mask. Various other advantages of this section will be apparent upon reading this section.

It is further noted that this SECTION IV has applicability to and can readily be implemented in various aspects of the remaining SECTIONS I-III, V, and VI of this description, including but not limited to any such sections that may involve the use of patterned casting components. By way of example and not by way of limitation, various aspects of the disclosure of this SECTION IV can readily be applied to implementations of SECTION VI of this description, which involves the use of a patterned casting component for forming a multilayered rotatable mask.

Aspects of the present disclosure describe a mold and methods for manufacturing molds that may be useful in the fabrication of lithography masks, for example, near-field optical lithography masks for "Rolling mask" lithography, or masks for nanoimprint lithography. In rolling mask lithography, a cylindrical mask is coated with a polymer, which is patterned with desired features in order to obtain a mask for phase-shift lithography or plasmonic printing. The features that are patterned into the polymer may be patterned through the use of the molds described in the present application. The molds may include patterned features that protrude from an interior surface of an optically transparent cylinder. The protruding features may range in size from about 1 nanometer to about 100 microns, preferably from about 10 nanometers to about 1 micron, more preferably from about 50 nanometers to about 500 nanometers. The mask can be used to print features ranging in size from about 1 nanometer to about 1000 nanometers, preferably about 10 nanometers to about 500 nanometers, more preferably about 50 nanometers to about 200 nanometer An aspect of the present disclosure describes a mold that may be made with a porous mask. A layer of structured porous material may be deposited or grown on an interior surface of an optically transparent cylinder. One example of grown porous material is a porous alumina fabricated using anodization of aluminum layer (Anodized Aluminum Oxide—AAO). The interior of the cylinder may then be coated with a radiation-sensitive material. The radiation-sensitive material will fill in the pores that are formed in the structured porous material. The radiation-sensitive material may then be developed by exposing the exterior of the cylinder with a light source. Exposure from the exterior allows the radiation-sensitive material that has filled the pores to be cured without curing the remaining resist. The uncured resist and the porous mask material may be removed, thereby forming a mold that has posts extruding from its interior surface.

According to an additional aspect of the present disclosure, an epitaxial layer may be grown on the interior surface of the cylinder. Structured porous material may then be deposited or otherwise formed on the epitaxial layer. The epitaxial layer may then be grown using the pores in the porous layer as a guide. The epitaxial layer may be grown to a thickness greater than the structured porous layer, or the structured porous layer may be etched back to leave the epitaxial post behind. According to certain aspects of the present disclosure, the epitaxial material may be a semiconductor material. Each of the epitaxial posts may be configured to be a light emitting diode (LED). The LED posts may further be configured to be individually addressable such that radiation may be selectively produced by individual posts.

According to an additional aspect of the present disclosure, the mold may be formed with a self-assembled monolayer of nanospheres. The monolayer may be formed over a layer of radiation-sensitive material that has been formed on the interior surface of a cylinder. The radiation-sensitive material may then be exposed by a light source located in the interior of the cylinder. The self-assembled monolayer masks portions of the radiation-sensitive material during exposure. The exposed regions may then be removed by a developer. The radiation-sensitive material that was shielded by the self-assembled monolayer may then be cured and in order to form posts that are made from a glass-like substance.

According to an additional aspect of the present disclosure, a self-assembled monolayer of nanospheres formed may comprise quantum dots. The quantum dots may be formed over a layer of radiation-sensitive material that has been formed on the interior surface of a cylinder. The quantum dots may be used to expose the radiation-sensitive material directly below each dot. As such, there may be no need for an external light source. The developer may then remove the unexposed portions of the radiation-sensitive material. The exposed portions of the radiation-sensitive material may then be cured to form a glass-like substance.

According to an additional aspect of the present disclosure, a self-assembled monolayer of nanospheres may be formed on the exterior surface of the cylinder and a radiation-sensitive material may be formed on the interior surface of the cylinder. A light source positioned outside of the cylinder may be used to produce the radiation that exposes the radiation-sensitive material. The nanospheres may mask portions of the radiation-sensitive material from the radiation. The exposed portions may be removed with a developer, thereby leaving behind posts. The posts may be cured to produce a glass-like material.

According to an additional embodiment of the present invention the self-assembled monolayer may comprise quantum dots. The quantum dots may be formed on an exterior surface of a cylinder. The quantum dots may be used to expose portions of a radiation-sensitive material that has be formed on an interior surface of the cylinder. As such, there may be no need for an external light source. The developer may then remove the unexposed portions of the radiation-sensitive material. The exposed portions of the radiation-sensitive material may then be cured to form a glass-like substance. The radiation-sensitive material that has been formed on the interior surface of a cylinder.

A "Rolling mask" near-field nanolithography system has been described in International Patent Application Publication Number WO2009094009, which has been incorporated herein by reference. One of the embodiments is shown in FIG. 7. The "rolling mask" consists of glass (e.g., fused silica) frame in the shape of hollow cylinder 711, which contains a light source 712. An elastomeric film 713 laminated on the outer surface of the cylinder 711 has a nanopattern 714 fabricated in accordance with the desired pattern. The rolling mask is brought into a contact with a substrate 715 coated with radiation-sensitive material 716.

A nanopattern 714 can be designed to implement phase-shift exposure, and in such case is fabricated as an array of nanogrooves, posts or columns, or may contain features of arbitrary shape. Alternatively, nanopattern can be fabricated as an array or pattern of nanometallic islands for plasmonic printing. The nanopattern on the rolling mask can have features ranging in size from about 1 nanometer to about 100 microns, preferably from about 10 nanometers to about 1 micron, more preferably from about 50 nanometers to about 500 nanometers. The rolling mask can be used to print features ranging in size from about 1 nanometer to about 1000 nanometers, preferably about 10 nanometers to about 500 nanometers, more preferably about 50 nanometers to about 200 nanometers.

The nanopattern 714 on the cylinder 711 may be manufactured with the use of a master mold. Aspects of the present disclosure describe the master methods and methods for forming a mold that has features that will form a nanopattern 714 that has holes or depressions. In order to form holes or depressions in the rolling mask, the master mold may have protrusions, such as posts.

FIG. 16 is an overhead view of a master mold 1600 according to an aspect of the present disclosure. The master mold 1600 is a hollow cylinder 1620 that has an exterior surface 1621 and an interior surface 1622. The cylinder 1620 may be made from a material that is transparent to radiation that is in the visible and/or ultraviolet wavelengths. By way of example, and not by way of limitation, the cylinder may be a glass such as fused silica. The master mold 1600 has protrusions 1633 that extend outwards from the interior surface 1622.

FIGS. 17A-17G are cross sectional views of the master mold 1600 as seen along the line 3-3 shown in FIG. 16. Each figure depicts a processing step used in the fabrication of the master mold 1600 according to aspects of the present disclosure.

FIG. 17A is a depiction of the master mold after a structured porous layer 1730 on an interior surface of the cylinder 1720. By way of example, and not by way of limitation, the cylinder 1720 may be made of a transparent material, such as fused silica. It is noted that fused silica is commonly referred to as "quartz" by those in the semiconductor fabrication industry. Although quartz is common parlance, "fused silica" is a better term. Technically, quartz is crystalline and fused silica is amorphous. The structured porous layer 1730 contains a high density of cylindrical pores 1729 that are aligned perpendicular to the surface on which the structured porous layer is disposed. The size and density of the pores 1729 may be in any range suitable for the desired features of the mask pattern, e.g., as discussed above with respect to FIG. 16. By way of Example and not by way of limitation, the nanostructured porous layer 1730 may be a layer of anodic aluminum oxide (AAO) that has been formed on an interior surface 1722 of the cylinder 1720. AAO is a self-organized nanostructured material containing a high density of cylindrical pores that are aligned perpendicular to the surface on which the AAO layer is disposed. The AAO may be formed by depositing a layer of aluminum on the interior surface 1722 of a cylinder 1720 made of fused silica and then anodizing the aluminum layer. Alternatively, the cylinder 1720 may be made completely from aluminum, and then internal or external surfaces of such a cylinder could be anodized to form a porous surface.

Anodizing the aluminum layer may be done by passing an electric current through an electrolyte (often an acid) with the aluminum layer acting as a positive electrode (anode).

In alternative implementations, the nanostructured porous layer may be fabricated using a self-assembled monolayer or by direct writing techniques, such as laser ablation or ion beam lithography.

As shown in FIG. 17A, the pores 1729 may not penetrate through the entire depth of the layer 1730. If the pores 1729 do not extend through the structured porous layer 1730 down to the interior surface 1722 of the cylinder, the material of the structured porous layer may be etched back with an etch process. If the etch process is isotropic, the original size of the pores 1729 must be made small enough to account for growth during the etching process. For example, if the final diameter of the pores is desired to be 300 nm, and the original diameter of the pores 1729 is 50 nm, then the isotropic etch must remove 125 nm of porous material in order to enlarge the diameter of the pores 1729 to 300 nm. Additionally, if the etch process is isotropic, only 125 nm of material may be removed from the bottom of the pore in order to extend the pore to the interior surface 1722 of the cylinder. If more material needs to be removed in order to reach the interior surface 1722, then the diameter of the pores 1729 may become larger than desired. FIG. 17B depicts the enlarged pores 1729 that completely extend through the nanostructured porous layer 1730.

After the pores 1729 have been etched to the proper dimensions and depths, a radiation-sensitive material 1731 may be deposited over the nanostructured porous layer 1730 and the exposed portions of the interior surface 1722, as shown in FIG. 17C. By way of example, and not by way of limitation, the radiation-sensitive material 1731 may be deposited by dipping, spraying, rolling, or any combination thereof. By way of example, and not by way of limitation, the radiation-sensitive material 1731 may be a photoresist or a UV curable polymer. Examples of suitable photoresists include commercially available formulations such as TOK iP4300 or Shipley 1800 series from Dow Chemical Co. Examples of suitable UV-curable materials include UV polymerizable adhesives for polymers and glass. Additionally, the radiation-sensitive material 1731 contains silicon and other constituents that enable the material to be annealed after it has cured in order to produce a glass-like material. Other constituents that may be used to help form the glass-like material include Oxygen and Silicon. The radiation-sensitive material 1731 may be a solid film, or it may be a liquid layer as long as it does not flow excessively during exposure.

Next, FIG. 17D shows the cured material 1732 in the pores 1729. The radiation-sensitive material 1731 is cured by exposure to a radiation 1723 from a radiation source (not shown). By way of example, and not by way of limitation, the radiation 1723 may be produced by a radiation source that produces ultraviolet light or the radiation 1723 may be produced by a radiation source that produces light in the visible spectrum. The radiation source may be located outside of the cylinder and may emit radiation 1723 that passes through the wall of the cylinder 1720. The illumination through the cylinder 1720 limits the exposure to the material 1731 deposited in the AAO pores 1729. Additionally, the exposure cures the material 1731 to a depth of roughly twice the exposure wavelength. By way of example, when an ultraviolet wavelength is used for curing, then the cured material 1732 may have a thickness of approximately 600 nm. The curing sensitivity of the radiation-sensitive material 1731 must be sufficiently high to allow the radiation-sensitive material inside the pores 1729 to be cured before the material 1731 above the pores 1729 is cured. Also, the depth of the pores 1729 may be greater than the projected thickness of the cured material 1732 in order to prevent exposure of the radiation-sensitive material 1731 directly above the pores 1729.

FIG. 17E shows the master mold 1700 after the excess radiation-sensitive material has been removed after the cured material 1732 has been formed. The remaining unexposed radiation-sensitive material 1721 may be removed with a developer or other solvent. Thereafter, as shown in FIG. 17F, the cured material 1732 is annealed in order to form a glass-like material 1733. Finally, once the annealing is completed, the AAO layer 1730 may be selectively etched away with a wet etching process. FIG. 17G depicts the final structure of the master mold 1700. The glass-like material 1733 protrudes from the interior surface 1722 of the cylinder 1720.

According to an additional aspect of the present disclosure, the protrusions may be formed through an epitaxial growth process. FIG. 18A is an overhead view of a master mold 1800. The master mold 1800 is a hollow cylinder 1820 that has an exterior surface 1821 and an interior surface 1822. The cylinder 1820 may be made from a material that is transparent to radiation that is in the visible and/or ultraviolet wavelengths. By way of example, and not by way of limitation, the cylinder may be a glass such as fused silica. An epitaxial seed layer 1824 may be formed on the interior surface 1822. By way of example, and not by way of limitation, the epitaxial seed layer 1824 may be a semiconductor material such as silicon or gallium arsenide (GaAs). The master mold 1800 has protrusions 1833 that extend outwards from the epitaxial seed layer 1824. The protrusions may be the same material as the epitaxial seed layer 1824. FIGS. 18B-18D are cross-sectional views of the master mold 1800 along the line 4-4.

FIG. 18B is a depiction of a structured porous layer 1830 that is deposited over the epitaxial seed layer 1824. As shown in FIG. 18B, the pores 1829 might not penetrate through the entire depth of the structured porous layer 1830.

When the pores 1829 do not extend through the structured porous layer 1830 down to the epitaxial seed layer 1824, then the structured porous layer material may be etched back with an etch process. If the etch process is isotropic, the original size of the pores 1829 must be made small enough to account for growth during the etching process. For example, if the final diameter of the pores is desired to be 300 nm, and the original diameter of the pores 1829 is 50 nm, then the isotropic etch must remove 125 nm of aluminum in order to enlarge the diameter of the pores 1829 to 300 nm. Additionally, if the etchant is an isotropic etchant, only 125 nm of material may be removed from the bottom of the pore in order to extend the pore to the epitaxial seed layer 1824. If more material needs to be removed in order to reach the epitaxial seed layer 1824, then the diameter of the pores 1829 may become larger than desired. FIG. 18C depicts the enlarged pores 1829 that completely extend through the structured porous layer 1830.

Once the pores 1829 have been completed, the protrusions 1833 may be formed with an epitaxial growth process, such as, but not limited to vapor-phase epitaxy (VPE). The growth of the protrusions 1833 is guided by the pores 1829 in the structured porous layer 1830. The protrusions 1833 may be grown to a height that allows them to protrude beyond the structured porous layer 1830. However, the protrusions 1833 may be shorter than the structured porous layer 1830, if the structured porous layer will be subsequently etched back in order to expose the protrusions 1833.

According to aspects of the present disclosure, protrusion 1833 formed through epitaxial growth of a semiconductor material may further be configured to be LEDs. Each of the protrusions 1833 may be individually addressable such that each may be controlled to emit light as desired. This is beneficial for use as a master mold, because the molding process no longer requires an external light source. The protrusions 1833 may function as a physical mold, and may be used to cure the photomask that is being molded at the same time. Further, the ability to control individual protrusions allows for a single master mold to be utilized in order to form multiple different patterns by selecting which protrusions will also cure the material in the photomask.

According to yet another additional aspect of the present disclosure, a self-assembled monolayer may be used as a mask to pattern the protrusions 1933 in a master mold 1900. FIGS. 19A-19C are cross-sectional views of a master mold 1900 at different processing steps during the mold's fabrication. FIG. 19A depicts the formation of a self-assembled monolayer (SAM) 1940 formed over a radiation-sensitive material 1931 on the interior surface 1922 of the cylinder 1920. By way of example, and not by way of limitation, the SAM 1940 may be formed from metal nanospheres, or quantum dots. By way of example, and not by way of limitation, the radiation-sensitive material 1931 may be photoresist or a UV curable polymer. Additionally, the radiation-sensitive material 1931 contains silicon and other constituents that enable the material to be annealed in order to produce a glass-like material.

Next, at FIG. 19B, the radiation-sensitive material 1931 is exposed with radiation 1923 from a radiation source (not shown). Plasmonic lithography may be utilized, e.g., if the SAM 1940 comprises metal nanospheres. The metal nanospheres may be used as plasmonic mask antennae. The portions of the radiation-sensitive material 1931 that are exposed to radiation may become soluble to a developer solvent used to develop the radiation-sensitive material. The portion of the radiation-sensitive material that is unexposed 1932 may remain insoluble to the developer solvent. It is noted that alternative aspects of the present disclosure include use of a reverse tone process in which portions of the radiation-sensitive material 1931 that are exposed to radiation become insoluble to a developer and portions of the radiation-sensitive material that are not so exposed remain soluble to the developer. Alternative aspects of the present disclosure where the SAM 1940 comprises quantum dots may not need an additional light source to expose the radiation-sensitive material 1931. As shown in FIG. 19B' the quantum dots in the SAM 1940 may be activated in order to expose the radiation-sensitive material 1931. When the exposure is made by the quantum dots, the radiation-sensitive material may be cured by the exposure. The non-exposed portions of the radiation-sensitive material 1931 may therefore be removed by the developer. Finally, in FIG. 19C the protrusions 1933 are annealed in order to convert the cured radiation-sensitive material 1932 into glass-like material.

Alternative aspects of the present disclosure include implementations in which the mask itself is made with light emitting diodes (LEDs). Such a mask may be implemented, e.g., using a polymer mask with an array of holes smaller than features that are desired to be printed, with a corresponding layer of LEDs above it. A specific subset of the LEDs may be turned on to define the pattern to be printed.

Figures 20A, 20B, 20C:
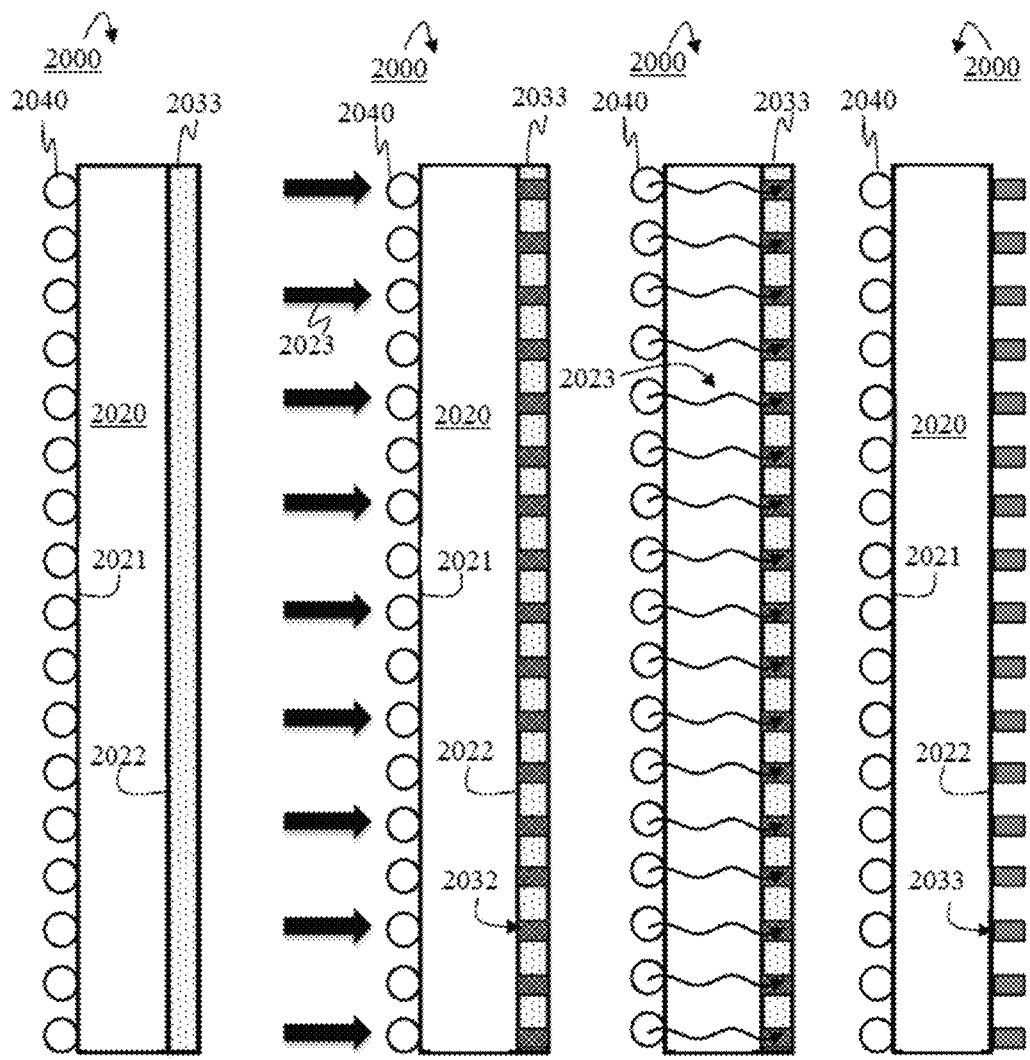
FIGS. 20A, 20B, 20B', and 20C are schematic diagrams that show the process of forming the master mold according to additional aspects of the present disclosure that utilize self-assembled monomers formed on the exterior surface of the master mold.

According to an additional aspect of the present disclosure, a SAM 2040 may be formed on the exterior surface 2021 of the cylinder 2020 as show in FIG. 20A. The SAM 2040 may be substantially similar to the SAM 1940. The formation of a SAM 2040 on the exterior surface allows for the light used for the exposure to originate from outside of the cylinder 2020 as shown in FIG. 20B. In FIG. 20B, the radiation-sensitive material 2031 may be exposed with radiation 2023 that is emitted by a radiation source (not shown) that is located outside of the cylinder 2020. Alternatively, if the SAM 2040 comprises quantum dots, then the radiation source that produces the radiation 2023 may be omitted, and the quantum dots may be used to expose the radiation-sensitive material 2031 instead, as shown in FIG. 20B'. Finally, FIG. 20C shows the removal of the non-exposed radiation-sensitive material, and the annealing of the protrusions 2033 to form the glass-like material.

V. Forming a Rotatable Mask Using a Rolled Laminate

Aspects of the disclosure of this SECTION V include methods and apparatus for forming a rotatable mask using a rolled laminate. Various other methods and apparatus are also included in this section. Forming a rotatable mask in accordance with aspects of this section can be used to form a compliant layer for a rotatable mask, which can provide benefits that may include minimizing or eliminating any seams layer where the edges of the laminate meet. There may be various other advantages to implementations of this section.

It is further noted that this SECTION V has applicability to and can readily be implemented in various aspects of the remaining SECTIONS I-IV and VI of this description, including but not limited to any such sections that may involve a compliant layer rolled onto the outer surface of a rotatable substrate. By way of example and not by way of limitation, various aspects of the disclosure of this SECTION V can readily be applied to implementations of SECTION I of this description, which involves the use of coaxial assemblies to form a cast a compliant layer.

A process flow diagram depicting a method 2100 for fabricating a free standing polymer mask according to various aspects of the present disclosure is depicted in FIGS. 21A-21G. Various steps in the process flow FIGS. 21A-21G may be performed in accordance with various aspects of the above description for forming a free standing polymer mask.

The method 2100 may include first making a patterned master mold/mask 2112 (alternatively referred to herein as a first master mask or "submaster" mask because it may be a mask used to pattern to a main rotatable mask for a subsequent fabrication process), as depicted in FIGS. 21A and 21B. The patterned submaster may be created by patterning a substrate 2105 to create the pattern 2110 on the submaster 2112. Patterning the submaster mask may be accomplished in a variety of ways. In some implementations, patterning the substrate to create a submaster mask utilizes involves successively overlapping cured imprints on a substrate 2105 with a smaller mask to create a quasi-seamless pattern 2110 for the submaster mask, according to various aspects of the disclosure of SECTION III of this description. In yet further implementations, the submaster may be patterned using any of a variety of known techniques, such as, e.g., nanoimprint lithography, nanocontact printing, photolithography, etc.

The method 2100 may further include casting an elastomeric material 2115 (alternatively referred to herein as a polymer precursor liquid or liquid polymer precursor), such as polydimethylsiloxane (PDMS), on a patterned area of the submaster mold 2112, as depicted in FIG. 21C. Casting the elastomeric material 2115 may include depositing a polymer precursor liquid on the submaster and curing the polymer precursor liquid to create a cured polymer. Accordingly, aspects of the pattern of the submaster 2112 may be transferred to the elastomeric material 2115 to form a patterned polymer mask upon curing. The elastomeric material 2115 may be cast in such a manner that a strip 2120 of the patterned submaster 2112 does not have elastomeric material 2115 cast thereon. In some implementations, this may be accomplished by removing or cutting off a strip of the cast material 2115 after it is cured. In yet further implementations, this may be accomplished by simply not casting the elastomeric material or not depositing the polymer precursor liquid on a portion of the patterned submaster. In yet further implementations, this may be accomplished by some combination of the above. The uncast strip portion 2120 of the patterned submaster 2112 may be at an end of the submaster to enable it to overlap an opposing end of the laminate upon being rolled inside of a casting component.

Next, a strip 2125 may be removed from the submaster of the laminate created by the previous steps, as depicted in FIG. 21D, in such a manner that the missing strip portion 2120 of the cured polymer 2115 and the missing strip portion 2125 of the patterned submaster 2112 are in staggered locations with respect to one another. The strip 2125 that is removed from the patterned submaster may be at an opposing end of the laminate with respect to the missing strip 2120 of the cured polymer, thereby enabling the laminate to be rolled with these strip portions overlapping one another. In some implementations, a strip 2125 of the patterned submaster 2112 may be removed before a strip 2120 of the cast elastomeric material is removed.

As in FIG. 21E, the laminate of the submaster 2112 and the cast polymer 2115 may then be rolled and placed in a casting cylinder 2130, with the unpatterned surface of the substrate 2105 of the submaster 2112 in contact with the inner surface of the casting cylinder 2130. Accordingly, the outer surface of the laminate may be adjacent to the inner surface of the casting cylinder 2130 when it is rolled. In some implementations, the casting cylinder 2130 into which the laminate is rolled is a sacrificial casting component and utilizes various aspects of the disclosure of SECTION II of this description.

Rather than rolling the laminate inside of a sacrificial casting cylinder 2130 with the unpatterned surface of the substrate 2105 in contact with the inner surface of the casting cylinder 2130, in some implementations the laminate is rolled around a sacrificial casting cylinder, with the unpatterned surface of the substrate of the submaster in contact with the outer surface of the sacrificial casting cylinder, according to various aspects of the disclosure of SECTION II of this description.

A gap 2120 may be formed in the polymer mask 2115 along the length of the cylinder, which may correspond to the strip 2120 of removed/uncast elastomeric material 2115. A patterned portion of the submaster mold 2112 under the polymer mask 2115 may be exposed from the gap 2120 and extend across the gap 2120. The staggered locations of the removed/missing strip portions of the laminate enable it to be rolled in such a manner that the gap 2120 is exposed to a patterned portion of the submaster 2112, but without another seam being formed at the boundary between opposing ends of the rolled laminate due to the overlapped portions.

As in FIG. 21F, the gap 2120 may then be filled with more liquid elastomeric material (i.e. more polymer precursor liquid) to fill in the gap 2120 in the cured polymer 2115. As such, the pattern on the submaster mold 2112 may transferred to the added elastometric material upon curing to thereby fill in the seam and form a substantially seamless polymer mask pattern. In some implementations, the filling in the gap may utilize various aspects of the disclosure of SECTION I. For example, in some implementations coaxial cylinders may be assembled using an assembly apparatus that enables liquid polymer precursor to be poured into the gap.

After curing, the casting cylinder 2130 can be removed from the laminate of the submaster mold 2112 and the polymer mask 2115 having the gap 2120 filled in. The polymer mask 2115 may also be separated from the submaster mold 2112, yielding a free standing polymer mask having a substantially seamless pattern 2140 on its outer surface, such as depicted in FIG. 21F.

In some implementations, the cast elastomeric material is PDMS with a thickness in a range from about 1 mm to about 3 mm, to thereby produce a cylindrical mask having a compliant layer 1-3 mm thick.

In some implementations, the submaster may have a PET film substrate, and the pattern may be formed thereon using a UV-cured polymer.

Some implementations of the present disclosure can include a free standing polymer mask and a method for fabricating the same.

In some implementations, the method includes first making a patterned master mold (a patterned master mold may alternatively be referred to herein as a master mask). Next, an elastomeric material, such as polydimethylsiloxane (PDMS), is cast on the patterned area of the master mold to form a patterned polymer mask upon curing (elastomeric material may be alternatively referred to herein as polymer, pre-polymer, polymer precursor, or polymer precursor liquid). The polymer mask is configured to have a missing portion at an end of the master mask mold, wherein a portion of the end of the polymer mask may be cutoff or the elastomeric material may not be cast on a strip at the end of the master mold. The laminate of the mask mold and the polymer mask is then rolled and placed in a casting cylinder in a way that the substrate to the master mold is in contact with the casting cylinder. A gap is formed in the polymer mask along the length of the cylinder, wherein the gap corresponds to the missing portion of the cured polymer mask, and the master mold under the polymer mask is exposed from the gap and extends across the gap. The gap is then filled with additional liquid elastomeric material. As such, the pattern on the master mold is transferred to the added elastometric material upon curing, thereby filling in a seam in the polymer mask pattern. After curing, the laminate of the master mold and the polymer mask can be removed from the casting cylinder and the polymer mask may be in turn separated from the master mold, yielding a free standing polymer mask.

Figure 22A:
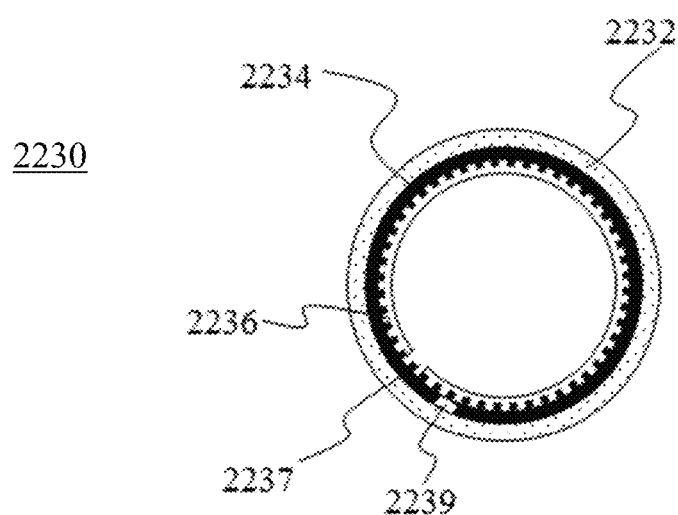
FIG. 22A is an overhead view of a cylindrical master mold assembly having a rolled laminate used in making a cylindrical mask according to various aspects of the present disclosure.
Figure 22B:
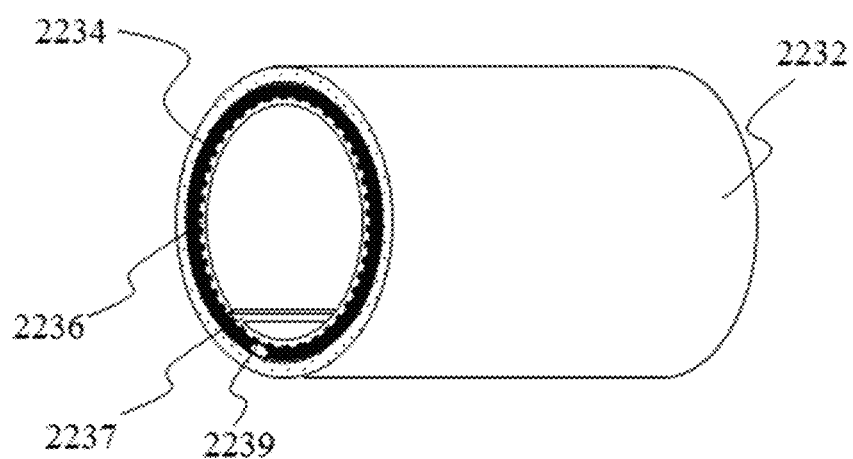
FIG. 22B is a perspective view of the cylindrical master mold assembly shown in FIG. 22A.

FIG. 22A is an overhead view of a cylindrical master mold assembly 2230 that can be used to form a polymer mask according to various aspects of the present disclosure. The cylindrical master mold assembly 2230 includes a casting cylinder 2232, a master mold 2234 and a patterned polymer mask 2236 with a gap 2237 along the length of the cylinder. FIG. 22B is a perspective view of a cylindrical master mold assembly shown in FIG. 22A.

The patterned mask 2236 may be patterned with a mask pattern in a variety of ways. In one example, the inner surface of the master mold may contain a mask pattern so that this pattern is transferred to the outer surface of the polymer mask. As another example, the polymer mask may be patterned after subsequent fabrication steps and removal of the casting cylinder by patterning the outer surface of the polymer using various lithography methods. As another example, the pattern may also be patterned by some combination above.

Once the substrate of the master mold 2234 is patterned, an elastomeric material may be cast on the patterned area of the mold 2234. In some implementations, the elastomeric material may be Polydimethylsiloxane (PDMS), such as Sylgard 184 of Dow Corning™, h-PDMS, soft-PDMS gel, etc. The elastomeric material may be deposited in accordance with any of a number of known methods. By way of example, and not by way of limitation, the elastomeric material may be deposited by dipping, ultrasonic spraying, microjet or inkjet type dispensing, and possibly dipping combined with spinning. After the curing process, the polymer, such as PDMS, is cured to form a patterned polymer mask 2236 on the master mold 2234. Curing the polymer may depend on the type of polymer being cured and other factors. For example, curing can be done thermally, with UV radiation, or other means.

The laminate of the master mold 2234 and the polymer mask 2236 is rolled and coaxially inserted into a casting cylinder 2232 in a way that the substrate to the master mold 2234 is in contact with the casting cylinder 2232 (i.e. the outer surface of the laminate is adjacent to the inner surface of the casting cylinder). Since a portion of one end of the polymer mask 2236 is missing, a gap 2237 is formed in the polymer mask along the length of cylinder 2232, and the underneath master mold is exposed from the gap and extends across the gap. A strip 2239 of the master mold 2234 (i.e. the patterned substrate) can also be removed from the laminate at a staggered location relative to the gap 2237 so that the laminate can be rolled inside of the cylinder 2232 without a seam. The missing strips 2237, 2239 of the laminate may be at opposite ends of the laminate to allow the laminate to be rolled with the ends of the laminate overlapping each other as depicted in FIGS. 22A-22B.

The casting cylinder 2232 should be able to be removed after the cylindrical master mold assembly of the present disclosure is formed. According to aspects of the present disclosure, the casting cylinder 2232 may be a thin walled cylinder that is formed from a material that is easily fractured. By way of example, and not by way of limitation, the material may be glass, sugar, or an aromatic hydrocarbon resin, such as Piccotex™ or an aromatic styrene hydrocarbon resin, such as Piccolastic™. Piccotex™ and Piccolastic™ are trademarks of Eastman Chemical Company of Kingsport, Tenn. By way of example, and not by way of limitation, the casting cylinder 2232 may be approximately 1 to 10 mm thick, or in any thickness range encompassed therein, e.g., 2 to 4 mm thick. As shown in FIG. 22A, the polymer mask 2236 is not in contact with the casting cylinder 2232, and therefore the nanopattern on the polymer mask is protected from damage during the removal. According to additional aspects of the present disclosure, the casting cylinder 2232 may be made from a material that is dissolved by a solvent that does not harm the polymer mask 2236. By way of example, a suitable dissolvable material may be a sugar based material and the solvent may be water. Dissolving the casting cylinder 2232 instead of fracturing may provide additional protection to the nanopattern.

According to yet additional aspects of the present disclosure, the casting cylinder 2232 may be a thin walled sealed cylinder made from malleable material such as plastic or aluminum. Instead of fracturing the casting cylinder 2232, the sealed component may be removed by collapsing the component by evacuating the air from inside the cylinder.

According to yet another aspect of the present disclosure, the casting component 2232 may be a pneumatic cylinder made of an elastic material. Examples of elastic materials that may be suitable for a pneumatic cylinder include, but are not limited to plastic, polyethylene, polytetrafluoroethylene (PTFE), which is sold under the name Teflon®, which is a registered trademark of E. I. du Pont de Nemours and Company of Wilmington, Del. During the molding process, the casting cylinder 2232 may be inflated to form a cylinder and once the polymer mask 2236 has cured, the casting cylinder 2232 may be deflated in order to be removed without damaging the polymer mask. In some implementations, such a pneumatic cylinder may be reusable or disposable depending, e.g., on whether it is relatively inexpensive to make and easy to clean.

Next, the gap 2237 in the polymer mask 2236 along the length of the cylinder is filled with polymer, such as liquid PDMS. During the curing process, the pattern on the master mold 2234 is transferred to the added polymer. As such, a cylindrical master mold assembly 2230 of FIGS. 22A-22B may be formed.

Curing the liquid polymer may involve applying UV radiation, heat or other means. As an example of applying radiation, the radiation source may be located co-axially within the master mold assembly 2230. Alternatively, the radiation source may be located outside of the master mold assembly 2230 and the exposure may be made through the casting cylinder 2232 and the master mold 2234 when the casting cylinder 2232 and the master mold 2234 are transparent to the wavelengths of radiation required to cure the liquid polymer.

The laminate of the master mold 2234 and the patterned polymer mask 2236 may be thereafter removed from the casting cylinder 2232. Removing the casting cylinder may be performed in a variety of ways. By way of example, and not by way of limitation, the casting component 2232 may be removed by fracturing, dissolving, deflating, or collapsing. By way of example, and not by way of limitation, the casting cylinder can be cut using a saw, a laser, wet or drying etching, or other means. When cutting the casting cylinder, care should be taken not to damage the layer/mask underneath. If a laser is used to cut the casting cylinder, a special layer could be deposited on the inside surface of the casting cylinder to act as an etch stop layer, and this layer should reflective to the light that is used to cut the casting cylinder material. Cutting can be performed using one or more cut lines to make it easier to subsequently peel off the casting cylinder from the laminate. Once the casting cylinder is cut, it can be peeled off of the laminate mechanically. By way of example, and not by way of limitation the casting cylinder may be etched way chemically using etching chemicals that do not also etch away the master mold and the polymer mask within. The casting cylinder may also be removed by other means, and such other means of removal are within the scope of the present disclosure. In some implementations, the casting cylinder 2232 is a sacrificial casting component according to various aspects of SECTION II of this description.

Next, the polymer mask 2236 may be separated from the master mold 2234, such as, e.g., by peeling it off, resulting in a free standing PDMS mask having a thickness of 1-3 mm.

Figure 23:
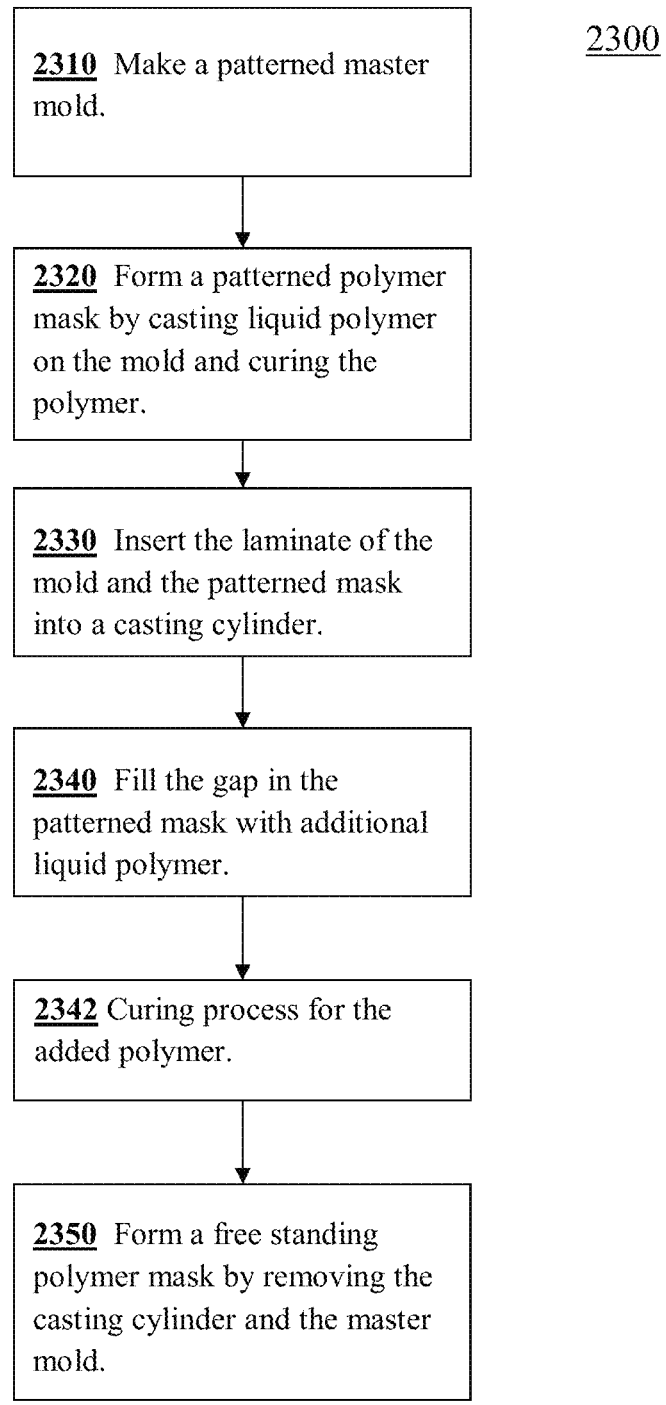
FIG. 23 is a process flow diagram depicting a method of fabricating a cylindrical polymer mask using a rolled laminate according to various aspects of the present disclosure.

Aspects of the present disclosure include a process 2300 that may use cylindrical master mold assemblies 2230 to form a free standing polymer mask. A flowchart depicting process 2300 that includes various aspects of the above disclosure is depicted in FIG. 23. Various aspects of process 2300 are also described with reference to mold assemblies 2230 of FIGS. 22A-22B. First, at 2310, pattern a master mold 2234. The master mold may be patterned by successively imprinting it with a smaller master mask. At 2320, form a patterned polymer mask by casting elastomeric materials or polymer on the master mold 2234 and curing the material/polymer. At 2330, the laminate of the master mold 2234 and the patterned polymer mask 2236 is rolled and inserted coaxially into a casting cylinder 2232. At 2340, the gap in the patterned polymer mask 2236 is filled with a liquid polymer. At 2342, the liquid polymer is cured during the curing process, and thereby transferring the patterns on the master mold along the gap to the cured polymer. At 2350, the casting cylinder 2232 and the master mold 2234 are removed to form a free standing polymer mask.

VI. Forming a Multilayer Mask Using Casting Components

Aspects of the disclosure of this SECTION VI include methods and apparatus for forming a multilayered mask using coaxial casting components in multiple stages. Various other methods and apparatus are also included in this section. Forming a multilayered mask in accordance with aspects of this section can be used to form a compliant layer for a rotatable mask, which can provide benefits that may include extra cushioning or compliance in the rotatable mask. There may be various other advantages to implementations of this section.

It is further noted that this SECTION VI has applicability to and can readily be implemented in various aspects of the remaining SECTIONS I-V of this description, including but not limited to any such sections that may involve forming a patterned compliant layer of rotatable mask. By way of example and not by way of limitation, various aspects of the disclosure of this SECTION VI can readily be applied to implementations of SECTION IV of this description, which involves the patterning of a surface of a casting component.

Aspects of the present disclosure include a multilayer polymer mask and a method of fabricating the same. The method of making the multilayer polymer mask may involve two stages.

Figure 24A:
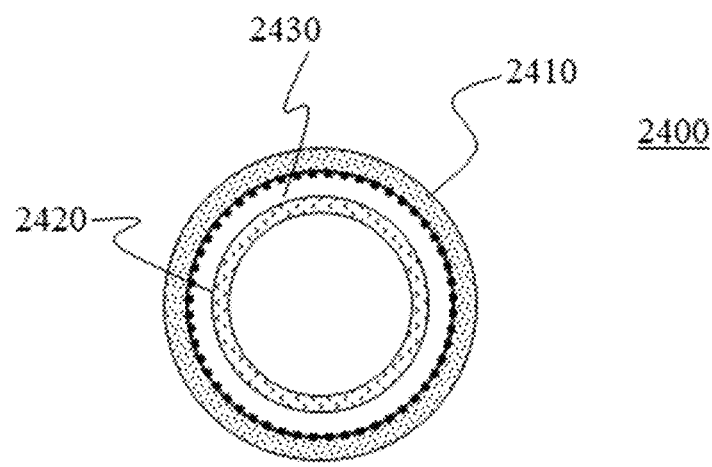
FIG. 24A is an overhead view of a cylindrical master mold assembly used in making a multilayered cylindrical mask according to various aspects of the present disclosure.

FIG. 24A depicts an overhead view of a cylindrical master mold assembly in a first stage to form a multilayer polymer mask according to some implementations of the present disclosure. A cylindrical master mold 2410 is formed with features/patterns on the inner surface of the cylinder. A first casting cylinder 2420 is next inserted coaxially into the master mold 2410 to create a cylindrical region between the casting cylinder 2420 and the master mold 2410. Next, the cylindrical region between the casting cylinder 2420 and the master mold 2410 is filled with a liquid polymer to form a patterned polymer mask 2430 upon curing. Thereafter, the first casting cylinder 2420 is removed and the polymer mask 2430 is peeled off from the interior of the cylindrical master mold 2410. As such, a free standing polymer mask may be formed. In some implementations, a free standing polymer mask 2430 is alternatively formed using aspects of the SECTION V of this description, wherein a laminate is rolled into a cylinder and a gap in the laminate is filled in to produce a substantially seamless pattern on a cylindrical mask. In some implementations, a free standing polymer mask 2430 is formed using various aspects of SECTION II of this description, including implementations wherein the first casting cylinder 2420 is a sacrificial component and removing the first casting cylinder is performed in accordance with aspects of that section. In some implementations, the cylindrical master mask is formed by patterning the inner surface of the cylinder in accordance with various aspects of SECTION IV of this description.

Figure 24B:
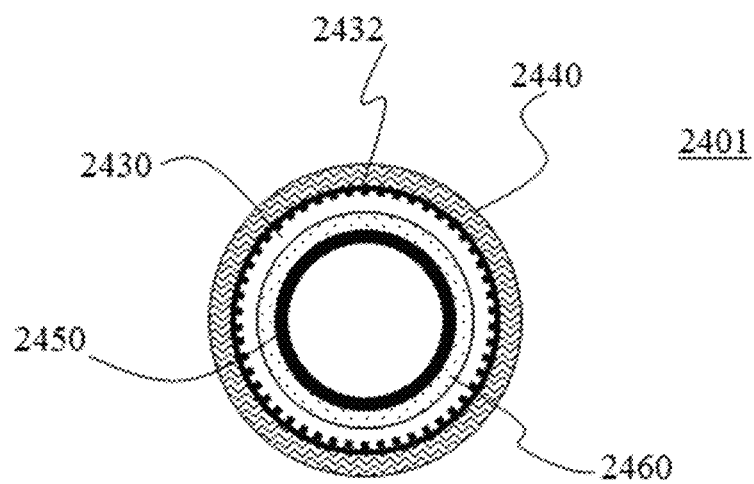
FIG. 24B is an overhead view of the cylindrical master mold assembly shown in FIG. 24A.

FIG. 24B depicts an overhead view of a cylindrical master mold assembly in a second stage to form a multilayer polymer mask according to some implementations of the present disclosure. The polymer mask 2430 is covered with a protective film 2432 and inserted into a second casting cylinder 2440, with the protective film against the interior surface of the casting cylinder 2440. A fused silica mask cylinder 2450 is in turn inserted coaxially into the second casting cylinder 2440 and the film-covered polymer mask 2430, and thereby creating a cylindrical region between the fused silica mask cylinder and the inner diameter of the polymer mask 2430. This gap is then filled with liquid polymer to form cushion layer 2460 upon curing. Then the second casting cylinder 2440 and the protection film 2432 are removed. As a result, a multilayer polymer mask is formed. In some implementations, the second casting cylinder 2440 is also a sacrificial casting component in accordance with various aspects of SECTION II of this description, thereby allowing yet additional layers to be formed by repeating a process similar to the second stage accordingly.

FIG. 2 depicts an assembly 200 that may be used to form a patterned polymer mask according to various aspects of the present disclosure. In some implementations, aspects of this disclosure may be used in the first stage mentioned above for forming a multilayer polymer mask. The assembly 200 includes a master mold 204 and a first casting cylinder 202 surrounded by the master mold 204. The first casting cylinder 202 may correspond to the first casting cylinder 2420 of FIG. 24A. The first casting cylinder 202 may also correspond to a sacrificial casting cylinder, such as sacrificial casting component 830 of FIG. 8A. The master mold 204 and the casting cylinder 202 are coaxially assembled in a way that their axes 206 are aligned, thereby creating a cylindrical region 208 with uniform thickness around the master mold 204 which can define the shape of a polymer layer of the cylindrical mask. The outer diameter of the casting cylinder 202 is larger than the outer diameter of the final fused silica mask cylinder 2450 of the multilayer mask. Polymer precursor can be inserted in the space 208 between the master mold 204 and the casting cylinders 202. The master mold 204 and the casting cylinder 202 can be held in place using an assembly apparatus (not pictured) that aligns their axes and permits a liquid polymer to be inserted into cylindrical region 208 of the assembly, such as by pouring it through openings or holes in the apparatus. Inserting the polymer precursor may be done, for example, by pouring a liquid or semi-liquid polymer precursor material in through the top of the assembly apparatus into the space between the mold 204 and the cylinder 202. The polymer precursor may be in the form of a monomer, a polymer, a partially cross-linked polymer, or any mixture of thereof in a liquid or semi-liquid form. The polymer precursor can be cured to form the inner polymer layer of the cylindrical mask. Curing the polymer precursor may involve applying UV radiation or heat. During the curing process, the patterns on the inner surface of the master mold 204 may be transferred to the outer surface of the polymer.

In the above mentioned first stage, patterning the inner surface of the master mold 2410 may be done using a variety of techniques. For example, the inner surface of the master mold may be patterned by successively imprinting it with a smaller master mask as described above in SECTION III of this description. As another example, a cylinder surface may be patterned using any of a variety of known techniques, including nanoimprint lithography, nanocontact printing, photolithography, etc.

In the above mentioned first stage, the cast cylinder 2420 may be removed. The patterned polymer mask may be in turn peeled off from the master mold 2410 to form a free standing polymer mask in a thickness of about 1 to 3 mm. It is noted that removing the casting cylinder 2420 and the polymer mask 2430 can be performed in a variety of ways, including various ways as mentioned above in the present disclosure.

In the above mentioned first stage, the polymer mask 2430 may be covered with a protective layer 2432. In one example, the protective layer may be a film of polyethylene terephthalate (PET). The protective layer 2432 may be deposited on the polymer mask 2430, and the film-covered polymer mask 2430 is then inserted coaxially into a second casting cylinder 2440 with the protective film 2432 against the inner surface of the second casting cylinder 2440. The inner diameter of the second casting cylinder 2440 is equivalent to the inner diameter of the master mold 2410 utilized in the first stage mentioned above. The second casting cylinder 2440 may be a thin walled cylinder that is formed from a material that is easily fractured, such as discussed in associated with the casting cylinder 2232 of FIG. 22A and FIG. 22B or as described with reference to a sacrificial casting component in SECTION II. In some implementations, the protective film enables the second casting cylinder 2440 to be made of separate parts.

In the above mentioned second stage, a substrate for the rotatable mask, such as a fused silica mask cylinder 2450 is inserted coaxially into the second casting cylinder 2440 and the film-covered polymer mask 2430. The fused silica mask cylinder 2450 may be a hollow cylinder with an outer diameter that is smaller than the inner diameter of the polymer mask 2430, thereby creating a cylindrical region of uniform thickness around the mask cylinder 2450 between the outer surface of the mask cylinder and the inner surface of the polymer mask 2430.

In the above mentioned second stage, the cylindrical region created between the polymer mask 2430 and the fused silica mask cylinder 2450 may be filled with a liquid polymer and thereby forming a cushion layer 2460 at the inner surface of the polymer mask upon curing. The liquid polymer may be inserted into the cylindrical region in a variety of ways, including various ways mentioned above in the present disclosure.

In the above mentioned second stage, the second casting cylinder 2440 may be removed. Also, the protective film 2432 may be separated from the polymer mask 2430 having cured cushion layer 2460. As a result, a multilayer polymer mask including the polymer mask 2430 and the cushion layer 2460 may be formed. Removing the cast cylinder and protective film may be performed in a variety of ways, such as various ways mentioned elsewhere in this disclosure.

Figure 25:
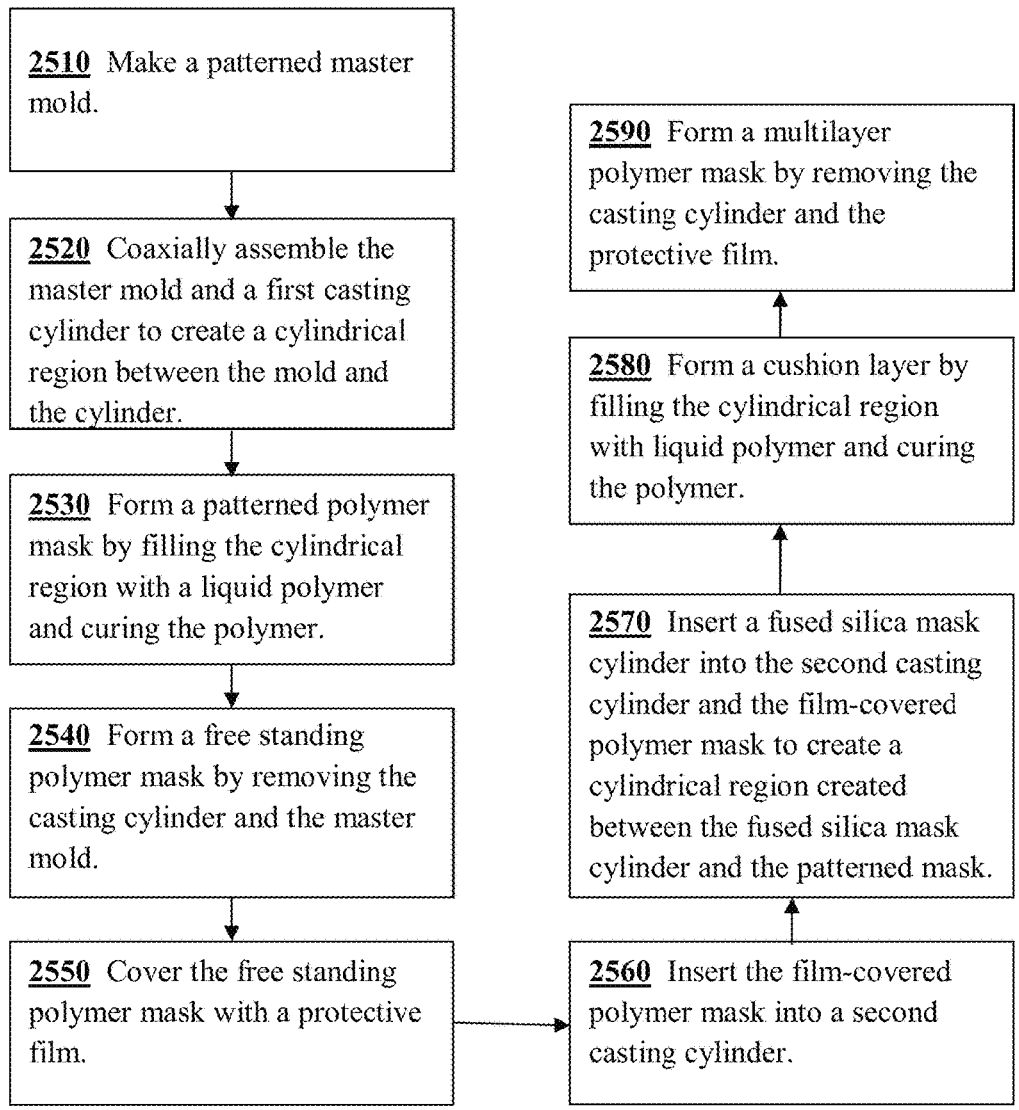
FIG. 25 is a process flow diagram depicting a method of fabricating a multilayered cylindrical polymer mask according to various aspects of the present disclosure.

Aspects of the present disclosure include a process 2500 that may use cylindrical master mold assemblies 2400 and 2401 to form a multilayer polymer mask. A flowchart depicting process 2500 is depicted in FIG. 25 that may include various aspects of the above disclosure. Various aspects of process 2500 are also described with reference to FIGS. 24A-24B. At 2510, the method 2500 may include patterning a master mold/mask 2410 so that the inner surface of the master mold includes a pattern. At 2520, coaxially assemble the patterned master mold 2410 and the first casting cylinder 2420 so that the axis of both the mold and the cylinder are the same. The casting cylinder 2420 may be a hollow cylinder with an outer diameter that is smaller than an inner diameter of the master mold 2410, such that a space is left between the mold and the cylinder. At 2530, space between the mold 2410 and the casting cylinder 2420 is filled with a liquid polymer precursor, resulting in a patterned polymer mask upon curing. At 2540, the first casting cylinder 2420 is removed and the patterned polymer mask 2430 is peeled off from the master mold 2410, thereby forming a free standing polymer mask. In some implementations, the casting cylinder 2420 may be a sacrificial casting component in accordance with various aspects of SECTION II of this description, so that the master mask 2410 can be preserved for future use, whereby the casting cylinder 2420 is removed by fracturing, dissolving, collapsing, or otherwise removing it in a manner that enables the cured polymer to be subsequently removed at 2540 from the master mask 2410 after removal of the casting cylinder 2420. At 2550, the polymer mask 2430 is covered with a protective layer or film 2432. At 2560, the film-covered polymer mask 2430 is coaxially inserted into a second casting cylinder 2440. At 2570, a fused silica mask cylinder 2450 is coaxially inserted into the second casting cylinder 2440 and the film-covered mask 2430. The fused silica mask cylinder 2450 may be a hollow cylinder with an outer diameter that is smaller than an inner diameter of the polymer mask 2430, thereby leaving a space left between the cylinder and the mask. At 2580, the space between the fused silica mask cylinder 2450 and the polymer mask 2430 is filled with additional liquid polymer precursor, thereby forming a cushion layer 2460 upon curing. At 2590, the casting cylinder 2440 and the protective film may be removed to form a multilayer polymer mask. In some implementations, the casting cylinder 2440 may also be a sacrificial casting component.

Forming a multilayer mask in accordance with various aspects of the present disclosure may provide several advantages. For example, a casting cylinder, e.g. first casting cylinder 2420 mentioned above used to form an outer layer, may be made with separable components having seams, thereby potentially simplifying the process and reducing costs. Polymer used to form a layer in contact with an unpatterned surface, e.g. polymer 2460 used to form inner layer adjacent to the inner surface of outer layer 2430 mentioned above, may also fill in seams caused by using such separate components. Likewise, in some implementations of the present disclosure, a protective film provided over a patterned surface enables a casting tube, e.g. second casting cylinder 2440 mentioned above, to be made of separable components, whereby the protective film may prevent a seam of separable components from transferring to patterned features covered by the film. Furthermore, in some implementations, a mold or mask used in the casting process, such as, e.g., the cylindrical master mold 2410, does not have to be broken to remove the molded material, thereby preserving it for future use and preventing damage to the molded material by the breaking process.

Those of ordinary skill in the art will readily appreciate that various aspects of the present disclosure may be combined with various other aspects without departing from the scope of the present disclosure. By way of example and not by way of limitation, it will readily be appreciated by those of ordinary skill in the art that various aspects of the disclosures of SECTIONS I-VI above can be combined into numerous different permutations in fabrication methods and rotatable masks involved in implementing the present disclosure.

It is noted that various aspects of the present disclosure have been described with reference to multilayered masks generally having two compliant layers. It is noted that aspects of the present disclosure can readily be implemented to form multilayered masks having more than two compliant layers.

It is further noted that various aspects of the present disclosure have been described with reference to rotatable masks having cylindrical shapes. It is noted that aspects of the present disclosure can readily be implemented in rotatable masks having other shapes, such as, e.g., shapes containing frusto-conical elements or other axially symmetric shapes.

It is further noted that various aspects of the present disclosure may inverted, switched around, reordered, etc., in order to produce seamless or quasi seamless feature patterns different desired surfaces, such as, e.g., inner or outer surfaces of casting cylinders, final masking cylinders, layers, or other elements used in fabrication processes.

More generally it is important to note that while the above is a complete description of the preferred embodiments of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not.

In the claims that follow, the indefinite article "a", or "an" when used in claims containing an open-ended transitional phrase, such as "comprising," refers to a quantity of one or more of the item following the article, except where expressly stated otherwise. Furthermore, the later use of the word "said" or "the" to refer back to the same claim term does not change this meaning, but simply re-invokes that non-singular meaning. The appended claims are not to be interpreted as including means-plus-function limitations or step-plus-function limitations, unless such a limitation is explicitly recited in a given claim using the phrase "means for" or "step for."

What is claimed is:

1. A method of making a rotatable mask, the method comprising:
   a) depositing a first polymer precursor liquid on a first surface of a first master mask, wherein the first surface of the first master mask includes a pattern;
   b) curing the first polymer precursor liquid to create a first cured polymer, wherein the first cured polymer and the first master mask together form a laminate;
   c) configuring a first end of the laminate to have a strip of the first cured polymer missing and a second end of the laminate to have a strip of the first master mask missing;
   d) rolling the laminate inside of a first casting component;
   e) depositing a second polymer precursor liquid in a gap of the rolled laminate that corresponds to the strip of the first cured polymer;
   f) curing the second polymer precursor liquid to form a second cured polymer, whereby the first cured polymer and the second cured polymer together form a compliant layer for the rotatable mask, whereby the outer surface of the compliant layer includes a pattern that corresponds to the pattern of the first master mask.

2. The method of claim 1, further comprising:
   g) removing the first casting component from the laminate after said f).

3. The method of claim 1, further comprising:
   h) removing the first master mask from the compliant layer after said f).

4. The method of claim 1, wherein said c) includes removing a strip of the first cured polymer after said b).

5. The method of claim 1, wherein said c) includes leaving a strip of the first surface of the first master mask exposed when performing said a).

6. The method of claim 1, wherein said d) includes overlapping said ends of the laminate.

7. The method of claim 1, wherein the first end of the laminate is opposite to the second end of the laminate.

8. The method of claim 1, further comprising:
   i) forming the pattern on the first surface of the first master mask before said a).

9. The method of claim 8, wherein said forming the pattern on the first surface of the first master mask includes:
   imprinting a substrate with a second master mask having a pattern, the pattern of the second master mask having a smaller area than the substrate;
   successively repeating said imprinting until a desired area of the substrate is patterned, overlapping part of a previously imprinted portion of the substrate with each said successive repetition;
   wherein said imprinting the substrate with the second master mask comprises:
      depositing a third polymer precursor liquid;
      pressing the third polymer precursor liquid between the master mask and the substrate; and
      curing the third polymer precursor liquid.

10. The method of claim 1, wherein the first casting component is a sacrificial casting component.

11. The method of claim 2, wherein the first casting component is a sacrificial casting component, wherein said g) includes fracturing, dissolving, or deflating the first casting component.

12. The method of claim 1, wherein said d) is performed with a second surface of the master mask adjacent to an inner surface of the first casting component.

* * * * *